(12) United States Patent
Huang et al.

(10) Patent No.: US 12,087,215 B2
(45) Date of Patent: Sep. 10, 2024

(54) DISPLAY SUBSTRATE, PREPARATION METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Peng Huang, Beijing (CN); Zhu Wang, Beijing (CN); Tao Gao, Beijing (CN); Ling Shi, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/783,657

(22) PCT Filed: Jun. 23, 2021

(86) PCT No.: PCT/CN2021/101874
§ 371 (c)(1),
(2) Date: Dec. 29, 2022

(87) PCT Pub. No.: WO2022/266892
PCT Pub. Date: Dec. 29, 2022

(65) Prior Publication Data
US 2024/0185773 A1   Jun. 6, 2024

(51) Int. Cl.
*G09G 3/3208* (2016.01)
*H10K 59/131* (2023.01)

(52) U.S. Cl.
CPC ......... *G09G 3/3208* (2013.01); *H10K 59/131* (2023.02); *G09G 2300/0408* (2013.01);
(Continued)

(58) Field of Classification Search
CPC ......... G09G 3/3208; G09G 2300/0408; G09G 2300/0426; G09G 2300/0819;
(Continued)

(56) References Cited

U.S. PATENT DOCUMENTS

2011/0109532 A1*   5/2011   Choi ................. H10K 59/131
                                                        438/34
2018/0006263 A1    1/2018   Yoon et al.
(Continued)

FOREIGN PATENT DOCUMENTS

CN        1497529 A      5/2004
CN     205722744 U      11/2016
(Continued)

*Primary Examiner* — Dmitriy Bolotin
(74) *Attorney, Agent, or Firm* — Ling Wu; Stephen Yang; Ling and Yang Intellectual Property

(57) ABSTRACT

A display substrate includes a plurality of sub-pixels, wherein at least one sub-pixel includes a driving circuit layer and a light emitting structure layer disposed on the driving circuit layer; the driving circuit layer includes a pixel driving circuit, and the light emitting structure layer includes a light emitting device connected with the pixel driving circuit; the pixel driving circuit includes a reset sub-circuit, a writing sub-circuit, a driving sub-circuit, a compensation sub-circuit, an energy storage sub-circuit and a light emitting control sub-circuit; and at least one of the reset sub-circuit, the compensation sub-circuit, and the writing sub-circuit includes an oxide transistor and a one-way conductive device.

20 Claims, 19 Drawing Sheets

(52) U.S. Cl.
CPC ......... *G09G 2300/0426* (2013.01); *G09G 2300/0819* (2013.01); *G09G 2300/0842* (2013.01); *G09G 2310/08* (2013.01); *G09G 2320/0233* (2013.01); *G09G 2330/021* (2013.01)

(58) Field of Classification Search
CPC ....... G09G 2300/0842; G09G 2310/08; G09G 2320/0233; G09G 2330/021; H10K 59/131
See application file for complete search history.

(56) References Cited

U.S. PATENT DOCUMENTS

| | | | |
|---|---|---|---|
| 2018/0047337 | A1 | 2/2018 | Zhu et al. |
| 2020/0074929 | A1* | 3/2020 | Chen ................ G09G 3/3258 |
| 2020/0082757 | A1* | 3/2020 | Yuan ................ G09G 3/3233 |
| 2022/0254856 | A1* | 8/2022 | Li ................ G09G 3/3225 |
| 2024/0078971 | A1* | 3/2024 | Han ................ H10K 59/131 |
| 2024/0087529 | A1* | 3/2024 | Lu ................ H10K 59/1315 |

FOREIGN PATENT DOCUMENTS

| | | |
|---|---|---|
| CN | 106910468 A | 6/2017 |
| CN | 107564466 A | 1/2018 |
| CN | 108847186 A | 11/2018 |
| CN | 110085170 A | 8/2019 |
| CN | 110335565 A | 10/2019 |
| CN | 211063442 U | 7/2020 |
| CN | 111627387 A | 9/2020 |
| CN | 111754941 A | 10/2020 |
| CN | 112562522 A | 3/2021 |

\* cited by examiner

DISPLAY SUBSTRATE, PREPARATION METHOD THEREOF, AND DISPLAY DEVICE

CROSS-REFERENCE TO RELATED APPLICATION

This application is a national stage application of PCT Application No. PCT/CN2021/101874, which is filed on Jun. 23, 2021, and entitled "Display Substrate, Preparation Method Thereof, and Display Device", the content of which should be regarded as being incorporated herein by reference.

TECHNICAL FIELD

The present disclosure relates to, but is not limited to, the field of display technologies, and particularly to a display substrate, a preparation method for the display substrate, and a display device.

BACKGROUND

An Organic Light Emitting Diode (OLED for short) and a Quantum-dot Light Emitting Diodes (QLED for short) are active light emitting display devices and have advantages of self-illumination, wide viewing angle, high contrast, low power consumption, extremely high reaction speed, lightness and thinness, bendability, low cost, etc. With the constant development of a display technology, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the scope of protection of claims.

In one aspect, the present disclosure provides a display substrate including a plurality of sub-pixels, at least one sub-pixel including a driving circuit layer and a light emitting structure layer disposed on the driving circuit layer; the driving circuit layer includes a pixel driving circuit, and the light emitting structure layer includes a light emitting device connected with the pixel driving circuit; the pixel driving circuit includes a reset sub-circuit, a writing sub-circuit, a driving sub-circuit, a compensation sub-circuit, an energy storage sub-circuit and a light emitting control sub-circuit.

The reset sub-circuit is respectively connected to a second scan signal line, an initial signal line, a first node and a fourth node, and is configured to provide an initial voltage output by the initial signal line to the first node and the fourth node under the control of the second scan signal line.

The writing sub-circuit is respectively connected to a first scan signal line, a data signal line and the second node, and is configured to provide a data voltage output by the data signal line to the second node under the control of the first scan signal line.

The driving sub-circuit is respectively connected with the first node, the second node, and a third node, and is configured to provide a voltage of the second node to the third node under the control of the first node.

The compensation sub-circuit is respectively connected with the first scan signal line, the first node and the third node, and is configured to provide a voltage of the third node to the first node under the control of the first scan signal line to compensate the first node until a voltage of the first node meets a threshold condition.

The energy storage sub-circuit is respectively connected with a first power supply line and the first node, and is configured to store a voltage difference between a first power supply voltage output by the first power supply line and the first node.

The light emitting control sub-circuit is respectively connected with a light emitting control line, the first power supply line, the second node, the third node and the fourth node, and is configured to provide a first power supply voltage output by the first power supply line to the second node and a voltage of the third node to the fourth node under the control of the light emitting control line.

At least one of the reset sub-circuit, the compensation sub-circuit, and the writing sub-circuit includes an oxide transistor and a one-way conductive device.

In an exemplary implementation, the writing sub-circuit includes a fourth transistor and a first diode as a one-way conductive device, or the writing sub-circuit includes a fourth transistor and a first triode as a one-way conductive device; the fourth transistor is an oxide transistor.

A control electrode of the fourth transistor is connected to a first scan signal line, a first electrode of the fourth transistor is connected to the data signal line, and a second electrode of the fourth transistor is connected to a second node.

A positive electrode of the first diode is connected with the data signal line, and a negative electrode of the first diode is connected with the second node; a control electrode and a first electrode of the first triode are both connected to the data signal line, and a second electrode of the first triode is connected to the second node N2.

In an exemplary implementation, the writing sub-circuit includes a PMOS transistor and an NMOS transistor; a control electrode of the PMOS transistor is connected with the first scan signal line, a first electrode is connected with the data signal line, and a second electrode is connected with the second node; a control electrode of the NMOS transistor is connected with the first scan signal line, a first electrode is connected with the first power supply line, and a second electrode is connected with the second node.

In an exemplary implementation, the compensation sub-circuit includes a second transistor and a second diode as a one-way conductive device, or the compensation sub-circuit includes a second transistor and a second triode as a one-way conductive device; the second transistor is an oxide transistor.

A control electrode of the second transistor is connected with the first scan signal line, a first electrode is connected with the third node, and a second electrode is connected with the first node.

A positive electrode of the second diode is connected with the third node, and the negative electrode is connected with the first node; a control electrode and a first electrode of the second triode are both connected with the third node, and the second electrode is connected with the first node.

In an exemplary implementation, the reset sub-circuit includes a first transistor, a seventh transistor, and a third diode as a one-way conductive device, or the reset sub-circuit includes the first transistor, the seventh transistor, and a third triode as a one-way conductive device; The first transistor and the seventh transistor are oxide transistors.

The control electrode of the first transistor is connected with the second scan signal line, the first electrode is connected with the initial signal line, and the second electrode is connected with the fifth node; a control electrode of the seventh transistor is connected to the second scan signal line, a first electrode is connected to the fifth node, and a second electrode is connected to the first node.

A positive electrode of the third diode is connected with the fifth node, and a negative electrode is connected with the first node; a control electrode and a first electrode of the third triode are both connected to the fifth node, and a second electrode is connected to the first node N1.

In an exemplary implementation, the driving circuit layer includes a first semiconductor layer, a first conductive layer, a second semiconductor layer, a second semiconductor layer, a third conductive layer, and a fourth conductive layer that are sequentially disposed on a base substrate, the first semiconductor layer includes active layers of multiple poly-silicon transistors, the first conductive layer includes gate electrodes of the multiple poly-silicon transistors and a first electrode plate of a storage capacitor, the second semiconductor layer includes gate electrodes of a plurality of oxide transistors and a second plate of the storage capacitor, the second semiconductor layer includes active layers of multiple oxide transistors, the third conductive layer includes an initial signal line and a plurality of connection electrodes, and the fourth conductive layer includes a data signal line and a first power supply line.

In an exemplary implementation, the first semiconductor layer includes an active layer of a third transistor, an active layer of a fifth transistor, an active layer of a sixth transistor, an active layer of an NMOS transistor, and a first connection electrode; the first conductive layer includes a gate electrode of a third transistor, a gate electrode of a fifth transistor, a gate electrode of a sixth transistor and a gate electrode of an NMOS transistor as a first electrode plate; the second semiconductor layer includes an active layer of a first transistor, an active layer of a second transistor, an active layer of a fourth transistor, and an active layer of a seventh transistor, a second region of the active layer of the first transistor being connected to a first region of the active layer of the seventh transistor; and the second semiconductor layer includes a second electrode plate, a gate electrode of a first transistor, a gate electrode of a second transistor, a gate electrode of a fourth transistor, and a gate electrode of a seventh transistor.

In an exemplary implementation, the plurality of connection electrodes include a second connection electrode and a third connection electrode; the initial signal line is connected with a first region of the active layer of the first transistor through a via, the second connection electrode is respectively connected with a second region of an active layer of the seventh transistor, a second region of an active layer of the second transistor and the first electrode plate through a via, and the third connection electrode is respectively connected to a second region of an active layer of the third transistor and a first region of an active layer of the second transistor through a via.

In an exemplary implementation, the plurality of connection electrodes further include a fourth connection electrode, a fifth connection electrode and a sixth connection electrode; the fourth connection electrode is connected with the first connection electrode through a via, the fifth connection electrode is respectively connected with the first connection electrode, a first region of an active layer of the fourth transistor, a first region of an active layer of the NMOS transistor and a gate electrode of the NMOS transistor through a via, and the sixth connection electrode is respectively connected to a second region of the active layer of the fourth transistor and a second region of the active layer of the NMOS transistor through a via.

In an exemplary implementation, a data signal line of the fourth conductive layer is connected to the fourth connection electrode through a via.

In an exemplary implementation, the plurality of connection electrodes include a seventh connection electrode connected to the second plate through a via, and a first power supply line of the fourth conductive layer is connected to the seventh connection electrode through a via.

In an exemplary implementation, the plurality of connection electrodes include an eighth connection electrode connected to a first region of an active layer of the fifth transistor through a via, and a first power supply line of the fourth conductive layer is connected with the eighth connection electrode through a via.

In an exemplary implementation, the plurality of connection electrodes include a ninth connection electrode connected to a second region of an active layer of the sixth transistor through a via, and the fourth conductive layer further includes an anode connection electrode connected to the eighth connection electrode through a via.

In another aspect, the present disclosure further provides a display device, including the aforementioned display substrate.

In yet another aspect, the present disclosure also provides a preparation method of a display substrate, wherein the display substrate includes a plurality of sub-pixels, and the preparation method includes: forming a driving circuit layer in at least one sub-pixel, the driving circuit layer including a pixel driving circuit; forming a light emitting structure layer on the driving circuit layer. The light emitting structure layer includes a light emitting device connected to the pixel driving circuit.

The pixel driving circuit includes a reset sub-circuit, a writing sub-circuit, a driving sub-circuit, a compensation sub-circuit, an energy storage sub-circuit and a light emitting control sub-circuit.

The reset sub-circuit is respectively connected to a second scan signal line, an initial signal line, a first node and a fourth node, and is configured to provide an initial voltage output by the initial signal line to the first node and the fourth node under the control of the second scan signal line.

The writing sub-circuit is respectively connected to a first scan signal line, a data signal line and the second node, and is configured to provide a data voltage output by the data signal line to the second node under the control of the first scan signal line.

The driving sub-circuit is respectively connected with the first node, the second node, and a third node, and is configured to provide a voltage of the second node to the third node under the control of the first node.

The compensation sub-circuit is respectively connected with the first scan signal line, the first node and the third node, and is configured to provide a voltage of the third node to the first node under the control of the first scan signal line to compensate the first node until a voltage of the first node meets a threshold condition.

The energy storage sub-circuit is respectively connected with a first power supply line and the first node, and is configured to store a voltage difference between a first power supply voltage output by the first power supply line and the first node.

The light emitting control sub-circuit is respectively connected with a light emitting control line, the first power supply line, the second node, the third node and the fourth node, and is configured to provide a first power supply voltage output by the first power supply line to the second node and a voltage of the third node to the fourth node under the control of the light emitting control line.

At least one of the reset sub-circuit, the compensation sub-circuit, and the writing sub-circuit includes an oxide transistor and a one-way conductive device.

Other aspects may be understood upon reading and understanding of the accompanying drawings and detailed descriptions.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the accompanying drawings do not reflect actual scales and are only intended to illustrate contents of the present disclosure.

DESCRIPTION OF REFERENCE SIGNS

Figure 1:
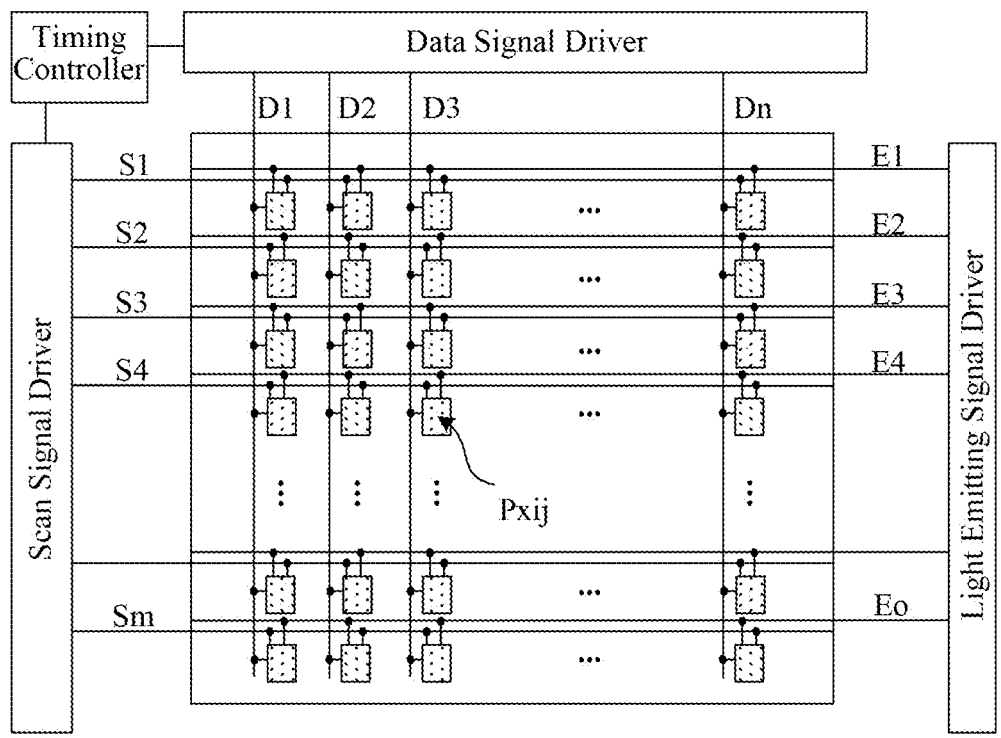
FIG. 1 is a schematic diagram of a structure of a display device.

| 11-first active layer; | 12-second active layer; | 13-third active layer; |
|---|---|---|
| 14-fourth active layer; | 15-fifth active layer; | 16-sixth active layer; |
| 17-seventh active layer; | 18-NMOS active layer; | 19-first connection electrode; |
| 21-light emitting control line; | 22-NMOS gate electrode; | 23-first electrode plate; |
| 31-first scan signal line | 32-second scan signal line | 33-third scan signal line; |
| 34-second electrode plate; | 35-electrode plate connection line; | 36-opening; |
| 41-initial signal line; | 42-second connection electrode; | 43-third connection electrode; |
| 44-fourth connection electrode; | 45-fifth connection electrode; | 46-sixth connection electrode; |
| 47-seventh connection electrode; | 48-eighth connection electrode; | 49-ninth connection electrode; |
| 410-tenth connection electrode; | 51-data signal line; | 52-first power supply line; |
| 53-anode connection electrode; | 101-based substrate; | 102-driving circuit layer; |
| 103-light emitting structure layer; | 104-encapsulation layer; | 301-anode; |
| 302-pixel define layer; | 303-organic emitting layer; | 304-cathode; |
| 401-first encapsulation layer; | 402-second encapsulation layer; | 403-third encapsulation layer. |

DETAILED DESCRIPTION

To make objectives, technical solutions, and advantages of the present disclosure clearer, the embodiments of the present disclosure will be described in detail with reference to the accompanying drawings. It is to be noted that embodiments may be implemented in multiple different forms. Those of ordinary skill in the art can easily understand such a fact that manners and contents may be transformed into various forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other without conflicts. In order to keep the following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

Sometimes for clarity, sizes of various constituent elements, thicknesses of layers or areas in the drawings may be exaggerated. Therefore, one embodiment of the present disclosure is not necessarily limited to the size, and shapes and sizes of various components in the drawings do not reflect actual scales. In addition, the accompanying drawings schematically show ideal examples, and one mode of the present disclosure is not limited to a shape, a numerical value, or the like shown in the accompanying drawings.

Ordinal numerals such as "first", "second", and "third" in the specification are set to avoid confusion of constituent elements, but are not intended to limit in terms of quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements change appropriately according to the direction in which the various constituent elements are described. Therefore, description is not limited to the words and phrases used in the specification, and appropriate substitutions may be made according to situations.

In the specification, unless otherwise specified and defined explicitly, terms "mount", "mutually connect", and "connect" should be understood in a broad sense. For example, the connection may be a fixed connection, a detachable connection or an integrated connection, or may be a mechanical connection or an electrical connection, or may be a direct connection, an indirect connection through intermediate components, or communication inside two components. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region and the source electrode. It is to be noted that, in the specification, the channel region refers to a region that the current mainly flows through.

In the specification, a first electrode may be the drain electrode, and a second electrode may be the source electrode. Or, the first electrode may be the source electrode, and the second electrode may be the drain electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" may be exchanged in the present specification. In addition, there are two types of transistors: P-type transistor and N-type transistor, wherein the P-type transistor is turned on when its gate is at a low level and turned off when its gate is at a high level, and the N-type transistor is turned on when its gate is at a high level and turned off when its gate is at a low level.

In the specification, "electrical connection" includes a case that constituent elements are connected together through an element with a certain electrical effect. There is no specific restriction on the "element having some electrical function" as long as it may transmit and receive electrical signals between connected constituent elements. Examples of the "element with a certain electric action" include not only an electrode and wiring, but also a switching element such as a transistor, a resistor, an inductor, a capacitor, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, sometimes a "conductive layer" may be replaced with a "conducting film". Similarly, sometimes an "insulating film" may be replaced with an "insulating layer".

In the present disclosure, "about" refers to that a boundary is defined not so strictly and numerical values in process and measurement error ranges are allowed.

FIG. 1 is a schematic diagram of a structure of a display device. As shown in FIG. 1, the display device may include a timing controller, a data signal driver, a scan signal driver, a light emitting signal driver, and a pixel array, wherein the pixel array may include multiple scan signal lines (S1 to Sm), multiple data signal lines (D1 to Dn), multiple light emitting signal lines (E1 to Eo), and multiple sub-pixels Pxij. In an exemplary implementation, the timing controller may provide a gray-scale value and a control signal suitable for a specification of the data signal driver to the data signal driver, provide a clock signal, a scan starting signal, etc., suitable for a specification of the scan signal driver to the scan signal driver, and provide a clock signal, an emission stopping signal, etc., suitable for a specification of the light emitting signal driver to the light emitting signal driver. The data signal driver may generate a data voltage to be provided to the data signal lines D1, D2, D3, . . . , and Dn using the gray-scale value and the control signal that are received from the timing controller. For example, the data signal driver may sample the gray-scale value using the clock signal and apply a data voltage corresponding to the gray-scale value to the data signal lines D1 to Dn by taking a pixel row as a unit, wherein n may be a natural number. The scan signal driver may receive the clock signal, the scan starting signal, etc., from the timing controller to generate a scan signal to be provided to the scan signal lines S1, S2, S3, . . . , and Sm. For example, the scan signal driver may sequentially provide a scan signal with an on-level pulse to the scan signal lines S1 to Sm. For example, the scan signal driver may be constructed in a form of a shift register to generate a scan signal in a manner of sequentially transmitting the scan starting signal provided in a form of an on-level pulse to a next-stage circuit under control of the clock signal, wherein m may be a natural number. The light emitting signal driver may receive the clock signal, the emission stopping signal, etc., from the timing controller to generate an emission signal to be provided to the light emitting signal lines E1, E2, E3, . . . , and Eo. For example, the light emitting signal driver may sequentially provide an emission with an off-level pulse to the light emitting signal lines E1 to Eo. For example, the light emitting signal driver may be constructed in a form of a shift register to generate a light emitting signal in a manner of sequentially transmitting a light emitting stopping signal provided in a form of an off-level pulse to a next-stage circuit under control of the clock signal, wherein o may be a natural number. The pixel array may include multiple sub-pixels PXij. Each sub-pixel PXij may be connected to the corresponding data signal line, the corresponding scan signal line, and the corresponding light emitting signal line. Herein, i and j may be natural numbers. The sub-pixel Pxij may refer to a sub-pixel with a transistor therein being connected to the ith scan signal line and connected to the jth data signal line.

Figure 2:
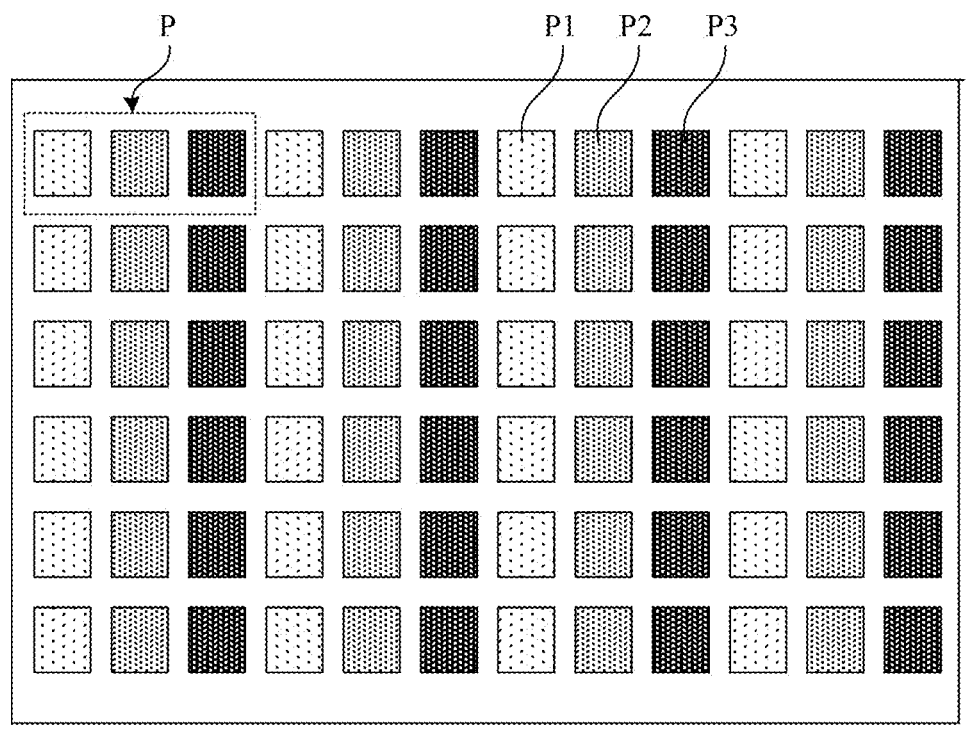
FIG. 2 is a schematic diagram of a planar structure of a display substrate according to an exemplary embodiment of the present disclosure.

FIG. 2 is a schematic diagram of a planar structure of a display substrate according to an exemplary embodiment of the present disclosure. As shown in FIG. 2, the display substrate may include a plurality of pixel units P disposed in a matrix, at least one of which includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel driving circuit and a light emitting device which is connected to the pixel driving circuit. The pixel driving circuit in at least one sub-pixel is respectively connected with a scan signal line, data signal line and a light emitting signal line, the pixel driving circuit is configured to, under the control of the scan signal line and the light emitting signal line, receive a data voltage transmitted by the data signal line and output a corresponding current to the light emitting device, and the light emitting device is configured to emit light with a corresponding brightness in response to the current output by the pixel driving circuit of the sub-pixel where the light emitting device is located.

In an exemplary implementation, the pixel unit P may include a Red (R) sub-pixel, a Green (G) sub-pixel, and a Blue (B) sub-pixel, or may include a red sub-pixel, a green sub-pixel, a blue sub-pixel and a white sub-pixel, which is not limited in the present disclosure. In an exemplary implementation, the shape of the sub-pixel in the pixel unit may be a rectangle, a rhombus, a pentagon or a hexagon. When the pixel unit includes three sub-pixels, the three sub-pixels may be disposed side by side horizontally, side by side vertically, or in the form of "品," or the like; and when the pixel unit includes four sub-pixels, the four sub-pixels may be disposed side by side horizontally, side by side vertically, or in the shape of a square or the like, which is not limited in the present disclosure.

Figure 3:
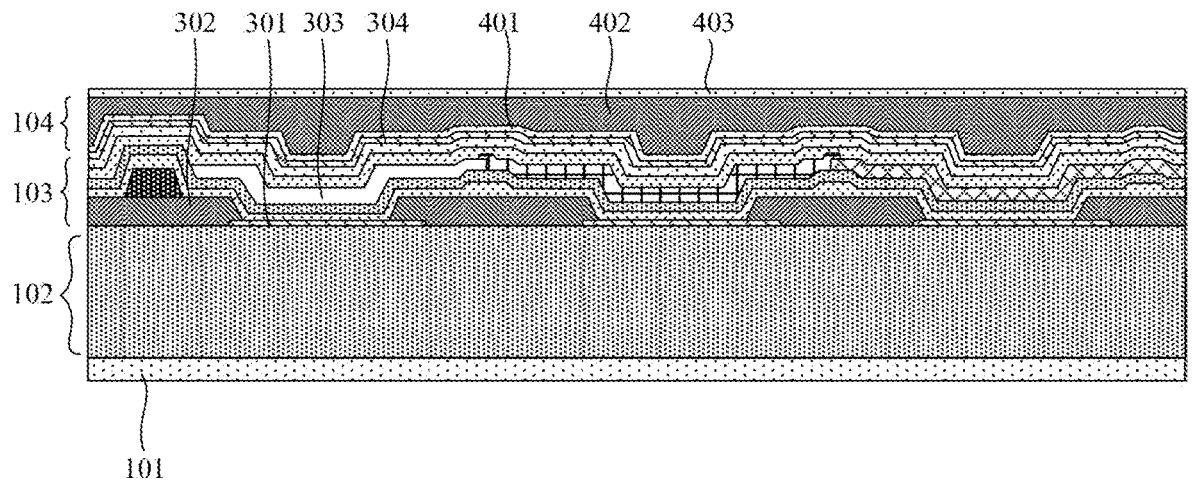
FIG. 3 is a schematic sectional view of a display substrate according to an exemplary embodiment of the present disclosure.

FIG. 3 is a schematic sectional view of a display substrate according to an exemplary embodiment of the present disclosure, and illustrates a structure of three sub-pixels of a display substrate. As shown in FIG. 3, on a plane perpendicular to the display substrate, each sub-pixel in the display substrate may include a driving circuit layer 102 disposed on a base substrate 101, a light emitting structure layer 103 disposed on a side of the driving circuit layer 102 away from the base substrate, and an encapsulation layer 104 disposed on a side of the light emitting structure layer 103 away from the base substrate.

In an exemplary implementation, the base substrate 101 may be a flexible base substrate, or a rigid base substrate. The driving circuit layer 102 of each sub-pixel may include a pixel driving circuit formed by a plurality of transistors and storage capacitors The light emitting structure layer 103 of each sub-pixel may include a light emitting device formed by a plurality of film layers, wherein the plurality of film layers may include an anode 301, a pixel define layer 302, an organic emitting layer 303 and a cathode 304, the anode 301 is connected to the pixel driving circuit, the organic emitting layer 303 is connected to the anode 301, the cathode 304 is connected to the organic emitting layer 303, the organic emitting layer 303 emits light of a corresponding color under driving of the anode 301 and the cathode 304. The encapsulation layer 104 may include a first encapsulation layer 401, a second encapsulation layer 402, and a third encapsulation layer 403 that are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 so as to prevent external water vapor from entering the light emitting structure layer 103.

In an exemplary implementation, the organic emitting layer may include a Hole Injection Layer (HIL), a Hole Transport Layer (HTL), an Electron Block Layer (EBL), an Emitting Layer(EML), a Hole Block Layer (HBL), an Electron Transport Layer (ETL) and an Electron Injection Layer (EIL) which are stacked. In an exemplary implementation, the hole injection layers and the electron injection layers of all the sub-pixels may be connected together as a common layer, the hole transport layers and the electron transport layers of all the sub-pixels may be connected together as a common layer, the hole block layers of all the sub-pixels may be connected together as a common layer, and the light emitting layers and the electron block layers of adjacent sub-pixels may be slightly overlapped with each other, or may be isolated from each other.

In some possible implementation, the display substrate may include other film layers, which is not limited in the present disclosure.

With the development of OLED display technology, in order to reduce the power consumption of products, especially the power consumption of pixel driving circuit, Low Temperature Polycrystalline Oxide (LTPO) display technology is adopted to reduce the leakage current of driving transistor in the light emitting stage, so as to reduce the power consumption of pixel driving circuit. LTPO display technology integrates Low Temperature Poly-Silicon (LTPS) transistor and Oxide transistor in one pixel driving circuit, wherein LTPS transistor has the advantages of high mobility and fast charging, while Oxide transistor has the advantages of low leakage current, etc. Integrating LTPS transistor and Oxide transistor can make use of their advantages, achieve low-frequency driving, reduce power consumption (save 5% to 15% of electricity) and improve display quality. However, the research shows that the opening current and mobility of Oxide transistor are low, which makes the capacitor charge insufficient when the signal is written, resulting in poor display and degrading the display quality.

Figure 4:
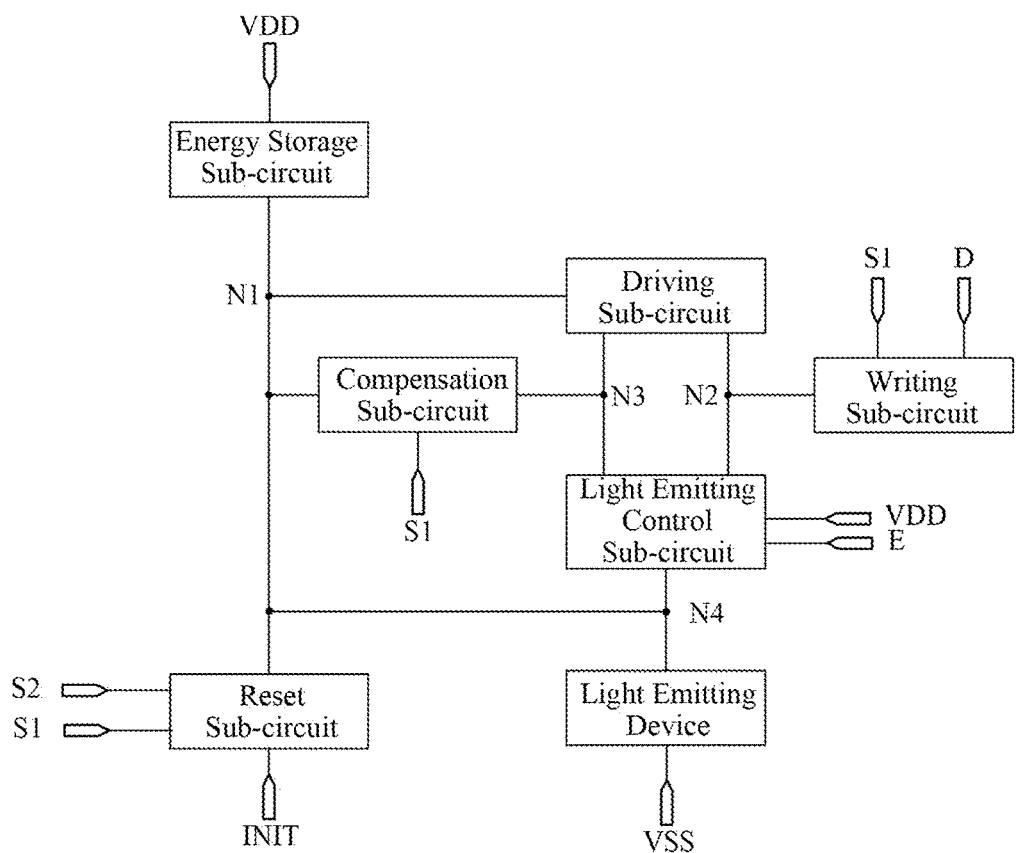
FIG. 4 is an equivalent circuit diagram of a pixel driving circuit according to an exemplary embodiment of the present disclosure.

FIG. 4 is an equivalent circuit diagram of a pixel driving circuit according to an exemplary embodiment of the present disclosure, illustrating a circuit structure of a pixel driving circuit in a sub-pixel. As shown in FIG. 4, the pixel driving circuit may include a reset sub-circuit, a writing sub-circuit, a driving sub-circuit, a compensation sub-circuit, an energy storage sub-circuit and a light emitting control sub-circuit.

The reset sub-circuit is respectively connected to a second scan signal line S2, a initial signal line INIT, a first node N1 and a fourth node N4, and is configured to provide an initial voltage output by the initial signal line to the first node N1 and the fourth node N4 under the control of the second scan signal line S2.

The writing sub-circuit is respectively connected to a first scan signal line S1, a data signal line D and the second node N2, and is configured to provide a data voltage output by the data signal line D to the second node N2 under the control of the first scan signal line S1.

The driving sub-circuit is connected respectively with a first node N1, the second node N2, and a third node N3, and is configured to provide a voltage of the second node N2 to the third node N3 under control of the first node N1.

The compensation sub-circuit is respectively connected to the first scan signal line S1, the first node N1 and the third node N3, and is configured to provide a voltage of the third node N3 to the first node N1 under the control of the first scan signal line S1 to compensate the first node N1 until a voltage of the first node N1 meets a threshold condition.

The energy storage sub-circuit is respectively connected to a first power supply line VDD and the first node N1, and is configured to store a voltage difference between a first power supply voltage output by the first power supply line VDD and the first node N1.

The light emitting control sub-circuit is respectively connected to a light emitting control line E, the first power supply line VDD, the second node N2, the third node N3 and the fourth node N4, and is configured to provide the first power supply voltage output by the first power supply line VDD to the second node N2 and the voltage of the third node N3 to the fourth node N4 under the control of the light emitting control line E.

In an exemplary implementation, the light emitting device is respectively connected to a fourth node N4 and a second power supply line VSS, and is configured to reset or emit light under the control of the fourth node N4.

In an exemplary implementation, the signals output by a first scan signal line S1, the second scan signal line S2 and the light emitting control line E may be pulse signals. A signal output by the first power supply line VDD may be a continuous high-level signal, signals output by the second power line VSS and the initial signal line INIT may be continuous low-level signals, and the signal of the second power line VSS and the initial signal line INIT may be the same or different.

In an exemplary implementation, a signal output by an initial signal line INIT may be a signal with a voltage value of 0V, and is configured to reset a first node N1 and a first electrode of a light emitting device.

In an exemplary implementation, a light emitting device may be an Organic Light Emitting Diode (OLED) or a Quantum-dot Light Emitting Diode (QLED). An anode of the OLED or the QLED is connected to a light emitting control sub-circuit, and a cathode is connected to a second power supply terminal VSS.

Figure 5:
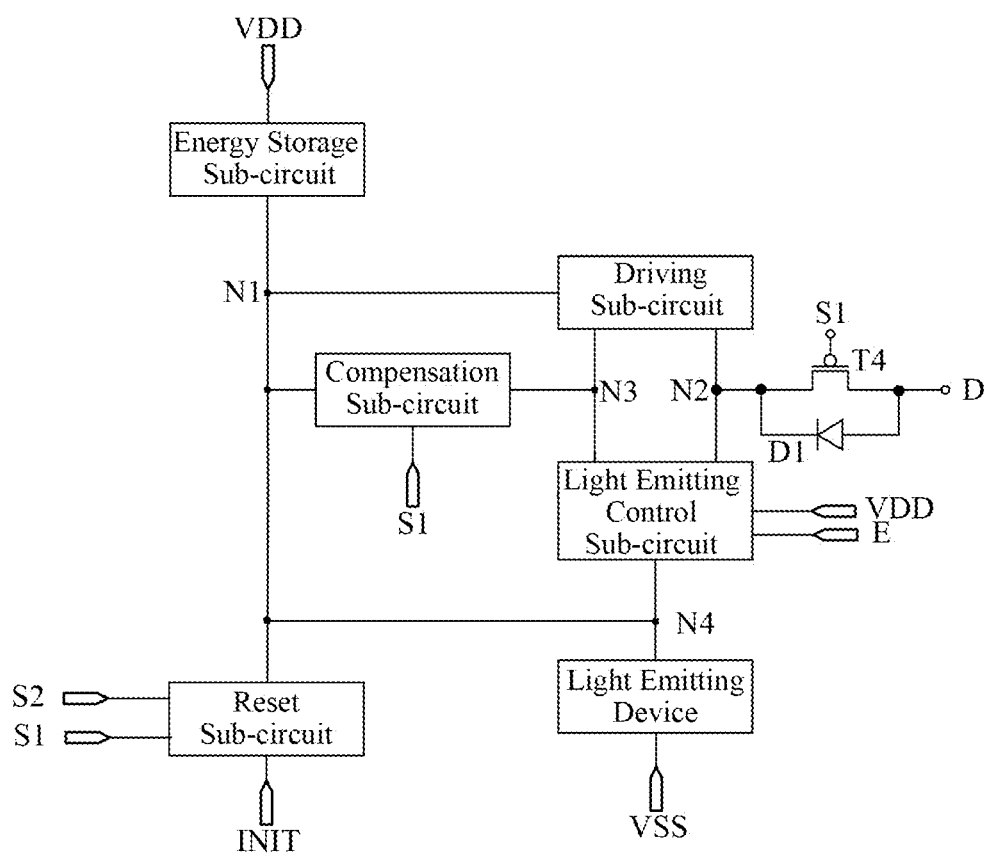
FIG. 5 is an equivalent circuit diagram of a writing sub-circuit according to an exemplary embodiment of the present disclosure.

FIG. 5 is an equivalent circuit diagram of a writing sub-circuit according to an exemplary embodiment of the present disclosure. As shown in FIG. 5, in an exemplary implementation, the writing sub-circuit may include a fourth transistor T4 and a one-way conductive first diode D1, wherein the fourth transistor T4 may include an oxide transistor, and the one-way conductive first diode D1 may include a PN junction diode.

In an exemplary implementation, a control electrode of a fourth transistor T4 is connected to a first scan signal line S1, a first electrode of the fourth transistor T4 is connected to a data signal line D, and a second electrode of the fourth transistor T4 is connected with a second node N2. A positive electrode of the one-way conductive first diode D1 is connected to the data signal line D, and a negative electrode of the one-way conductive first diode D1 is connected to the second node N2. The fourth transistor T4 is configured to provide a data voltage output by the data signal line D to the node N2 in a writing stage under the control of a first scan signal line S1, and the one-way conductive first diode D1 is configured to provide the data voltage output by the data signal line D to the second node N2 in the writing stage to compensate for the problems of low on-state current and mobility of the fourth transistor T4, avoiding insufficient charge of the storage capacitor when the signal is written, and thus improving the display effect.

In an exemplary implementation, taking a fourth transistor T4 as a P-type oxide transistor as an example, the working process of a pixel driving circuit of an exemplary embodiment of the present disclosure may include:

A first stage A1 is referred to as a reset stage. A signal of a second scan signal line S2 is a low-level signal, so that a reset sub-circuit is turned on, an initial voltage of an initial signal line INIT is provided to a first node N1 and a fourth node N4, an energy storage sub-circuit and a fourth node N4 are initialized, and a data voltage of the energy storage sub-circuit and a pre-stored voltage of a first electrode of a light emitting device are respectively cleared to complete the initialization. Signals of a first scan signal line S1 and a light emitting signal line E are high-level signals, so that a writing sub-circuit, a driving sub-circuit, a compensation sub-circuit and a light emitting control sub-circuit are disconnected, and the light emitting device does not emit light in this stage.

The second stage A2 is referred to as a data writing stage or a threshold compensation stage. The signal of the first scan signal line S1 is a low-level signal, signals of the second scan signal line S2 and the light emitting signal line E are high-level signals, and the data signal line D outputs a data voltage. In this stage, because the first node N1 is at a low level, the driving sub-circuit is turned on. Since a first diode D1 is one-way conductive in the direction from the data signal line D to a second node N2, and the signal of the first scan signal line S1 is a low-level signal so that a fourth transistor T4 in the writing sub-circuit is turned on, the data voltage output by the data signal line D is provided to the second node N2 through the fourth transistor T4 and the one-way conductive first diode D1. According to the exemplary embodiment of the present disclosure, by disposing a one-way conductive diode in the writing sub-circuit, the data voltage may be made be quickly written in the writing stage, which can compensate for the problems of low on-state current and mobility of the fourth transistor T4, avoiding insufficient charging of a storage capacitor when the signal is written, and thus improving a display effect.

The signal of the first scan signal line S1 is a low-level signal so that the compensation sub-circuit is turned on, so that the data voltage is provided to the first node N1 through a turned-on driving sub-circuit, a third node N3 and a turned-on compensation sub-circuit, and the difference between the data voltage output by the data signal line D and a threshold voltage of the driving sub-circuit is charged into the energy storage sub-circuit. The signal of the second scan signal line S2 is a high-level signal so that the reset sub-circuit is disconnected, and the signal of the light emitting signal line E is a high-level signal so that the light emitting control sub-circuit is disconnected, so that the light emitting device does not emit light in this stage.

The third stage A3 is referred to as a light emitting stage. The signal of the light emitting signal line E is a low-level signal, so that the light emitting control sub-circuit is turned on, and the power supply voltage output by the first power supply line VDD provides a driving voltage to the first electrode of the light-emitting device through the turned-on light emitting control sub-circuit to drive the light emitting device to emit light. The signals of the first scan signal line S1 and the second scan signal line S2 are high-level signals so that the writing sub-circuit, the compensation sub-circuit and the reset sub-circuit are disconnected. According to the exemplary embodiment of the present disclosure, by disposing a one-way conductive diode in the writing sub-circuit, the first diode D1 can stabilize a voltage of the second node N2 in the light emitting stage since the first diode D1 is turned off in the direction from the second node N2 to the data signal line D, thus avoiding leakage current of the driving sub-circuit.

Figure 6:
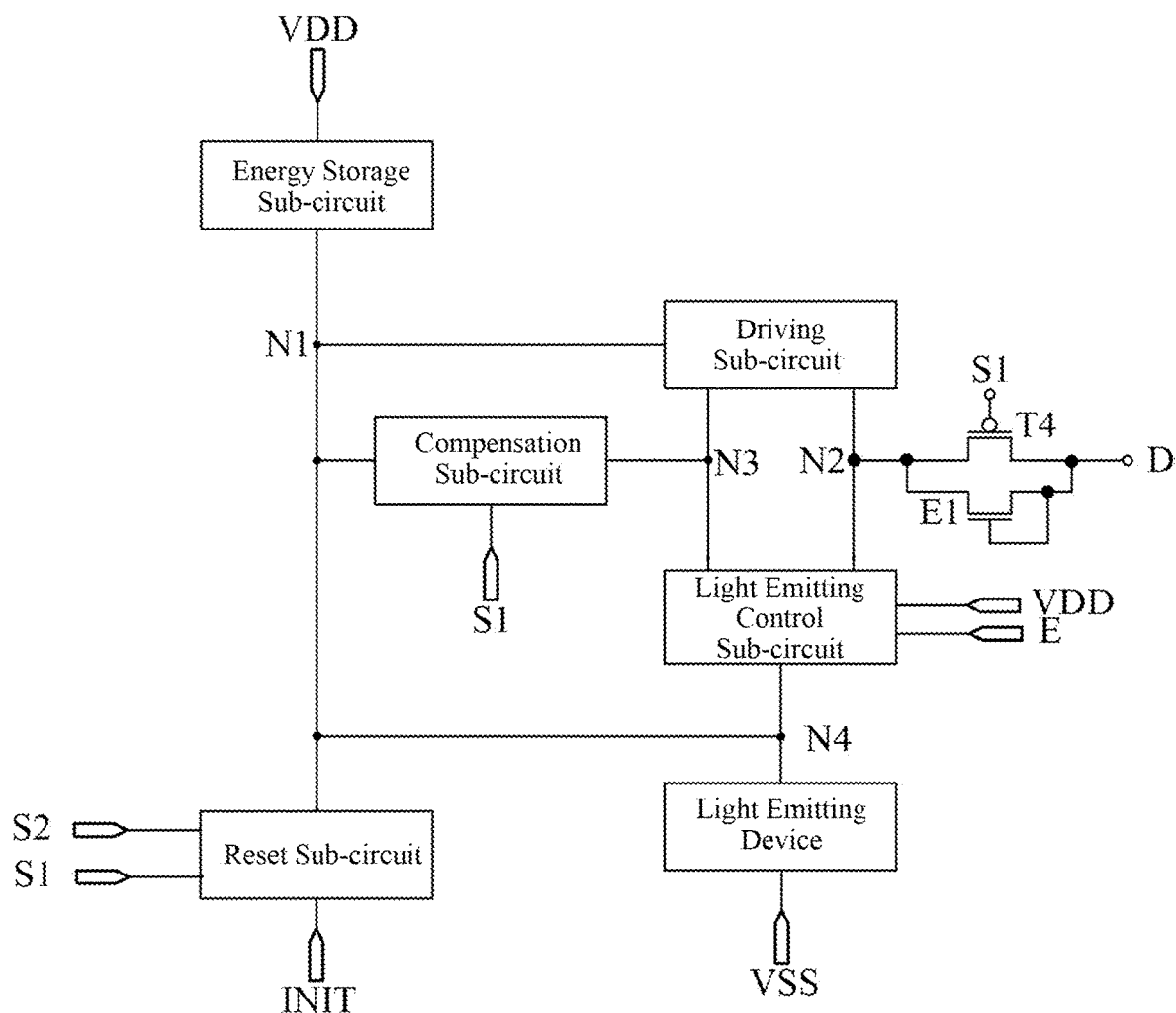
FIG. 6 is an equivalent circuit diagram of another writing sub-circuit according to an exemplary embodiment of the present disclosure.

FIG. 6 is an equivalent circuit diagram of another writing sub-circuit according to an exemplary embodiment of the present disclosure. As shown in FIG. 6, in an exemplary implementation, the writing sub-circuit may include a fourth transistor T4 and a one-way conductive first triode E1 wherein the fourth transistor T4 may include an oxide transistor, and the one-way conductive first triode E1 may include an N-type metal oxide semiconductor (NMOS) transistor.

In an exemplary implementation, a control electrode of a fourth transistor T4 is connected to a first scan signal line S1, a first electrode of the fourth transistor T4 is connected to a data signal line D, and a second electrode of the fourth transistor T4 is connected with a second node N2. A control electrode and a first electrode of the one-way conductive first triode E1 are both connected to the data signal line D, and a second electrode of the one-way conductive first triode E1 is connected to the second node N2. That is, the control electrode and the first electrode of the one-way conductive first triode E1 are in short circuit. The fourth transistor T4 is configured to provide a data voltage output by the data signal line D to the second node N2 in a writing stage under the control of a first scan signal line S1. The one-way conductive first triode E1 is configured to provide the data voltage output by the data signal line D to the second node N2 in the writing stage to compensate for the problems of low on-state current and mobility of the fourth transistor T4, avoiding insufficient charge of the storage capacitor when the signal is written, and thus improving the display effect.

In an exemplary implementation, taking a fourth transistor T4 as a P-type oxide transistor as an example, the working process of a pixel driving circuit of an exemplary embodiment of the present disclosure may include:

In a first stage A1, the process is the same as the exemplary embodiment described in FIG. 5.

In a first stage A2, the signal of the first scan signal line S1 is a low-level signal, signals of the second scan signal line S2 and the light emitting signal line E are high-level signals, and the data signal line outputs a data voltage. In this stage, because the first node N1 is at a low level, the driving sub-circuit is turned on. Since a first triode E1 is one-way conductive in the direction from the data signal line D to a second node N2, and the signal of the first scan signal line S1 is a low-level signal so that a fourth transistor T4 in the writing sub-circuit is turned on, the data voltage output by the data signal line D is provided to the second node N2 through the fourth transistor T4 and the one-way conductive first triode E1. According to the exemplary embodiment of the present disclosure, by disposing a one-way conductive triode in the writing sub-circuit, the data voltage may be made be quickly written in the writing stage, which can compensate for the problems of low on-state current and mobility of the fourth transistor T4, avoiding insufficient charging of a storage capacitor when the signal is written, and thus improving a display effect.

The signal of the first scan signal line S1 is a low-level signal so that the compensation sub-circuit is turned on, so that the data voltage is provided to the first node N1 through a turned-on driving sub-circuit, a third node N3 and a turned-on compensation sub-circuit, and the difference between the data voltage output by the data signal line D and a threshold voltage of the driving sub-circuit is charged into the energy storage sub-circuit. The signal of the second scan signal line S2 is a high-level signal so that the reset sub-circuit is disconnected, and the signal of the light emitting signal line E is a high-level signal so that the light emitting control sub-circuit is disconnected, so that the light emitting device does not emit light in this stage.

In a third stage A3, the process is the same as the exemplary embodiment described in FIG. 5. According to the exemplary embodiment of the present disclosure, by disposing a one-way conductive triode in the writing sub-circuit, a voltage of the second node N2 can be stabilized in the light emitting stage since the first diode D1 is turned off in the direction from the second node N2 to the data signal line D, thus avoiding leakage current of the driving sub-circuit.

Figure 7:
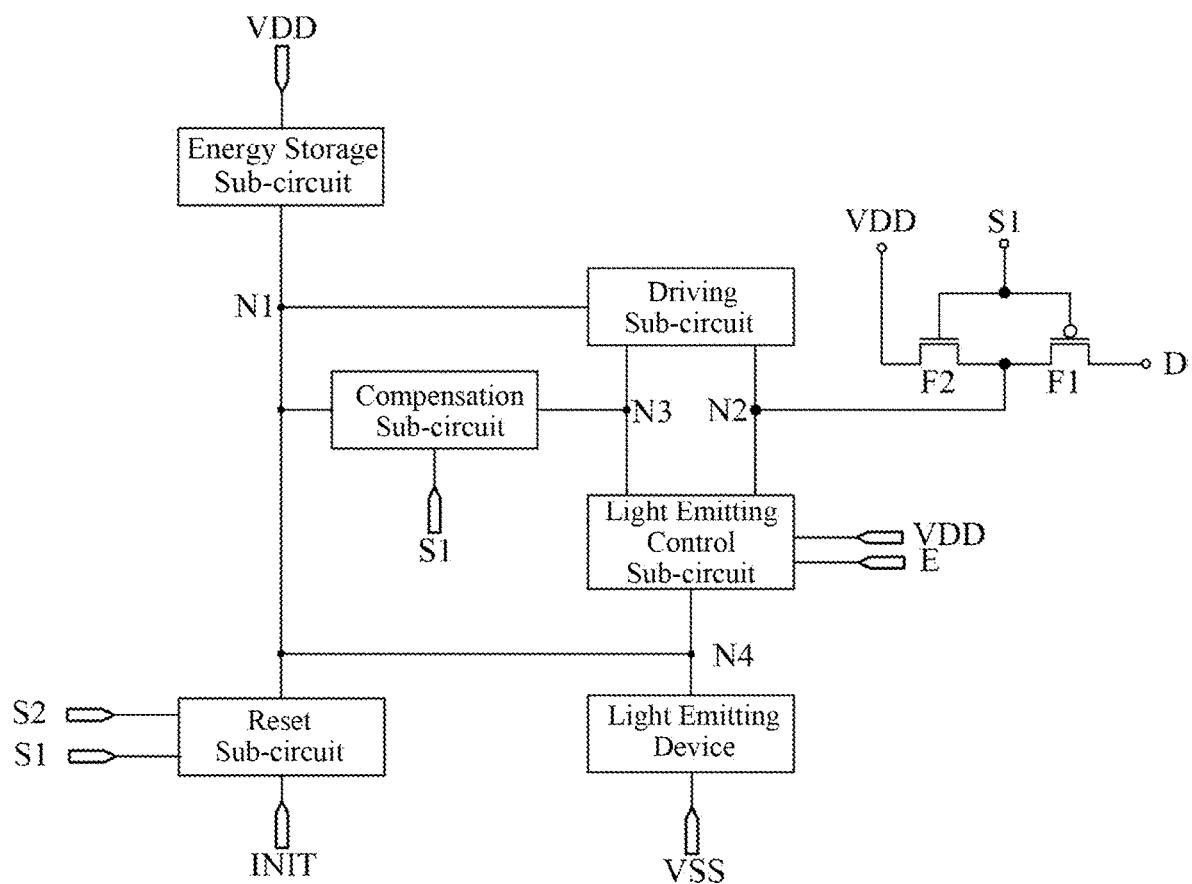
FIG. 7 is an equivalent circuit diagram of yet another writing sub-circuit according to an exemplary embodiment of the present disclosure.

FIG. 7 is an equivalent circuit diagram of yet another writing sub-circuit according to an exemplary embodiment of the present disclosure. As shown in FIG. 7, in an exemplary implementation, the writing sub-circuit may include a four-terminal Metal-Oxide-Semiconductor (MOS) circuit, and the four-terminal MOS circuit may include a PMOS transistor F1 and an NMOS transistor F2.

In an exemplary implementation, a control electrode of the PMOS transistor F1 is connected to a first scan signal line S1, a first electrode of the PMOS transistor F1 is connected to a data signal line D, and a second electrode of the PMOS transistor F1 is connected with a second node N2. A control electrode of the NMOS transistor F2 is connected with the first scan signal line S1, a first electrode of the NMOS transistor F2 is connected with the first power supply line VDD, and a second electrode of the NMOS transistor F2 is connected the second node N2. That is, the control electrodes of the PMOS transistor F1 and the NMOS transistor F2 are in short circuit and connected to the first scan signal line S1, and the second electrodes of the PMOS transistor F1 and the NMOS transistor F2 are in short circuit and connected to the second node N2. The PMOS transistor F1 is configured to provide a data voltage output by the data signal line D to the second node N2 in a writing stage under the control of a first scan signal line S1. The NMOS transistor F2 is configured to stabilize a voltage of the second node N2 in a light emitting stage under the control of the first scan signal line S1.

In an exemplary implementation, the working process of the pixel driving circuit according to an exemplary embodiment of the present disclosure may include following stages.

In a first stage A1, the process is the same as the exemplary embodiment described in FIG. 5.

In a first stage A2, the signal of the first scan signal line S1 is a low-level signal, signals of the second scan signal line S2 and the light emitting signal line E are high-level signals, and the data signal line outputs a data voltage. In this stage, because the first node N1 is at a low level, the driving sub-circuit is turned on. The signal of the first scan signal line S1 is a low-level signal so that a PMOS transistor F1 in a writing sub-circuit is turned on, an NMOS transistor F2 in the writing sub-circuit is turned off, and the data voltage output by the data signal line D is provided to a second node N2 through the PMOS transistor F1. According to the exemplary embodiment of the present disclosure, by disposing a four-terminal MOS circuit in the writing sub-circuit, the data voltage may be made be written quickly in the writing stage since the four-terminal MOS circuit is switched on fast, thus overcoming the problems of low on-state current and mobility of an oxide transistor, avoiding insufficient charging of a storage capacitor when the signal is written, and thus improving a display effect.

The signal of the first scan signal line S1 is a low-level signal so that the compensation sub-circuit is turned on, so that the data voltage is provided to the first node N1 through a turned-on driving sub-circuit, a third node N3 and a turned-on compensation sub-circuit, and the difference between the data voltage output by the data signal line D and a threshold voltage of the driving sub-circuit is charged into the energy storage sub-circuit. The signal of the second scan signal line S2 is a high-level signal so that the reset sub-circuit is disconnected, and the signal of the light emitting signal line E is a high-level signal so that the light emitting control sub-circuit is disconnected, so that the light emitting device does not emit light in this stage.

In the third stage A3, the signal of the light-emitting signal line E is a low-level signal, so that the light-emitting control sub-circuit is turned on, and the power supply voltage output by the first power supply line VDD provides a driving voltage to the first electrode of the light-emitting device through the turned-on light emitting control sub-circuit to drive the light emitting device to emit light. The signals of the first scan signal line S1 and the second scan signal line S2 are high-level signals, so that the compensation sub-circuit and the reset sub-circuit are disconnected, an NMOS transistor F2 in the writing sub-circuit is turned on, and the power supply voltage output by the first power supply line VDD is provided to the second node N2, so that a voltage of the second node N2 can be stabilized at the power supply voltage. According to the exemplary embodiment of the present disclosure, by disposing a four-terminal MOS circuit in the writing sub-circuit, the voltage of the second node N2 can be stabilized in the light emitting stage, avoiding leakage current of the driving sub-circuit.

Figure 8:
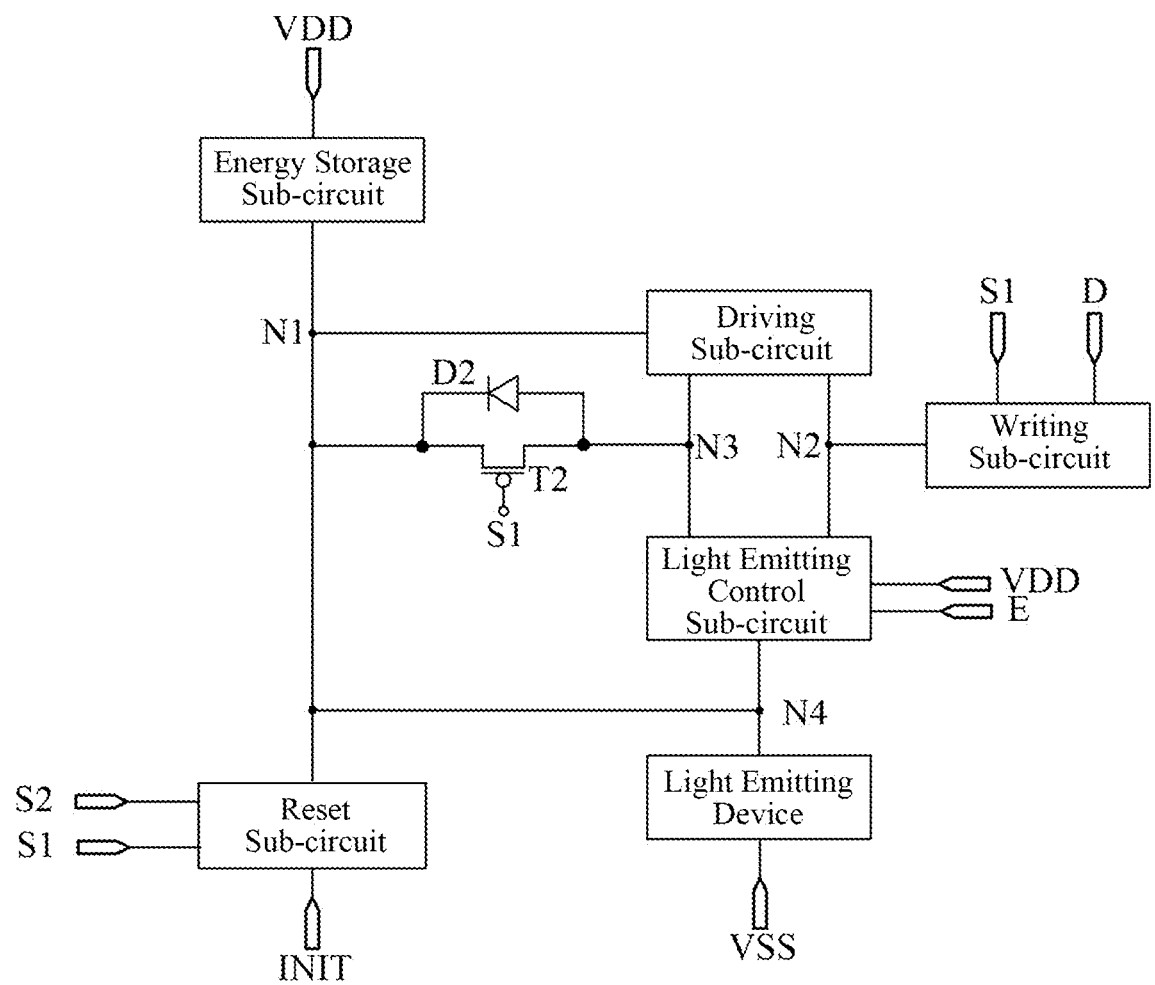
FIG. 8 is an equivalent circuit diagram of a compensation sub-circuit according to an exemplary embodiment of the present disclosure.

FIG. 8 is an equivalent circuit diagram of a compensation sub-circuit according to an exemplary embodiment of the present disclosure As shown in FIG. 8, in an exemplary implementation, the compensation sub-circuit may include a second transistor T2 and a one-way conductive second diode D2, wherein the second transistor T2 may include an oxide transistor, and the one-way conductive second diode D2 may include a PN junction diode.

In an exemplary implementation, a control electrode of a second transistor T2 is connected to a first scan signal line S1, a first electrode of the second transistor T2 is connected to a third node N3, and a second electrode of the second transistor T2 is connected to a first node N1. A positive electrode of a one-way conductive second diode D2 is connected to the third node N3, and a negative electrode of the one-way conductive second diode D2 is connected to the first node N1. The second transistor T2 is configured to provide a voltage of the third node N3 to the first node N1 in a writing stage under the control of the first scan signal line S1 to compensate the first node N1 until a voltage of the first node N1 meets a threshold condition. The one-way conductive second diode D2 is configured to provide a voltage of the third node N3 to the first node N1 in the writing stage to compensate for the problems of low on-state current and mobility of the second transistor T2, avoiding insufficient charge of the storage capacitor when the signal is written, and thus improving the display effect.

In an exemplary implementation, taking a second transistor T2 as a P-type oxide transistor as an example, the working process of a pixel driving circuit of an exemplary embodiment of the present disclosure may include:

In a first stage A1, the process is the same as the exemplary embodiment described in FIG. 5.

In a first stage A2, the signal of the first scan signal line S1 is a low-level signal, signals of the second scan signal line S2 and the light emitting signal line E are high-level signals, and the data signal line outputs a data voltage. The signal of the second scan signal line S2 is a high-level signal so that the reset sub-circuit is disconnected, and the signal of the light emitting signal line E is a high-level signal so that the light emitting control sub-circuit is disconnected. The signal of the first scan signal line S1 is a low-level signal so that the writing sub-circuit is turned on. In this stage, a first node N1 is at a low level and the driving sub-circuit is turned on, so that a data voltage output by the data signal line D is provided to a third node N3 through a writing sub-circuit, a second node N2 and a driving sub-circuit. Since the second diode D2 is one-way conductive in the direction from the third node N3 to a first node N1, the signal of the first scan signal line S1 is a low-level signal so that a second transistor T2 in a compensation sub-circuit is turned on. Thus, a voltage of the third node N3 is provided to the first node N1 through the second transistor T2 and the one-way conductive second diode D2 to compensate the first node N1 until the voltage of the first node N1 meets a threshold condition, and the difference between the data voltage output by the data signal line D and a threshold voltage of the driving sub-circuit is charged into an energy storage sub-circuit. According to the exemplary embodiment of the present disclosure, by disposing a one-way conductive second diode in the compensation sub-circuit, the data voltage can be made be quickly written in the writing stage, which can compensate for the problems of low on-state current and mobility of the second transistor T2, avoiding insufficient charging of a storage capacitor when the signal is written, and thus improving a display effect.

In a third stage A3, the process is the same as the exemplary embodiment described in FIG. 5. According to the exemplary embodiment of the present disclosure, by disposing a one-way conductive second diode D2 in the compensation sub-circuit, a voltage of the first node N1 can be stabilized in the light emitting stage since the second diode D2 is turned off in the direction from the first node N1 to the third node N3, thus avoiding leakage current of the driving sub-circuit.

Figure 9:
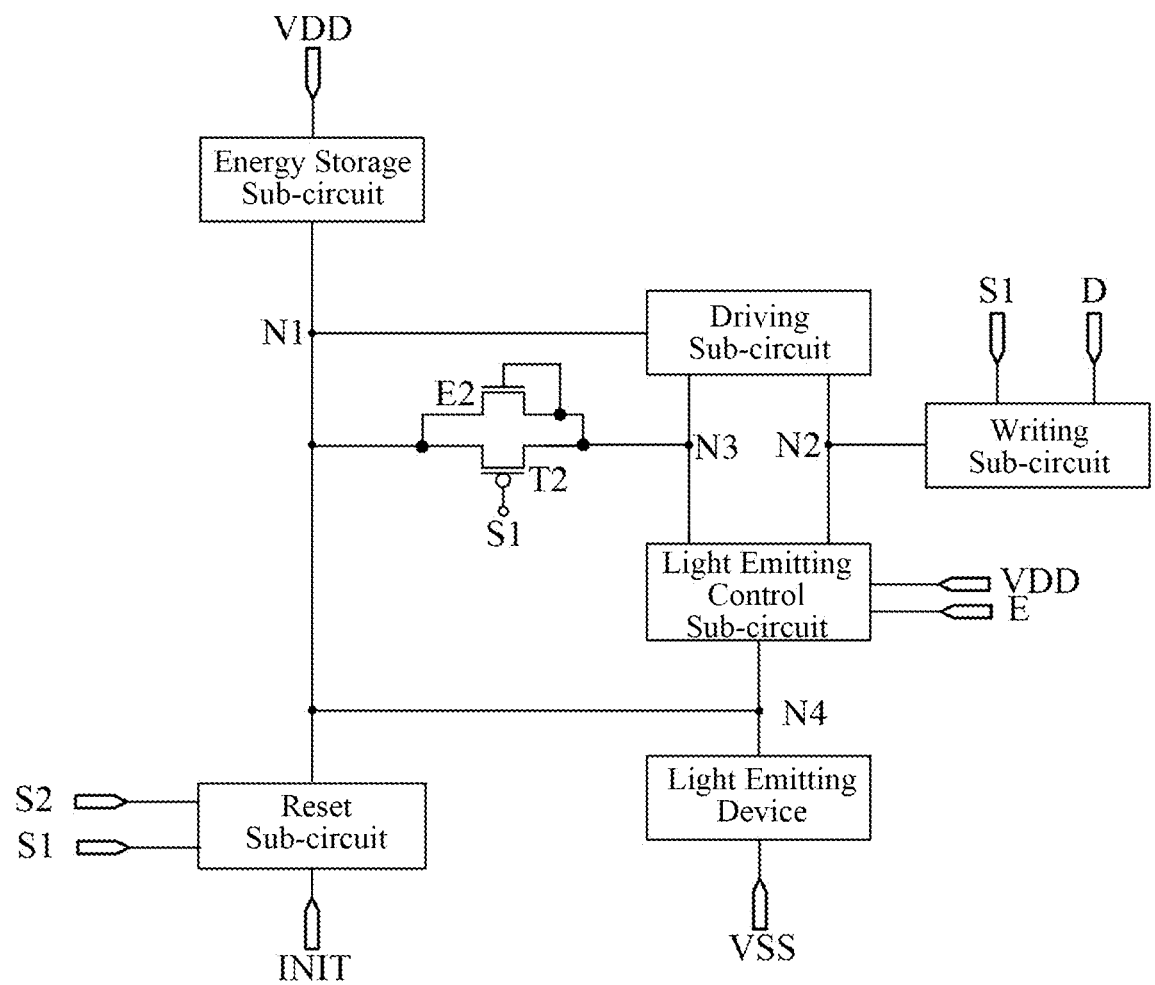
FIG. 9 is an equivalent circuit diagram of another compensation sub-circuit according to an exemplary embodiment of the present disclosure.

FIG. 9 is an equivalent circuit diagram of another compensation sub-circuit according to an exemplary embodiment of the present disclosure. As shown in FIG. 9, in an exemplary implementation, the compensation sub-circuit may include a second transistor T2 and a one-way conductive second triode E2, wherein the second transistor T2 may include an oxide transistor, and the one-way conductive second triode E2 may include an NMOS transistor.

In an exemplary implementation, a control electrode of a second transistor T2 is connected to a first scan signal line S1, a first electrode of the second transistor T2 is connected to a third node N3, and a second electrode of the second transistor T2 is connected to a first node N1 A control electrode and a first electrode of the one-way conductive second triode E2 are both connected to the third node N3, and a second electrode of the one-way conductive second triode E2 is connected to the first node N1. The second transistor T2 is configured to provide a voltage of the third node N3 to the first node N1 in a writing stage under the control of the first scan signal line S1 to compensate the first node N1 until a voltage of the first node N1 meets a threshold condition. The one-way conductive second triode E2 is configured to provide a voltage of the third node N3 to the first node N1 in the writing stage to compensate for the problems of low on-state current and mobility of the second transistor T2, avoiding insufficient charge of the storage capacitor when the signal is written, and thus improving the display effect.

In an exemplary implementation, taking a second transistor T2 as a P-type oxide transistor as an example, the working process of a pixel driving circuit of an exemplary embodiment of the present disclosure may include:

In a first stage A1, the process is the same as the exemplary embodiment described in FIG. 5.

In a first stage A2, the signal of the first scan signal line S1 is a low-level signal, signals of the second scan signal line S2 and the light emitting signal line E are high-level signals, and the data signal line outputs a data voltage. The signal of the second scan signal line S2 is a high-level signal so that the reset sub-circuit is disconnected, and the signal of the light emitting signal line E is a high-level signal so that the light emitting control sub-circuit is disconnected. The signal of the first scan signal line S1 is a low-level signal so that the writing sub-circuit is turned on. In this stage, a first node N1 is at a low level and the driving sub-circuit is turned on, so that a data voltage output by the data signal line D is provided to a third node N3 through a writing sub-circuit, a second node N2 and a driving sub-circuit. Since the second triode E2 is one-way conductive in the direction from the third node N3 to a first node N1, the signal of the first scan signal line S1 is a low-level signal so that a second transistor T2 in a compensation sub-circuit is turned on. Thus, a voltage of the third node N3 is provided to the first node N1 through the second transistor T2 and the one-way conductive second triode E2 to compensate the first node N1 until the voltage of the first node N1 meets a threshold condition, and the difference between the data voltage output by the data signal line D and a threshold voltage of the driving sub-circuit is charged into an energy storage sub-circuit. According to the exemplary embodiment of the present disclosure, by disposing a one-way conductive triode in the compensation sub-circuit, the data voltage can be made be quickly written in the writing stage, which can compensate for the problems of low on-state current and mobility of the second transistor T2, avoiding insufficient charging of a storage capacitor when the signal is written, and thus improving a display effect.

In a third stage A3, the process is the same as the exemplary embodiment described in FIG. 5. According to the exemplary embodiment of the present disclosure, by disposing a one-way conductive triode in the compensation sub-circuit, a voltage of the first node N1 can be stabilized in the light emitting stage since the second triode E2 is turned off in the direction from the first node N1 to the third node N3, thus avoiding leakage current of the driving sub-circuit.

Figure 10:
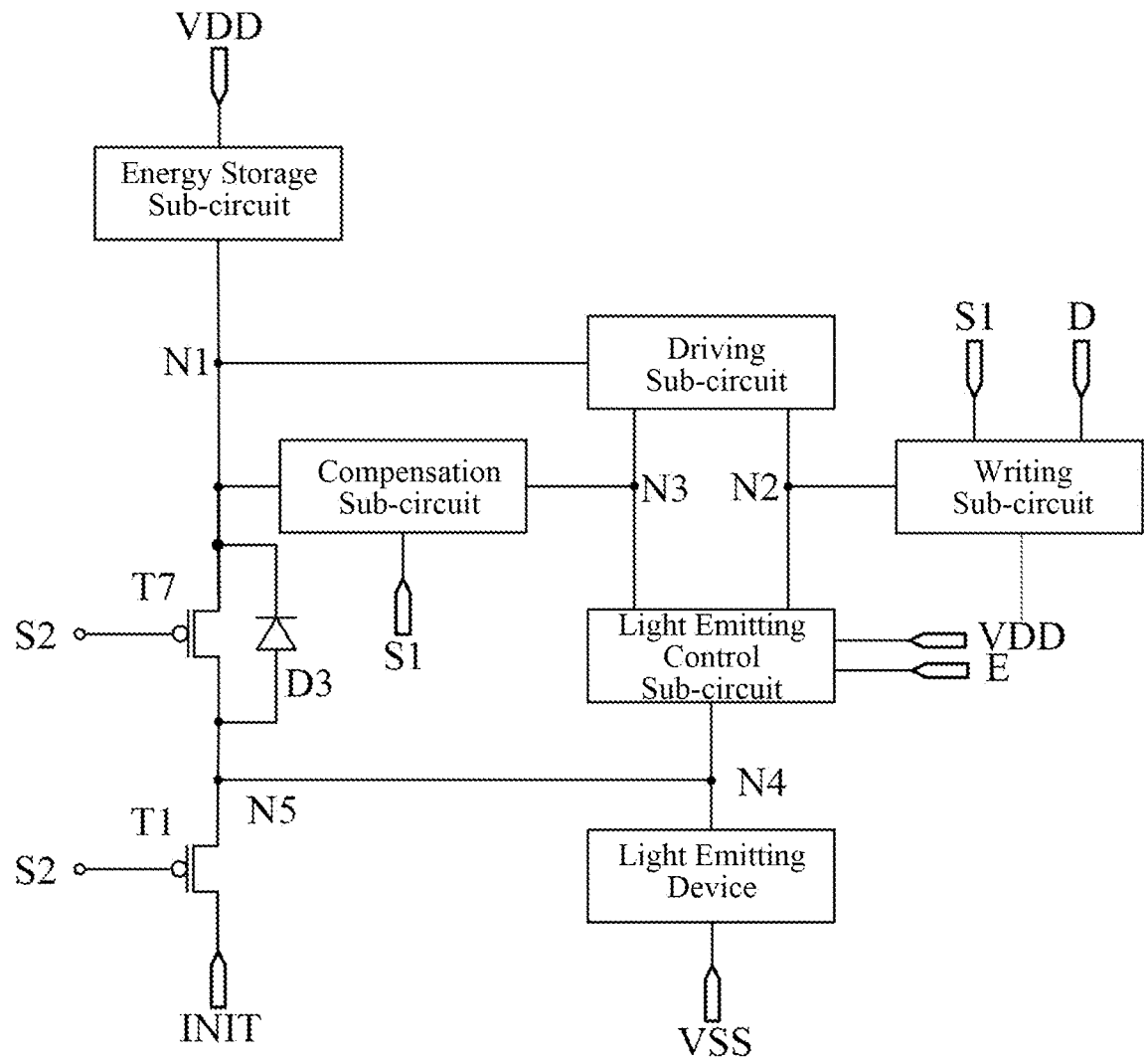
FIG. 10 is an equivalent circuit diagram of a reset sub-circuit according to an exemplary embodiment of the present disclosure.

FIG. 10 is an equivalent circuit diagram of a reset sub-circuit according to an exemplary embodiment of the present disclosure. As shown in FIG. 10, in an exemplary implementation, the reset sub-circuit may include a first transistor T1, a seventh transistor T7 and a one-way conductive third diode D3, wherein the first transistor T1 and the seventh transistor T7 may include oxide transistors, and the one-way conductive third diode D3 may include a PN junction diode.

In an exemplary implementation, a control electrode of a first transistor T1 is connected to a second scan signal line S2, a first electrode of the first transistor T1 is connected to an initial signal line INIT, and a second electrode of the first transistor is connected to a fifth node N5. A control electrode of a seventh transistor T7 is connected with the second scan signal line S2, a first electrode of the seventh transistor T7 is connected with the fifth node N5, and a second electrode of the seventh transistor T7 is connected with a first node N1. A positive electrode of the one-way conductive third diode D3 is connected to the fifth node N5, and a negative electrode of the one-way conductive third diode D3 is connected to the first node N1. The first transistor T1 and the seventh transistor T7 are configured to provide an initial voltage output by the initial signal line to the first node N1 in the reset stage under the control of the second scan signal line S2, initialize an energy storage sub-circuit, and clear a data voltage of the energy storage sub-circuit. The one-way conductive third diode D3 is configured to provide a voltage of the fifth node N5 to the first node N1 in the reset stage to compensate for the problems of low on-state current and mobility of the seventh transistor T7, avoiding untimely initialization and insufficient discharge of the storage capacitor when the initial voltage is written, and thus improving the display effect.

In an exemplary implementation, taking both a first transistor T1 and a seventh transistor T7 as P-type oxide transistors as an example, the working process of a pixel driving circuit of an exemplary embodiment of the present disclosure may include:

In a first stage A1, a signal of a second scan signal line S2 is a low-level signal, so that the first transistor T1 is turned on, and an initial voltage of the initial signal line INIT is provided to a fifth node N5. Since a third diode D3 is one-way conductive in the direction from the fifth node N5 to the first node N1, the signal of the second scan signal line S2 is a low-level signal so that a seventh transistor T7 in a reset sub-circuit is turned on, so that a voltage of the fifth node N5 is provided to a first node N1 through the seventh transistor T7 and the one-way conductive third diode D3, an energy storage sub-circuit is initialized and a data voltage of the energy storage sub-circuit is cleared. Signals of a first scan signal line S1 and a light emitting signal line E are high-level signals, so that a writing sub-circuit, a driving sub-circuit, a compensation sub-circuit and a light emitting control sub-circuit are disconnected, and the light emitting device does not emit light in this stage. According to the exemplary embodiment of the present disclosure, by disposing a one-way conductive third diode D3 in the reset sub-circuit, an initial voltage can be made be quickly written in the reset stage, which can compensate for the problems of low on-state current and mobility of the seventh transistor T7, avoiding untimely initialization and insufficient discharge of the storage capacitor when the initial voltage is written, and thus improving the display effect.

In a first stage A2, the signal of the first scan signal line S1 is a low-level signal, signals of the second scan signal line S2 and the light emitting signal line E are high-level signals, and the data signal line outputs a data voltage. In this stage, because the first node N1 is at a low level, the driving sub-circuit is turned on. The signal of the first scan signal line S1 is a low-level signal so that the writing sub-circuit and the compensation sub-circuit are turned on, so that the data voltage is provided to the first node N1 through a turned-on writing sub-circuit, a second node N2, a turned-on driving sub-circuit, a third node N3 and a turned-on compensation sub-circuit, and the difference between the data voltage output by the data signal line D and a threshold voltage of the driving sub-circuit is charged into the energy storage sub-circuit. The signal of the second scan signal line S2 is a high-level signal so that the reset sub-circuit is disconnected, and the signal of the light emitting signal line E is a high-level signal so that the light emitting control sub-circuit is disconnected.

In the third stage A3, the signal of the light-emitting signal line E is a low-level signal, so that the light-emitting control sub-circuit is turned on, and the power supply voltage output by the first power supply line VDD provides a driving voltage to the first electrode of the light-emitting device through the turned-on light emitting control sub-circuit to drive the light emitting device to emit light. The signals of the first scan signal line S1 and the second scan signal line S2 are high-level signals so that the writing sub-circuit, the compensation sub-circuit and the reset sub-circuit are disconnected. According to the exemplary embodiment of the present disclosure, by disposing a one-way conductive third diode D3 in the reset sub-circuit, the third diode D3 can stabilize a voltage of the first node N1 in the writing stage and the light emitting stage since the third diode D3 is turned off in the direction from the first node N1 to the fifth node N5, thus avoiding leakage current of the driving sub-circuit.

In an exemplary implementation, a fifth node N5 may be connected to a fourth node N4, and in a first stage A1, an initial voltage of an initial signal line INIT is provided to the fourth node N4, a light emitting device is initialized, and a pre-stored voltage of a first electrode of the light emitting device is cleared to complete initialization.

Figure 11:
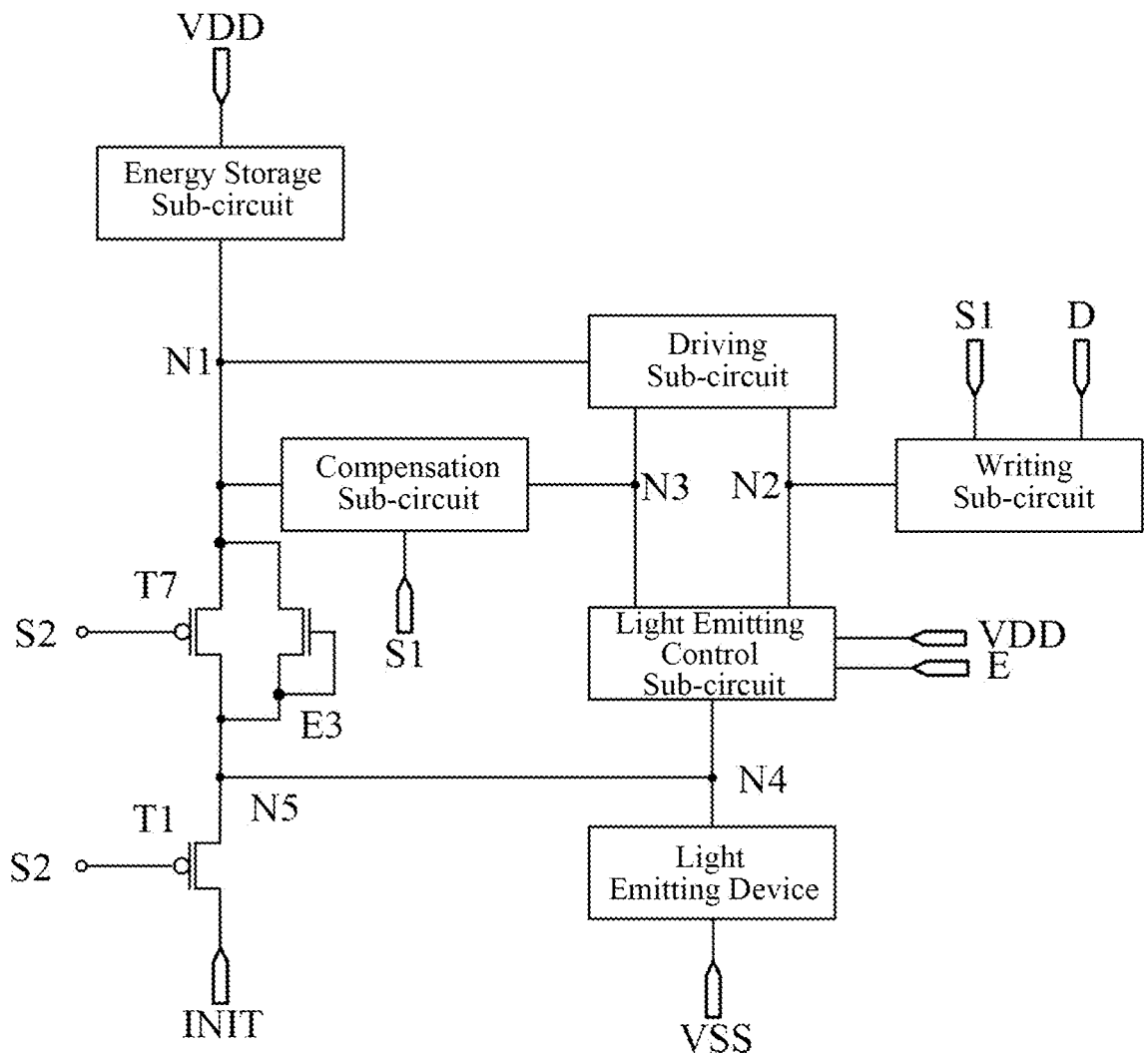
FIG. 11 is an equivalent circuit diagram of another reset sub-circuit according to an exemplary embodiment of the present disclosure.

FIG. 11 is an equivalent circuit diagram of another reset sub-circuit according to an exemplary embodiment of the present disclosure. As shown in FIG. 11, in an exemplary implementation, the reset sub-circuit may include a first transistor T1, a seventh transistor T7 and a one-way conductive third triode E3, wherein the first transistor T1 and the seventh transistor T7 may include oxide transistors, and the one-way conductive third triode E3 may include an NMOS transistor.

In an exemplary implementation, a control electrode of a first transistor T1 is connected to a second scan signal line S2, a first electrode of the first transistor T1 is connected to an initial signal line INIT, and a second electrode of the first transistor is connected to a fifth node N5. A control electrode of a seventh transistor T7 is connected with the second scan signal line S2, a first electrode of the seventh transistor T7 is connected with the fifth node N5, and a second electrode of the seventh transistor T7 is connected with a first node N1. A control electrode and a first electrode of the one-way conductive third triode E3 are both connected to the fifth node N5, and a second electrode of the one-way conductive third triode E3 is connected to the first node N1. The first transistor T1 and the seventh transistor T7 are configured to provide an initial voltage output by the initial signal line to the first node N1 in the reset stage under the control of the second scan signal line S2, initialize an energy storage sub-circuit, and clear a data voltage of the energy storage sub-circuit. The one-way conductive third triode E3 is configured to provide a voltage of the fifth node N5 to the first node N1 in the reset stage to compensate for the problems of low on-state current and mobility of the seventh transistor T7, avoiding untimely initialization and insufficient discharge of the storage capacitor when the initial voltage is written, and thus improving the display effect.

In an exemplary implementation, taking both a first transistor T1 and a seventh transistor T7 as P-type oxide transistors as an example, the working process of a pixel driving circuit of an exemplary embodiment of the present disclosure may include:

In a first stage A1, a signal of a second scan signal line S2 is a low-level signal, so that the first transistor T1 is turned on, and an initial voltage of the initial signal line INIT is provided to a fifth node N5. Since a third triode E3 is one-way conductive in the direction from the fifth node N5 to the first node N1, the signal of the second scan signal line S2 is a low-level signal so that a seventh transistor T7 in a reset sub-circuit is turned on, so that a voltage of the fifth node N5 is provided to a first node N1 through the seventh transistor T7 and the one-way conductive third triode E3, an energy storage sub-circuit is initialized and a data voltage of the energy storage sub-circuit is cleared. Signals of a first scan signal line S1 and a light emitting signal line E are high-level signals, so that a writing sub-circuit, a driving sub-circuit, a compensation sub-circuit and a light emitting control sub-circuit are disconnected, and the light emitting device does not emit light in this stage. According to the exemplary embodiment of the present disclosure, by disposing a one-way conductive third triode E3 in the reset sub-circuit, an initial voltage can be made be quickly written in the reset stage, which can compensate for the problems of low on-state current and mobility of the seventh transistor T7, avoiding untimely initialization and insufficient discharge of the storage capacitor when the initial voltage is written, and thus improving the display effect.

In a second stage A2, the process is the same as the exemplary embodiment described in FIG. 10.

In a third stage A3, the process is the same as the exemplary embodiment described in FIG. 10. According to the exemplary embodiment of the present disclosure, by disposing a one-way conductive triode in the reset sub-circuit, a voltage of the first node N1 can be stabilized in the writing stage and the light emitting stage since the third triode E3 is turned off in the direction from the first node N1 to the fifth node N5, thus avoiding leakage current of the driving sub-circuit.

Figure 12:
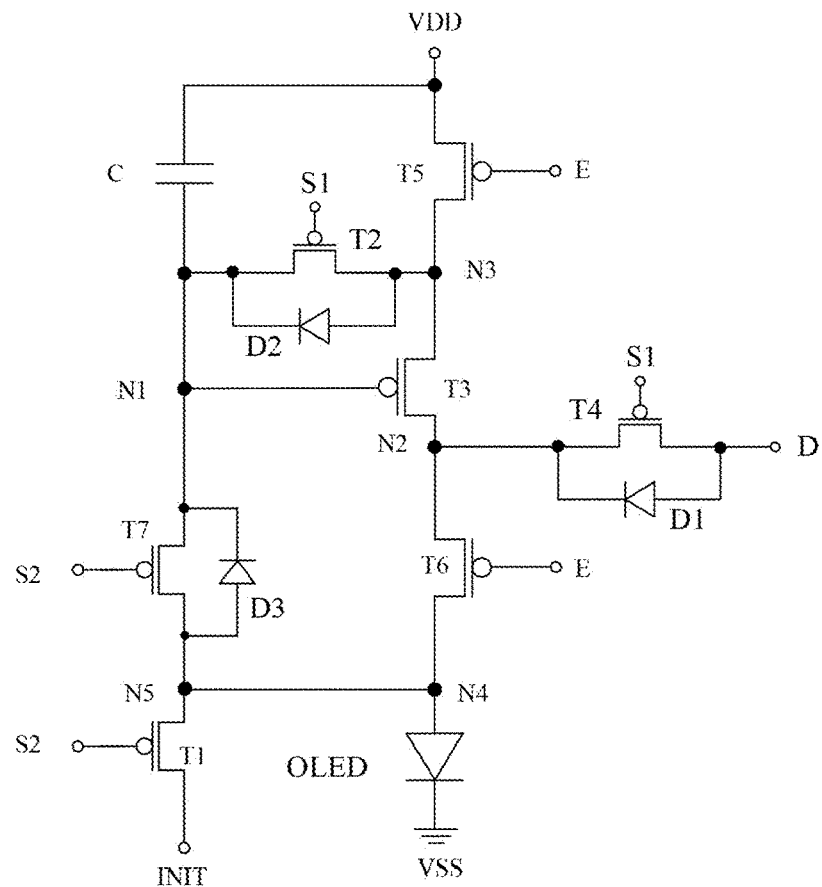
FIG. 12 is an equivalent circuit of another pixel driving circuit according to an exemplary embodiment of the present disclosure.

FIG. 12 is an equivalent circuit diagram of another pixel driving circuit according to an exemplary embodiment of the present disclosure, illustrating a circuit structure of a 7T1C. In an exemplary implementation, the pixel driving circuit may include seven transistors (a first transistor T1 to a seventh transistor T7), three diodes (a first diode D1 to a third diode D3), one storage capacitor C, and seven signal lines (a data signal line D, a first scan signal line S1, a second scan signal line S2, a light emitting signal line E, an initial signal line INIT, a first power supply line VDD, and a second power supply line VSS).

In an exemplary implementation, the writing sub-circuit may include a fourth transistor T4 and a first diode D1. A control electrode of the fourth transistor T4 is connected with the first scan signal line S1, a first electrode of the fourth transistor T4 is connected with the data signal line D, and a second electrode of the fourth transistor T4 is connected with the second node N2. A positive electrode of the first diode D1 is connected to the data signal line D, and a negative electrode of the first diode D1 is connected to the second node N2.

In an exemplary implementation, a compensation sub-circuit may include a second transistor T2 and a second diode D2. A control electrode of the second transistor T2 is connected with the first scan signal line S1, a first electrode of the second transistor T2 is connected with a third node N3, and a second electrode of the second transistor T2 is connected with a first node N1. A positive electrode of the second diode D2 is connected to the third node N3, and a negative electrode of the second diode D2 is connected to the first node N1.

In an exemplary implementation, the reset sub-circuit may include a first transistor, a seventh transistor and a third diode D3. A control electrode of the first transistor T1 is connected with the second scan signal line S2, a first electrode of the first transistor T1 is connected with the initial signal line INIT, and a second electrode of the first transistor is connected with the fifth node N5. A control electrode of a seventh transistor T7 is connected with the second scan signal line S2, a first electrode of the seventh transistor T7 is connected with the fifth node N5, and a second electrode of the seventh transistor T7 is connected with a first node N1. A positive electrode of the third diode D3 is connected to the fifth node N5, and a negative electrode of the third diode D3 is connected to the first node N1.

In an exemplary implementation, the energy storage sub-circuit may include a storage capacitor C. A first terminal of the storage capacitor C is connected to a first power supply line VDD, and a second terminal of the storage capacitor C is connected to a first node N1.

In some exemplary implementation, the driving sub-circuit includes a third transistor T3. A control electrode of the third transistor T3 is connected with a first node N1, namely a control electrode of the third transistor T3 is connected with a second terminal of the storage capacitor C, a first electrode of the third transistor T3 is connected with a second node N2, and a second electrode of the third transistor T3 is connected with a third node N3. The third transistor T3 may be referred to as a driving transistor and is configured to determine a current for driving a light emitting device.

In some exemplary implementation, the light emitting control sub-circuit may include a fifth transistor and a sixth transistor. A control electrode of the fifth transistor T5 is connected with a light emitting signal line E, a first electrode of the fifth transistor T5 is connected with a first power supply line VDD, and a second electrode of the fifth transistor T5 is connected with a third node N3. A control electrode of the sixth transistor T6 is connected with the light emitting control line E, and a first electrode of the sixth transistor T6 is connected with a second node N2. A second electrode of the sixth transistor T6 is connected to a fourth node N4 (a first electrode of a light emitting device).

In an exemplary implementation, the fourth node N4 may be connected to a fifth node N5, and the light emitting device may be an OLED, including a stacked first electrode (anode), an organic emitting layer, and a second electrode (cathode).

In an exemplary implementation, the third transistor T3 may be a driving transistor, the first transistor T1, the second transistor T2, the fourth transistor T4, the fifth transistor T5, the sixth transistor T6 and the seventh transistor T7 may be switch transistors. The first transistor T1, the second transistor T2, the fourth transistor T4 and the seventh transistor T7 may be oxide transistors, and the third transistor T3, the fifth transistor T5 and the sixth transistor T6 may be low-temperature polysilicon transistors to form an LTPO pixel driving circuit, which can realize low-frequency driving, reduce power consumption and improve display quality.

In an exemplary implementation, the first transistor T1 to the seventh transistor T7 may be P-type transistors or N-type transistors. Use of the same type of transistors in a pixel driving circuit may simplify a process flow, reduce process difficulties of a display panel, and improve a yield of a product. In some possible implementations, the first transistor T1 to the seventh transistor T7 may include P-type transistors and N-type transistors.

Figure 13:
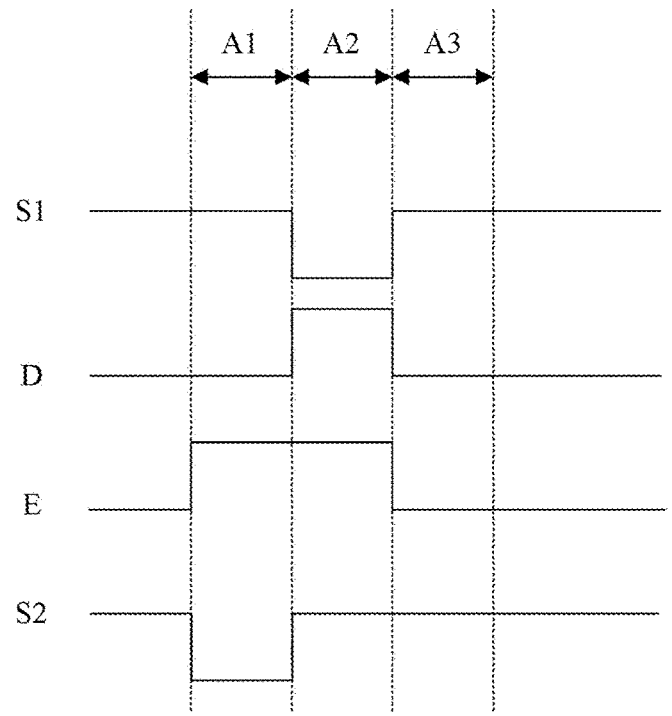
FIG. 13 is a working sequence diagram of a pixel driving circuit according to an exemplary embodiment of the present disclosure.

FIG. 13 is a working sequence diagram of a pixel driving circuit according to an exemplary embodiment of the present disclosure. A working process of the pixel driving circuit shown in FIG. 12 is illustrated below with the working sequence of the example in FIG. 13. All seven transistors are P-type transistors. In an exemplary implementation, the working process of the pixel driving circuit may include the following stages.

The first stage A1 is referred to as a reset stage. a signal of the second scan signal line S2 is a low-level signal, and signals of the first scan signal line S1 and the light emitting signal line E are high-level signals. The signals of the first scan signal line S1 and the light emitting signal line E are high-level signals, so that a second transistor T2, a third transistor T3, the fourth transistor T4, the fifth transistor T5, and the sixth transistor T6 are turned off. The signal of the second scan signal line S2 is a low-level signal, so that the first transistor T1 is turned on, an initial voltage of an initial signal line INIT is provided to a fourth node N4 and a fifth node N5, a light emitting device is initialized, and a pre-stored voltage of a first electrode of the light emitting device is cleared to complete initialization. Since a third diode D3 is one-way conductive in the direction from the fifth node N5 to the first node N1, the signal of the second scan signal line S2 is a low-level signal so that a seventh transistor T7 is turned on, so that a voltage of the fifth node N5(an initial voltage) is provided to a first node N1 through the seventh transistor T7 and the third diode D3, an energy storage sub-circuit is initialized, a data voltage of the energy storage sub-circuit is cleared and an OLED does not emit light in this stage.

According to the exemplary embodiment of the present disclosure, by disposing a third diode D3 on a path for initializing a storage capacitor, the third diode D3 and the seventh transistor T7 form a dual writing channel. In a reset stage, the third diode D3 enable an initial voltage to be quickly written into the first node N1, so as to ensure rapid initialization, which can compensate for the problems of low on-state current and mobility of the seventh transistor T7, avoid untimely initialization and insufficient discharge of the storage capacitor when the initial voltage is written, and improve the display effect.

The second stage A2 is referred to as a data writing stage or a threshold compensation stage. The signal of the first scan signal line S1 is a low-level signal, signals of the second scan signal line S2 and the light emitting signal line E are high-level signals, and the data signal line outputs a data voltage. The signal of the second scan signal line S2 is the high-level signal, so that the first transistor T1 and the seventh transistor T7 are turned off. The signal of the light emitting signal line E is a high-level signal, so that the fifth transistor T5 and the sixth transistor T6 are turned off. Since a first diode D1 is one-way conductive in the direction from the data signal line D to a second node N2, and the signal of the first scan signal line S1 is a low-level signal so that a fourth transistor T4 is turned on, the data voltage output by the data signal line D is provided to the second node N2 through the fourth transistor T4 and first diode D1. In this stage, since the first node N1 is at a low level and the third transistor T3 is turned on, a voltage of the second node N2 is provided to the third node N3 through the third transistor T3. Since the second diode D2 is one-way conductive in the direction from the third node N3 to a first node N1, the signal of the first scan signal line S1 is a low-level signal so that a second transistor T2 is turned on. Thus, a voltage of the third node N3 is provided to the first node N1 through the second transistor T2 and the second diode D2 to compensate the first node N1 until the voltage of the first node N1 meets a threshold condition, and the difference between the data voltage output by the data signal line D and a threshold voltage of the driving sub-circuit is charged into a storage capacitor C. A voltage of a second terminal (the first node N1) of the storage capacitor C is Vd−|Vth|, Vd is the data voltage output by the data signal line D, and Vth is the threshold voltage of the third transistor T3.

According to the present disclosure, by disposing a first diode D1 and a second diode D2 on a path for transmitting a data voltage, the first diode D1 and the fourth transistor T4 may form a dual writing channel, the second diode D2 and the second transistor T2 form a dual writing channel. The first diode D1 and the second diode D2 can make the data voltage be quickly written in the writing stage, which can compensation for the problems of low on-state current and mobility of the second transistor T2 and the fourth transistor T4, avoid insufficient charging of the storage capacitor when the signal is written, and improve the display effect.

The third stage A3 is referred to as a light emitting stage. The signals of the first scan signal line S1 and the second scan signal line S2 are high-level signals, and the signal of the light emitting signal line E is a low-level signal. The signals of the first scan signal line S1 and the second scan signal line S2 are high-level signals so that the first transistor T1, the second transistor T2, the fourth transistor T4 and the seventh transistor T7 are turned off. The signal of the light emitting signal line E is the low-level signal, so that the fifth transistor T5 and the sixth transistor T6 are turned on, and a power supply voltage output by the first power supply line VDD provides a driving voltage to the first electrode of the OLED through the fifth transistor T5, the third node N3, the third transistor T3, the second node N2, the sixth transistor T6 and the fourth node N4 to drive the OLED to emit light.

In a driving process of the pixel driving circuit, a driving current flowing through the third transistor T3 (driving transistor) is determined by a voltage difference between a gate electrode and a first electrode of the third transistor T3. Because the voltage of the first node N1 is Vdata-Vth, the driving current of the third transistor T3 is:

$$I=K*(Vgs-Vth)^2=K*[(Vdd-Vd+|Vth|)-Vth]^2=K*[(Vdd-Vd]^2$$

I is the driving current flowing through the third transistor T3, i.e., a driving current for driving the OLED, K is a constant related to the process parameters and geometric dimensions of the third transistor T3, Vgs is the voltage difference between the gate electrode and first electrode of the third transistor T3, Vth is the threshold voltage of the third transistor T3, Vd is the data voltage output by the data signal line D, and Vdd is the power voltage output by the first power supply line VDD.

It can be seen from the above current formula that in the light emitting stage, the driving current output by the third transistor T3 is not affected by the threshold voltage of the fourth transistor T3, and is only related to the data voltage. Therefore, the influence of the threshold voltage of the third transistor T3 on the driving current is eliminated, which can ensure uniformity of the display brightness of the display product, and improve the overall display effect of the display product.

In the light emitting stage, the voltage of the second node N2 is the power supply voltage Vdd output by the first power supply line VDD. Since the first diode D1 is turned off in the direction from the second node N2 to the data signal line D, the first diode D1 can stabilize the voltage of the second node N2 in the light emitting stage. Since the second Diode D2 is turn off in the direction from the first Node N1 to the third Node N3, the second Diode D2 can stabilize the voltage of the first Node N1 in the light emitting stage. Since the third Diode D3 is turn off in the direction from the first Node N1 to the fifth Node N5, the third Diode D3 can stabilize the voltage of the first Node N1 in the light emitting stage. According to an exemplary embodiment of the present disclosure, by disposing the first diode D1, the second diode D2, and the third diode D3, the voltages of the first node N1 and the second node N2 are ensured, and the leakage current of the third transistor T3 can be avoided in the light emitting stage to ensure the display effect.

Figure 14:
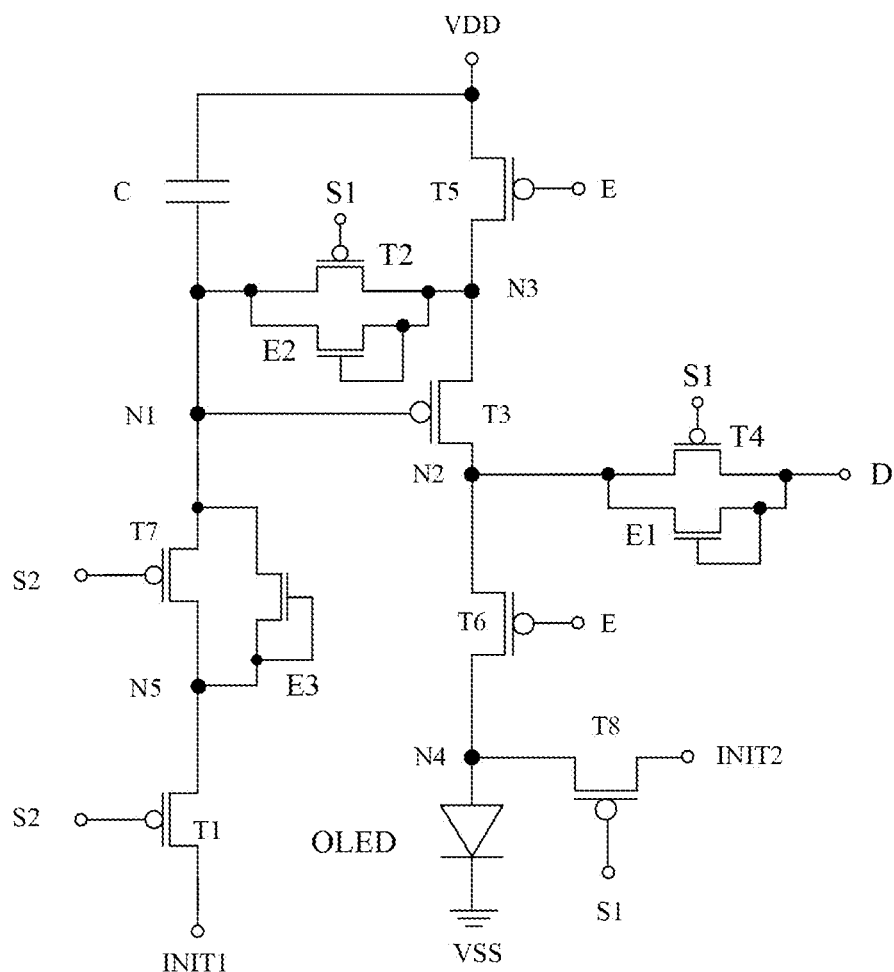
FIG. 14 is an equivalent circuit diagram of yet another pixel driving circuit according to an exemplary embodiment of the present disclosure.

FIG. 14 is an equivalent circuit diagram of another pixel driving circuit according to an exemplary embodiment of the present disclosure, illustrating a circuit structure of a 8T1C. In an exemplary implementation, the pixel driving circuit may include eight transistors (a first transistor T1 to a seventh transistor T8), three NMOS transistors(a first NMOS transistor E1 to a third NMOS transistor E3), one storage capacitor C, and eight signal lines (a data signal line D, a first scan signal line S1, a second scan signal line S2, a light emitting signal line E, a first initial signal line INIT1, a second initial signal line INIT2, a first power supply line VDD, and a second power supply line VSS).

In an exemplary implementation, the writing sub-circuit may include a fourth transistor T4 and a first NMOS transistor E1. A control electrode of the fourth transistor T4 is connected with the first scan signal line S1, a first electrode of the fourth transistor T4 is connected with the data signal line D, and a second electrode of the fourth transistor T4 is connected with the second node N2. A control electrode and a first electrode of the first NMOS transistor E1 are connected to a data signal line D, and a second electrode of the first NMOS transistor E1 is connected to a second node N2.

In an exemplary implementation, a compensation sub-circuit may include a second transistor T2 and a second NMOS transistor E2. A control electrode of the second transistor T2 is connected with the first scan signal line S1, a first electrode of the second transistor T2 is connected with a third node N3, and a second electrode of the second transistor T2 is connected with a first node N1. A control electrode and a first electrode of the second NMOS transistor E2 are connected to the third node N3, and a second electrode of the second NMOS transistor E2 is connected to the first node N1.

In an exemplary implementation, the reset sub-circuit may include a first transistor T1, a seventh transistor T7, an eighth transistor T8 and a third NMOS transistor E3. A control electrode of the first transistor T1 is connected with the second scan signal line S2, a first electrode of the first transistor T1 is connected with the first initial signal line INIT1, and a second electrode of the first transistor is connected with the fifth node N5. A control electrode of a seventh transistor T7 is connected with the second scan signal line S2, a first electrode of the seventh transistor T7 is connected with the fifth node N5, and a second electrode of the seventh transistor T7 is connected with a first node N1. A control electrode of the eighth transistor T8 is connected with the first scan signal line S1, a first electrode of the eighth transistor T8 is connected with the second initial signal line INIT2, and a second electrode of the eighth transistor T8 is connected with the fourth node N4. A control electrode and a first electrode of the third NMOS transistor E3 are connected to the fifth node N5, and a second electrode of the third NMOS transistor E3 is connected to the first node N1.

In an exemplary implementation, the energy storage sub-circuit may include a storage capacitor C. A first terminal of the storage capacitor C is connected to a first power supply line VDD, and a second terminal of the storage capacitor C is connected to a first node N1.

In some exemplary implementation, the driving sub-circuit includes a third transistor T3. A control electrode of the third transistor T3 is connected with a first node N1, namely a control electrode of the third transistor T3 is connected with a second terminal of the storage capacitor C, a first electrode of the third transistor T3 is connected with a second node N2, and a second electrode of the third transistor T3 is connected with a third node N3.

In some exemplary implementation, the light emitting control sub-circuit may include a fifth transistor and a sixth transistor. A control electrode of the fifth transistor T5 is connected with the light emitting signal line E, a first electrode of the fifth transistor T5 is connected with the first power supply line VDD, and a second electrode of the fifth transistor T5 is connected with the second node N2. A control electrode of the sixth transistor T6 is connected with the light emitting signal line E, a first electrode of the sixth transistor T6 is connected with the third node N3, and a second electrode of the sixth transistor T6 is connected with a fourth node N4(a first electrode of the light emitting device).

In an exemplary implementation, the light emitting device may be an OLED, including a first electrode (anode), an organic emitting layer, and a second electrode (cathode) that are stacked.

In an exemplary implementation, the third transistor T3 may be a driving transistor, the first transistor T1, the second transistor T2, the fourth transistor T4, the fifth transistor T5, the sixth transistor T6, the seventh transistor T7 and the eighth transistor T8 may be switch transistors. The first transistor T1, the second transistor T2, the fourth transistor T4 and the seventh transistor T7 may be oxide transistors, and the third transistor T3, the fifth transistor T5, the sixth transistor T6 and the eighth transistor T8 may be low-temperature polysilicon transistors to form an LTPO pixel driving circuit, which can realize low-frequency driving, reduce power consumption and improve display quality.

In an exemplary implementation, the first transistor T1 to the eighth transistor T8 may be P-type transistors or N-type transistors. Use of the same type of transistors in a pixel driving circuit may simplify a process flow, reduce process difficulties of a display panel, and improve a yield of a product. In some possible implementations, the first transistor T1 to the eighth transistor T8 may include P-type transistors and N-type transistors.

A working process of the pixel driving circuit shown in FIG. 14 is illustrated below with the working sequence of the example in FIG. 13. All eight transistors are P-type transistors. In an exemplary implementation, the working process of the pixel driving circuit may include the following stages.

In a first stage A1, a signal of the second scan signal line S2 is a low-level signal, and signals of the first scan signal line S1 and the light emitting signal line E are high-level signals. The signals of the first scan signal line S1 and the light emitting signal line E are high-level signals, so that a second transistor T2, a third transistor T3, the fourth transistor T4, the fifth transistor T5, and the sixth transistor T6 are turned off. The signal of a second scan signal line S2 is a low-level signal, so that the first transistor T1 is turned on, and a first initial voltage of the first initial signal line INIT1 is provided to a fifth node N5. Since a third NMOS transistor E3 is one-way conductive in the direction from the fifth node N5 to the first node N1, the signal of the second scan signal line S2 is a low-level signal so that a seventh transistor T7 is turned on, so that a voltage of the fifth node N5(an initial voltage) is provided to a first node N1 through the seventh transistor T7 and the third NMOS transistor E3, a storage capacitor C is initialized, a data voltage of the storage capacitor C is cleared and an OLED does not emit light in this stage.

According to the exemplary embodiment of the present disclosure, by disposing a third NMOS transistor E3 on a path for initializing a storage capacitor, the third NMOS transistor E3 and the seventh transistor T7 form a dual writing channel. In a reset stage, the third NMOS transistor E3 enable an initial voltage to be quickly written into the first node N1, so as to ensure rapid initialization, which can compensate for the problems of low on-state current and mobility of the seventh transistor T7, avoid untimely initialization and insufficient discharge of the storage capacitor when the signal is written to improve the display effect, and avoid insufficient charge of the storage capacitor when the signal is written to improve the display effect.

In a first stage A2, signals of the second scan signal line S2 and the light emitting signal line E are high-level signals, and the data signal line outputs a data voltage. The signal of the second scan signal line S2 is the high-level signal, so that the first transistor T1 and the seventh transistor T7 are turned off. The signal of the light emitting signal line E is a high-level signal, so that the fifth transistor T5 and the sixth transistor T6 are turned off. The signal of the first scan signal line S1 is the low-level signal, so that the eighth transistor T8 is turned on, so that a second initial voltage of the second initial signal line INIT2 is provided to a first electrode of the OLED to initialize the first electrode of the OLED and clear its internal pre-stored voltage, thereby completing initialization and ensuring that the OLED does not emit light. Since a first NMOS transistor E1 is one-way conductive in the direction from the data signal line D to a second node N2, and the signal of the first scan signal line S1 is a low-level signal so that a fourth transistor T4 is turned on, the data voltage output by the data signal line D is provided to the second node N2 through the fourth transistor T4 and first NMOS transistor E1. In this stage, since the first node N1 is at a low level and the third transistor T3 is turned on, a voltage of the second node N2 is provided to the third node N3 through the third transistor T3. Since the second NMOS transistor E2 is one-way conductive in the direction from the third node N3 to a first node N1, the signal of the first scan signal line S1 is a low-level signal so that a second transistor T2 is turned on. Thus, a voltage of the third node N3 is provided to the first node N1 through the second transistor T2 and the second NMOS transistor E2 to compensate the first node N1 until the voltage of the first node N1 meets a threshold condition, and the difference between the data voltage output by the data signal line D and a threshold voltage of the driving sub-circuit is charged into a storage capacitor C. A voltage of a second terminal (the first node N1) of the storage capacitor C is Vd−|Vth|.

According to the present disclosure, by disposing a first NMOS transistor E1 and a second NMOS transistor E2 on a path for transmitting a data voltage, the first NMOS transistor E1 and the fourth transistor T4 may form a dual writing channel, the second NMOS transistor E2 and the second transistor T2 form a dual writing channel. The first NMOS transistor E1 and the second NMOS transistor E2 can make the data voltage be quickly written in the writing stage, which can compensation for the problems of low on-state current and mobility of the second transistor T2 and the fourth transistor T4, avoid insufficient charging of the storage capacitor when the signal is written, and improve the display effect.

In a third stage A3, the process is the same as the exemplary embodiment described in FIG. 12.

In the light emitting stage, since the first NMOS transistor E1 is turned off in the direction from the second node N2 to the data signal line D, the first NMOS transistor E1 can stabilize the voltage of the second node N2 in the light emitting stage. Since the second NMOS transistor E2 is turn off in the direction from the first Node N1 to the third Node N3, the second NMOS transistor E2 can stabilize the voltage of the first Node N1 in the light emitting stage. Since the third NMOS transistor E3 is turn off in the direction from the first Node N1 to the fifth Node N5, the third NMOS transistor E3 can stabilize the voltage of the first Node N1 in the light emitting stage. According to an exemplary embodiment of the present disclosure, by disposing the first NMOS transistor E1, the second NMOS transistor E2, and the third NMOS transistor E3, the voltages of the first node N1 and the second node N2 are ensured, and the leakage current of the third transistor T3 can be avoided in the light emitting stage to ensure the display effect.

It can be seen from the aforementioned exemplary embodiments that, according to the present disclosure, by disposing a one-way conductive device on a path that initializes a storage capacitor, the one-way conductive device and the seventh transistor T7 form a dual writing channel. In a reset stage, an initial voltage can be made be quickly written into the first node N1, so as to ensure rapid initialization, which can compensate for the problems of low on-state current and mobility of the seventh transistor T7, avoid untimely initialization and insufficient discharge of the storage capacitor when the initial voltage is written, and improve the display effect. According to the present disclosure, by disposing a one-way conductive device on a path for transmitting a data voltage, the one-way conductive device may form a double write channel with the second transistor T2, And/or, the one-way conductive device can form a double writing channel with the fourth transistor T4, so that the data voltage can be quickly written in the writing stage, which can make up for the problems of low on-state current and mobility of the second transistor T2 and the fourth transistor T4, avoid insufficient charging of the storage capacitor during signal writing, and improve the display effect. According to the present disclosure, by disposing a one-way conductive device on an oxide transistor which stores a storage capacitor signal writing path and is related to the leakage current of the control electrode of the driving transistor, the voltages of the first node N1 and the second node N2 are ensured, thus avoiding the leakage current of the third transistor T3 in the light emitting stage and ensuring the display effect. The pixel driving circuit provided by the exemplary embodiment of the present disclosure can not only ensure fast initialization and fast writing of data voltage while reducing power consumption, but also avoid leakage current in the light emitting stage and improve the display effect.

The structure of the pixel driving circuit shown in the present disclosure thereof is merely an exemplary description. In an exemplary implementation, the corresponding structures may be altered according to actual needs. For example, the one-way conductive device may be provided only in the writing sub-circuit, or only in the compensation sub-circuit, or only in the reset sub-circuit, or only in the writing sub-circuit and the compensation sub-circuit, or only in the writing sub-circuit and the reset sub-circuit, or only in the compensation sub-circuit and the reset sub-circuit, etc. For another example, the one-way conductive device of the writing sub-circuit may be any one of a diode, an NMOS transistor, and a four-terminal MOS circuit, the one-way conductive device of the compensation sub-circuit may be any one of a diode and an NMOS transistor, and the one-way conductive device of the reset sub-circuit may be any one of a diode and an NMOS transistor. As a further example, the pixel driving circuit may be other structure forms of 7T1C or 8T1C, or 5T1C, 6T1C, 8T2C, 9T2C, etc. The present disclosure is not limited herein.

Figure 15:
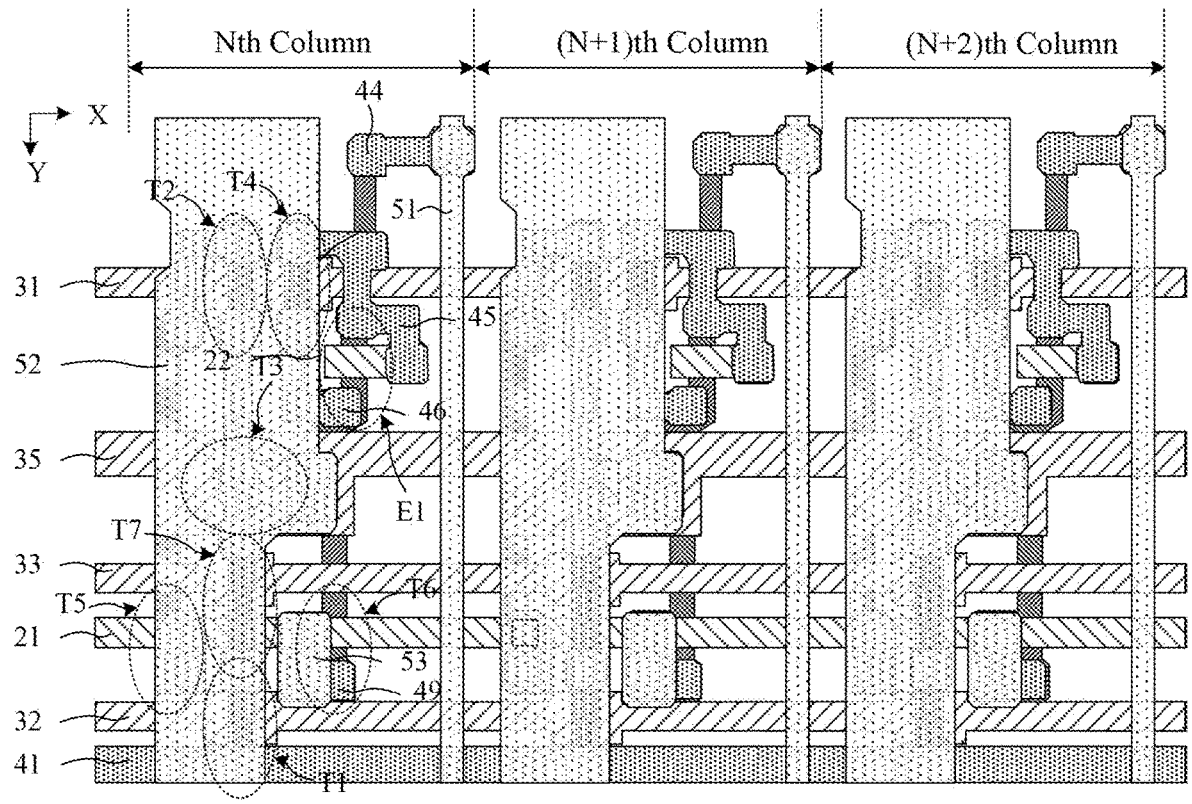
FIG. 15 is a schematic structure diagram of a driving circuit layer according to an exemplary embodiment of the present disclosure.

FIG. 15 is a schematic diagram of the structure of a driving circuit layer according to an exemplary embodiment of the present disclosure, illustrating a planar structure of the driving circuit layer in three sub-pixels, which are the Nth column of sub-pixels, the (N+1)th column of sub-pixels and the (N+2)th column of sub-pixels, respectively. As shown in FIG. 15, in a plane parallel to the display substrate, the driving circuit layer may include a light emitting control line 21, a first scan signal line 31, a second scan signal line 32, a third scan signal line 33, an initial signal line 41, a data signal line 51, a first power supply line 52, and a pixel driving circuit. The pixel driving circuit may include seven transistors, an NMOS transistor, and a storage capacitor. The seven transistors may include transistors from T1 to T7, and the third transistor T3 is a driving transistor. The storage capacitor may include a first electrode plate and a second electrode plate.

In a plane perpendicular to the display substrate, the driving circuit layer may include a first semiconductor layer, a first conductive layer, a second semiconductor layer, a second semiconductor layer, a third conductive layer, and a fourth conductive layer that are sequentially disposed on a base substrate. In an exemplary embodiment, the first semiconductor layer may include an active layer of a third transistor T3, an active layer of a fifth transistor T5, an active layer of a sixth transistor T6, an NMOS active layer and a first connection electrode of an NMOS transistor E1. The first conductive layer may include a light emitting control line 21, a gate electrode of a third transistor T3, a gate electrode of a fifth transistor T5, a gate electrode of a sixth transistor T6, an NMOS gate electrode of an NMOS transistor E1, and the gate electrode of the third transistor T3 also serves as a first electrode plate of a storage capacitor. The second semiconductor layer may include a first scan signal line 31, a second scan signal line 32, a third scan signal line 33, a gate electrode of a first transistor T1, a gate electrode of a second transistor T2, a gate electrode of a fourth transistor T4, a gate electrode of a seventh transistor T7, and a second electrode plate of the storage capacitor. The second semiconductor layer may include an active layer of the first transistor T1, an active layer of the second transistor T2, an active layer of the fourth transistor T4, and an active layer of the seventh transistor T7. The third conductive layer may include an initial signal line 41, and a plurality of connection electrodes as the first and second electrodes of the plurality of transistors. The fourth conductive layer may include a data signal line 51 and a first power supply line 52.

In an exemplary embodiment, the third transistor T3, the fifth transistor T5, and the sixth transistor T6 may be polysilicon transistors, and the first transistor T1, the second transistor T2, the fourth transistor T4, and the seventh transistor T7 may be oxide transistors.

In an exemplary implementation, the driving circuit layer may include a first insulating layer, a second insulating layer, a third insulating layer, a fourth insulating layer, a fifth insulating layer, and a sixth insulating layer. The first insulating layer is disposed between the base substrate and the first semiconductor layer, the second insulating layer is disposed between the first semiconductor layer and the first conductive layer, the third insulating layer is disposed between the first conductive layer and the second conductive layer, the fourth insulating layer is disposed between the second conductive layer and the second semiconductor layer, the fifth insulating layer is disposed between the second semiconductor layer and the third conductive layer, and the sixth insulating layer is disposed between the third conductive layer and the fourth conductive layer.

In an exemplary implementation, a gate electrode of a first transistor T1 is connected to a second scan signal line 32, a first electrode of the first transistor T1 is connected to an initial signal line 52 through a via, and a second electrode of the first transistor is directly connected to a first electrode of a seventh transistor T7. A gate electrode of the second transistor T2 is directly connected to a first scan signal line 31, and a first electrode of the second transistor T2 is connected to a second electrode of a third transistor T3 and a second electrode of a fifth transistor T5 through a third connection electrode. A second electrode of the second transistor T2 is connected to a gate electrode of a third transistor T3 and a second electrode of a seventh transistor T7 through a second connection electrode. A gate electrode of the third transistor T3 serves as a first electrode plate of a storage capacitor, and is connected to a second electrode of the seventh transistor T7 through the second connection electrode and the second electrode of the second transistor T2. A first electrode of the third transistor T3 is directly connected to a second electrode of the NMOS transistor E1. A second electrode of the third transistor T3 is directly connected to a second electrode of the fifth transistor T5, and is connected to the second electrode of the second transistor T2 through the third connection electrode. A gate electrode of the fourth transistor T4 is directly connected to the first scan signal line 31, a first electrode of the fourth transistor T4 is connected to the data signal line 51 through a fifth connection electrode, a first connection electrode and a fourth connection electrode, and a second electrode of the fourth transistor T4 is connected to a first electrode of the third transistor T3 through a sixth connection electrode. A gate electrode of the fifth transistor T5 is directly connected to a light emitting control line 21, a first electrode of the fifth transistor T5 is connected to a first power supply line 52 through an eighth connection electrode, and a second electrode of the fifth transistor T5 is directly connected to a second electrode of the third transistor T3. A gate electrode of the sixth transistor T6 is directly connected to the light emitting signal line 21, a first electrode of the sixth transistor T6 is connected to the first electrode of the third transistor T3, and a second electrode of the sixth transistor T6 is connected to an anode of the light emitting device through a ninth connection electrode and a anode connection electrode. A gate electrode of the seventh transistor T7 is directly connected to the third scan signal line 33, a first electrode of the seventh transistor T7 is directly connected to the second electrode of the first transistor T1, and a second electrode of the seventh transistor T7 is respectively connected to the gate electrode of the third transistor T3 and the second electrode of the second transistor T2 through the second connection electrode. An NMOS gate electrode of the NMOS transistor E1 is connected to a first electrode of the NMOS transistor E1 through a fifth connection electrode, and a second electrode of the NMOS transistor is directly connected to the first electrode of the third transistor T3 and the first electrode of the sixth transistor T6, and is connected to the second electrode of the fourth transistor T4 through a sixth connection electrode.

In an exemplary implementation, the third conductive layer may include a second connection electrode and a third connection electrode. The initial signal line is connected with a first region of an active layer of a first transistor T1 through a via, the second connection electrode is respectively connected with a second region of an active layer of a seventh transistor T7, a second region of an active layer of a second transistor T2 and the first electrode plate through a via, and the third connection electrode is respectively connected to a second region of an active layer of the third transistor T3 and a first region of an active layer of the second transistor T2 through a via.

In an exemplary implementation, the third conductive layer may include a fourth connection electrode, a fifth connection electrode and a sixth connection electrode. The fourth connection electrode is connected with the first connection electrode through a via, the fifth connection electrode is respectively connected with the first connection electrode, a first region of an active layer of the fourth transistor T4, a first region of an active layer of the NMOS transistor E1 and a gate electrode of the NMOS transistor E1 through a via, and the sixth connection electrode is respectively connected to a second region of the active layer of the fourth transistor T4 and a second region of the active layer of the NMOS transistor E1 through a via. A data signal line 51 of the fourth conductive layer is connected to the fourth connection electrode through a via.

In an exemplary implementation, the third conductive layer may include a seventh connection electrode connected to the second electrode plate through a via, and a first power supply line 52 of the fourth conductive layer is connected to the seventh connection electrode through a via.

In an exemplary implementation, the third conductive layer may include an eighth connection electrode connected to a first region of an active layer of the fifth transistor T5 through a via, and the first power supply line 52 of the fourth conductive layer is connected to the eighth connection electrode through a via.

In an exemplary implementation, the third conductive layer may include a ninth connection electrode connected to a second region of an active layer of the sixth transistor T6 through a via, and the fourth conductive layer further includes an anode connection electrode connected to the eighth connection electrode through a via.

Exemplary description is made below through a process of preparing a pixel driving circuit. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as depositing, coating, or the like. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" which has experienced the patterning process includes at least one "pattern". "A and B being disposed on the same layer" in the present disclosure means that A and B are formed simultaneously through a single patterning process, and the "thickness" of a film layer is the dimension of the film layer in a direction perpendicular to the display substrate. In an exemplary embodiment of the present disclosure, "an orthographic projection of B is within the range of an orthographic projection of A" refers to the boundary of the orthographic projection of B falling within the boundary range of the orthographic projection of A, or the boundary of the orthographic projection of A overlaps with the boundary of the orthographic projection of B. "An orthographic projection of A including an orthographic projection of B" means that a boundary of the orthographic projection of B falls within a range of boundary of the orthographic projection of A, or the boundary of the orthographic projection of A overlaps with the boundary of the orthographic projection of B.

Taking the pixel driving circuit of three sub-pixels as an example, the preparation process of the pixel driving circuit is illustrated below. Among them, transistors from T1 to T7 of the pixel driving circuit in each sub-pixel are P-type transistors, the first transistor T1, the second transistor T2, the fourth transistor T4 and the seventh transistor T7 are oxide transistors, the third transistor T3, the fifth transistor T5 and the sixth transistor T6 are low-temperature polysilicon transistors, and the driving sub-circuit includes the fourth transistor T4 and the NMOS transistor E1.

In an exemplary implementation, the preparation process of the pixel driving circuit may include the following operations.

Figure 16:
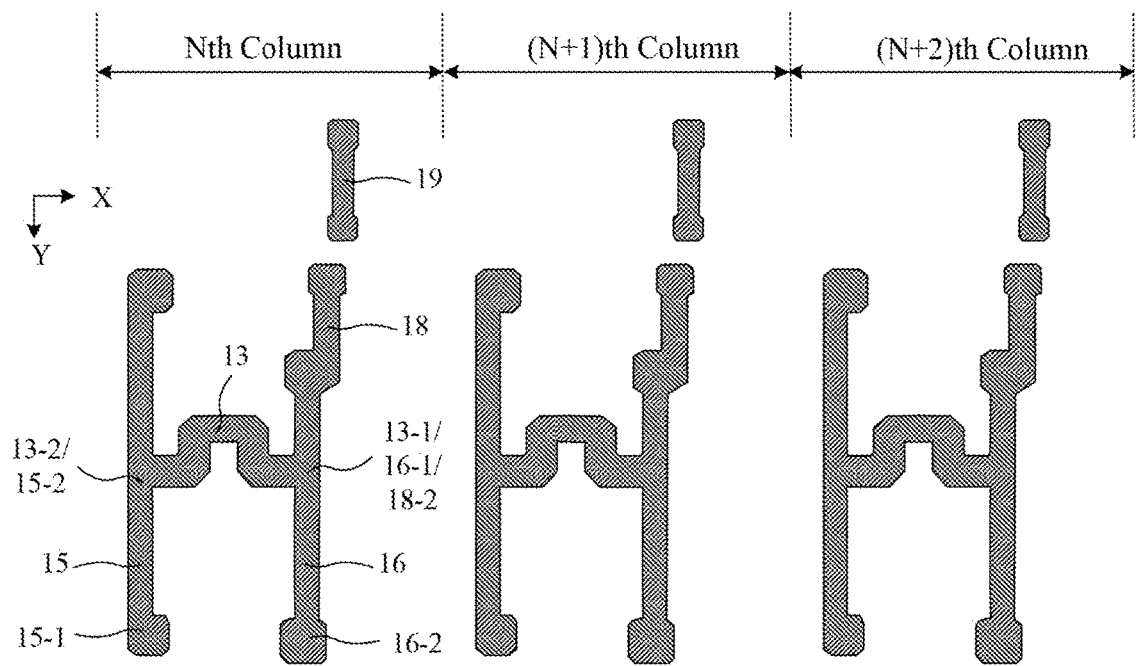
FIG. 16 is a schematic diagram obtained after a pattern of a first semiconductor layer is formed according to an embodiment of the present disclosure.

(1) A pattern of a first semi-conductive layer is formed. In an exemplary embodiment, forming the pattern of first semiconductor layer may include: a first insulating thin film and a first semiconductor thin film are sequentially deposited on the substrate. The first semiconductor film is patterned by a patterning process to form a first insulating layer covering the substrate and a first semiconductor layer disposed on the first insulating layer. The first semiconductor layer of each sub-pixel includes at least a third active layer 13 of the third transistor T3, a fifth active layer 15 of the fifth transistor T5, a sixth active layer 16 of the sixth transistor T6, an NMOS active layer 18 of the NMOS transistor E1 and a first connection electrode 19, and the third active layer 13, the fifth active layer 15, the sixth active layer 16 and the NMOS active layer 18 are connected to each other as an integral structure, as shown in FIG. 16.

In an exemplary embodiment, the third active layer 13 may be in a shape of an ""几", ", and the fifth active layer 15 and the sixth active layer 16 may be in shapes of a "1".

In an exemplary embodiment, the active layer of each transistor may include a first region, a second region, and a channel region located between the first region and the second region. In an exemplary embodiment, a first region 13-1 of the third active layer 13 is also used as a second region 16-1 of the sixth active layer 16 and a second region 18-2 of the NMOS active layer 18, that is, the first region 13-1 of the third active layer 13, the first region 16-1 of the sixth active layer 16, and the second region 18-2 of the NMOS active layer 18 are connected to one another. The second region 13-2 of the third active layer 13 also serves as a second region 15-2 of the fifth active layer 15, i.e., the second region 13-2 of the third active layer 13 and the second region 15-2 of the fifth active layer 15 are connected to each other. The first region 15-1 of the fifth active layer 15 and the second region 16-2 of the sixth active layer 16 are disposed separately.

In an exemplary embodiment, the first connection electrode 19 is disposed separately, and is configured to be respectively connected to the first electrode of a fourth transistor, a gate electrode and a first electrode of the NMOS transistor, and the data signal line which are subsequently formed.

In an exemplary embodiment, the first semiconductor layer may be made of poly-silicon (p-Si), that is, the third transistor, the fifth transistor and the sixth transistor are LTPS thin film transistors.

Figure 17A:
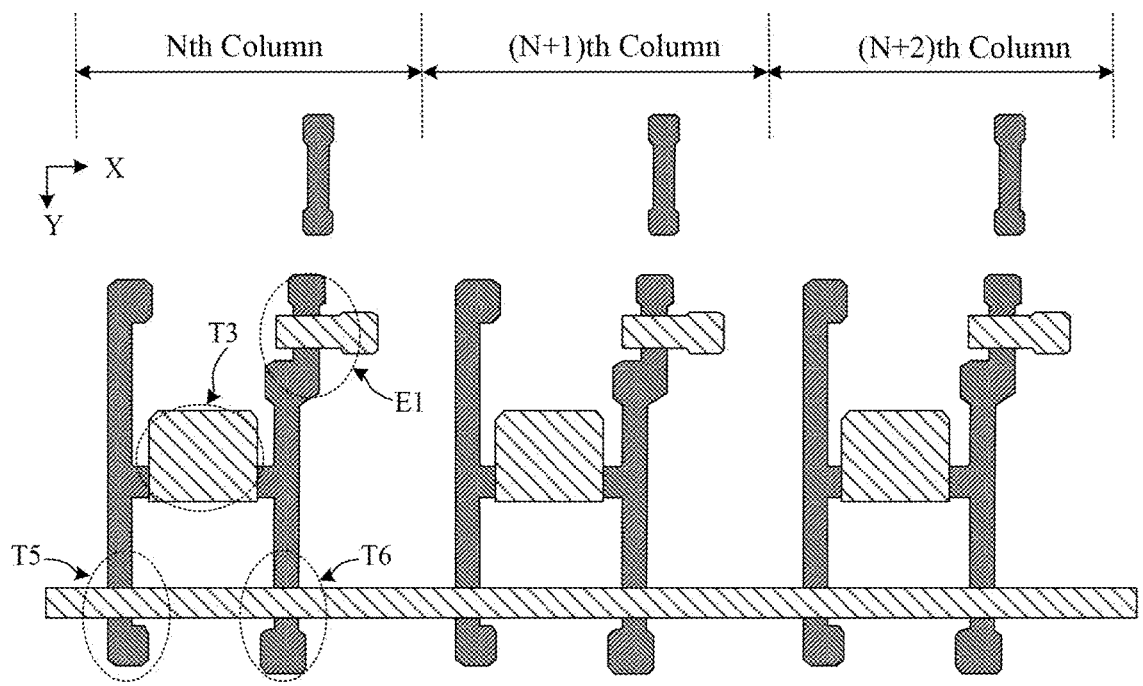
FIG. 17a and FIG. 17b are schematic diagrams obtained after a pattern of a first conductive layer is formed according to an embodiment of the present disclosure.
Figure 17B:
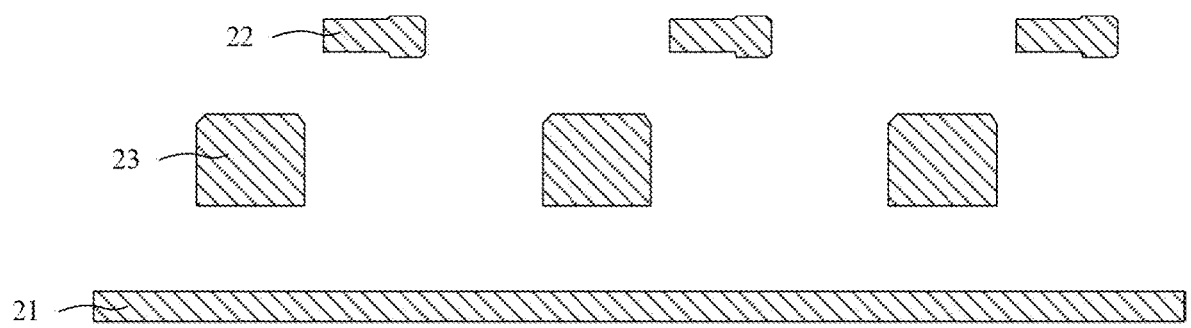

(2) A pattern of a first conductive layer is formed. In an exemplary embodiment, forming the pattern of the first conductive layer may include: sequentially depositing a second insulation thin film and a first metal thin film on the base substrate on which the above-mentioned patterns are formed, and patterning the first metal thin film through a patterning process to form a second insulation layer that covers the pattern of the semiconductor layer and form the pattern of the first conductive layer disposed on the second insulation layer. The pattern of the first conductive layer of each sub-pixel at least includes a light emitting control line 21, a gate electrode 22 of an NMOS transistor and a first electrode plate 23 of a storage capacitor, as shown in FIG. 17a and FIG. 17b, wherein FIG. 17b is a schematic plan of the first conductive layer in FIG. 17a. In an exemplary embodiment, the first conductive layer may be called a first metal gate layer (GATE1).

In an exemplary embodiment, the light emitting control line 21 may extend along a first direction X, a region where the light emitting control line 21 overlaps with a fifth active layer serves as a gate electrode of a fifth transistor T5, and a region where the light emitting control line 21 overlaps with a sixth active layer serves as a gate electrode of a sixth transistor T6.

In the exemplary embodiment, an NMOS gate electrode 22 is disposed on a side of the first electrode plate 23 away from the light emitting control line 21, and there is an overlapping area between an orthographic projection of the NMOS gate electrode 22 on a substrate and the orthographic projection of the NMOS active layer 18 on the substrate.

In an exemplary embodiment, the first electrode plate 23 is disposed between a light emitting control line 21 and an NMOS gate electrode 22. The first electrode plate 23 may be rectangular, and the corners of the rectangular shape may be chamfered. There is overlapping area between an orthographic projection of a first electrode plate 23 on a substrate and an orthographic projection of a third active layer of the third transistor T3 on the substrate, and the first electrode plate 23 simultaneously serves as a gate electrode of the third transistor T3.

In an exemplary embodiment, after the pattern of the first conductive layer is formed, the first semiconductor layer may be metalized by using the first conductive layer as a shield. A region of the semiconductor layer, which is shielded by the first conductive layer, forms the channel regions of the fifth transistor T5, the sixth transistor T6 and the NMOS transistor E1, and a region of the first semiconductor layer, which is not shielded by the first conductive layer, is metalized, that is, first regions and second regions of the fifth transistor and the sixth transistor, a second region of the NMOS transistor E1 and a first connection electrode 19 are all metalized.

Figure 18A:
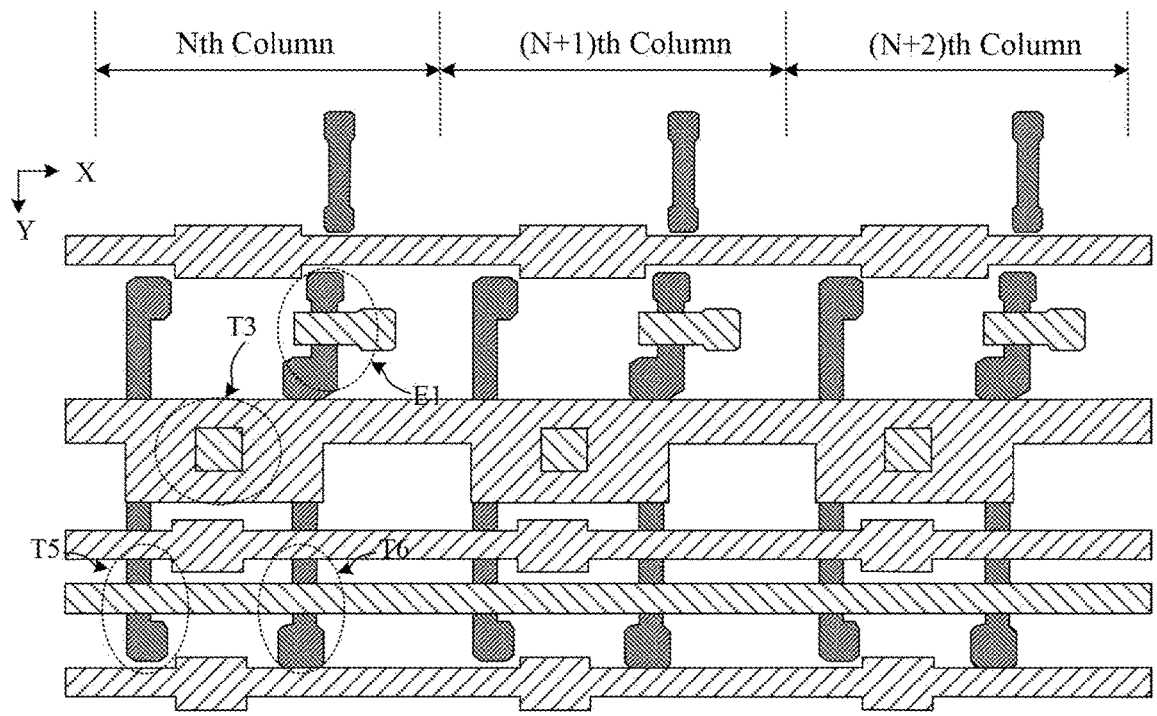
FIG. 18a and FIG. 18b are schematic diagrams obtained after a pattern of a second semiconductor layer is formed according to an embodiment of the present disclosure.
Figure 18B:
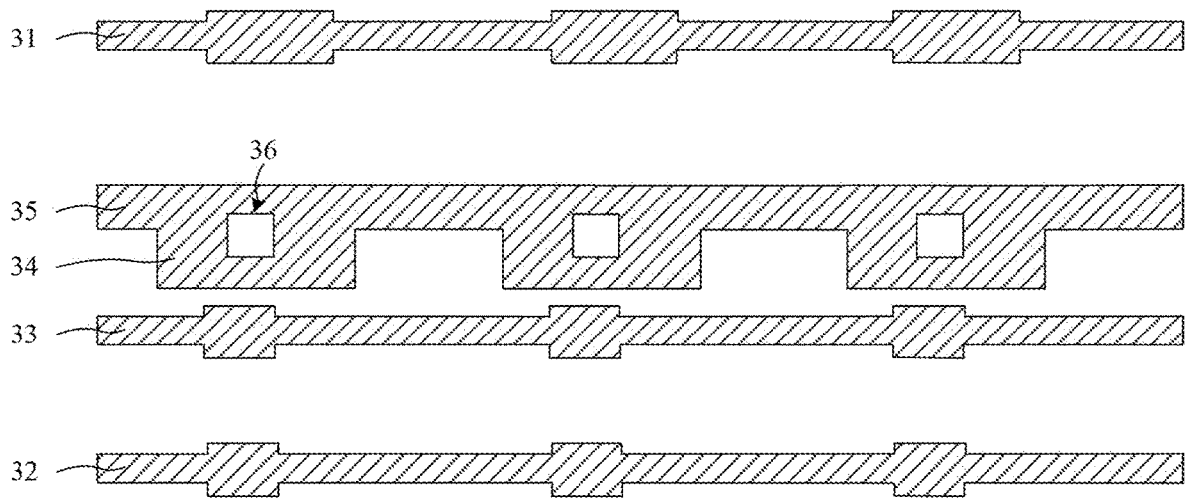

(3) A pattern of a second semiconductor layer is formed. In an exemplary embodiment, forming the pattern of the second semiconductor layer may include: depositing a third insulating thin film and a second metal thin film in sequence on the substrate on which the aforementioned patterns are formed, and patterning the second metal thin film through the patterning process to form the third insulating layer covering the first conductive layer and the pattern of the second semiconductor layer disposed on the third insulating layer. The pattern of the second semiconductor layer of each sub-pixel at least include a first scan signal line 31, a second scan signal line 32, a third scan signal line 33, a second electrode plate 34 of the storage capacitor, electrode plate connection line 35, as shown in FIG. 18a and FIG. 18b, wherein FIG. 18b is a schematic plan view of the second semiconductor layer in FIG. 18a. In an exemplary embodiment, the second semiconductor layer may be called a second metal gate layer (GATE 2).

In an exemplary embodiment, the first scan signal line 31, the second scan signal line 32, and the third scan signal line 33 may extend along a first direction X. The first scan signal line 31 is disposed on a side of the NMOS gate electrode 22 away from the light emitting control line 21, the second scan signal line 32 is disposed on a side of the light emitting control line 21 away from the second electrode plate 34, and the third scan signal line 33 is disposed between the light emitting control line 21 and the second electrode plate 34. In an exemplary embodiment, the second scan signal line 32 and the third scan signal line 33 may be connected to the same signal source and transmit the same signal which may be referred to as a reset signal line.

In an exemplary embodiment, a second electrode plate 34 of the storage capacitor is disposed between a first scan signal line 31 and a third scan signal line 33. An outline of the second electrode plate 34 may be in the shape of a rectangle, and corners of the rectangle may be chamfered. There is an overlapping region between an orthographic projection of the second electrode plate 34 on the base substrate and the orthographic projection of the first electrode plate 23 on the base substrate. A opening 36 is disposed on the second electrode plate. The opening 36 may be rectangular, so that the second electrode plate 34 forms an annular structure. The opening 36 exposes the third insulating layer covering the first electrode plate 23, and the orthographic projection of the first electrode plate 23 on the substrate contains an orthographic projection of the opening 36 on the substrate. In an exemplary embodiment, the opening 36 is configured to accommodate a first via subsequently formed, which is located in the opening 36 and exposes the first electrode plate 23, so that a second electrode of the seventh transistor T7 subsequently formed is connected to the first electrode plate 23.

In an exemplary embodiment, an electrode plate connection line 35 is disposed along a first direction X or between second electrode plates 34 of adjacent sub-pixels along an opposite direction of the first direction X, a first end of the electrode plate connection line 35 is connected to the second electrode plate 34 of the present sub-pixel, and a second end of the electrode plate connection line 35 extending along the first direction X or the opposite direction of the first direction X is connected to the second electrode plates 34 of the adjacent sub-pixels along the first direction X or the opposite direction of the first direction X, that is, the electrode plate connection line 35 is configured to allow the second electrode plates of the adjacent sub-pixels in the first direction X to be connected to each other. In an exemplary embodiment, the second electrode plates in the adjacent sub-pixels are formed into a mutual-connected integrated structure through the electrode plate connection line 35, and the second electrode plate of the integrated structure can be multiplexed as a power signal line to ensure that the second electrode plates in the adjacent sub-pixels have a same potential, which is conductive to improving uniformity of a panel, avoids display defects of the display substrate, and ensures the display effect of the display substrate.

Figure 19A:
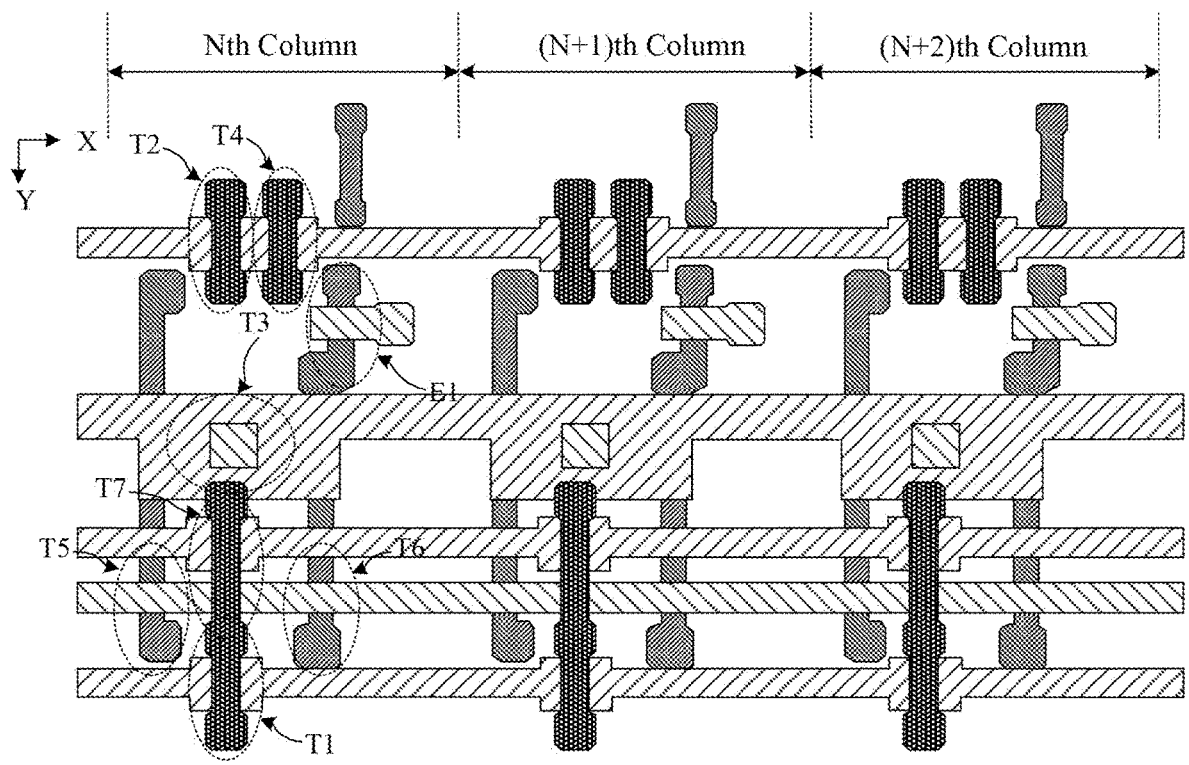
FIG. 19a and FIG. 19b are schematic diagrams obtained after a pattern of a second semiconductor layer is formed according to an embodiment of the present disclosure.
Figure 19B:
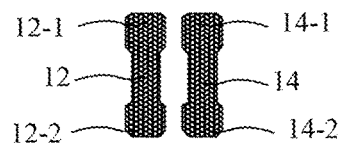
Figure 19B:
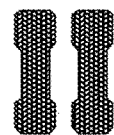
Figure 19B:
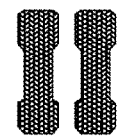
Figure 19B:
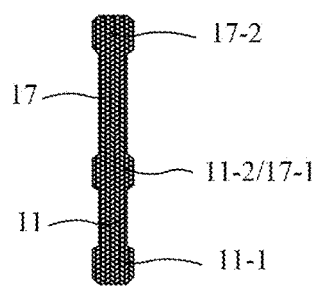

(4) A pattern of a second semiconductor layer is formed. In an exemplary embodiment, forming the pattern of the second semiconductor layer may include: sequentially depositing a fourth insulating thin film and a second semiconductor thin film on the substrate on which the aforementioned pattern is formed, and patterning the second semiconductor thin film through a patterning process to form a fourth insulating layer covering the substrate and the second semiconductor layer disposed on the fourth insulating layer, the second semiconductor layer of each sub-pixel include at least the first active layer 11 of the first transistor T1, the second active layer 12 of the second transistor T2, and the fourth active layer 14 of the fourth transistor T4 and the seventh active layer 17 of the seventh transistor T7, as shown in FIG. 19a and FIG. 19b, wherein FIG. 19b is a schematic plan view of the second semiconductor layer in FIG. 19a.

In an exemplary embodiment, the shapes of the first active layer 11 and the seventh active layer 17 may be a "1" shape, and the first active layer 11 and the seventh active layer 17 may be connected to each other as an integrated structure, which extends along a second direction Y. An overlapping region between the second scan signal line 32 and the first active layer 11 serves as a gate electrode of the first transistor T1. An overlapping region between the third scan signal line 33 and the seventh active layer 17 serves as a gate electrode of the seventh transistor T7.

In an exemplary embodiment, the shapes of the second active layer 12 and the fourth active layer 14 may be in a "1" shape, and the second active layer 12 and the fourth active layer 14 are sequentially disposed along a first direction X. An overlapping area between a first scan signal line 31 and a second active layer 12 serves as a gate electrode of the second transistor T2. An overlapping area between the second scan signal line 31 and the fourth active layer 14 serves as a gate electrode of the fourth transistor T4.

In an exemplary embodiment, the second region 11-2 of the first active layer 11 simultaneously serves as the first region 17-1 of the seventh active layer 17, the first region 11-1 of the first active layer 11 is separately disposed on a side of the second scan signal line 32 away from the third scan signal line 33, and the second region 17-2 of the seventh active layer 17 is separately disposed on a side of the third scan signal line 33 away from the second scan signal line 32.

In an exemplary embodiment, a first regions and second regions of the second active layer 12 and a fourth active layer 14 are disposed separately, a first region 12-1 of the second active layer 12 and a first region 14-1 of the fourth active layer 14 are located on a side of the first scan signal line 31 away from the second electrode plate 34, and a second region 12-2 of the second active layer 12 and a second region 14-2 of the fourth active layer 14 are located on a side of the first scan signal line 31 close to the second electrode plate 34.

In an exemplary embodiment, the second semiconductor layer may be made of oxides, that is, the first transistor T1, the second transistor T2, the fourth transistor T4 and the seventh transistor T7 are oxide thin film transistors.

Figure 20A:
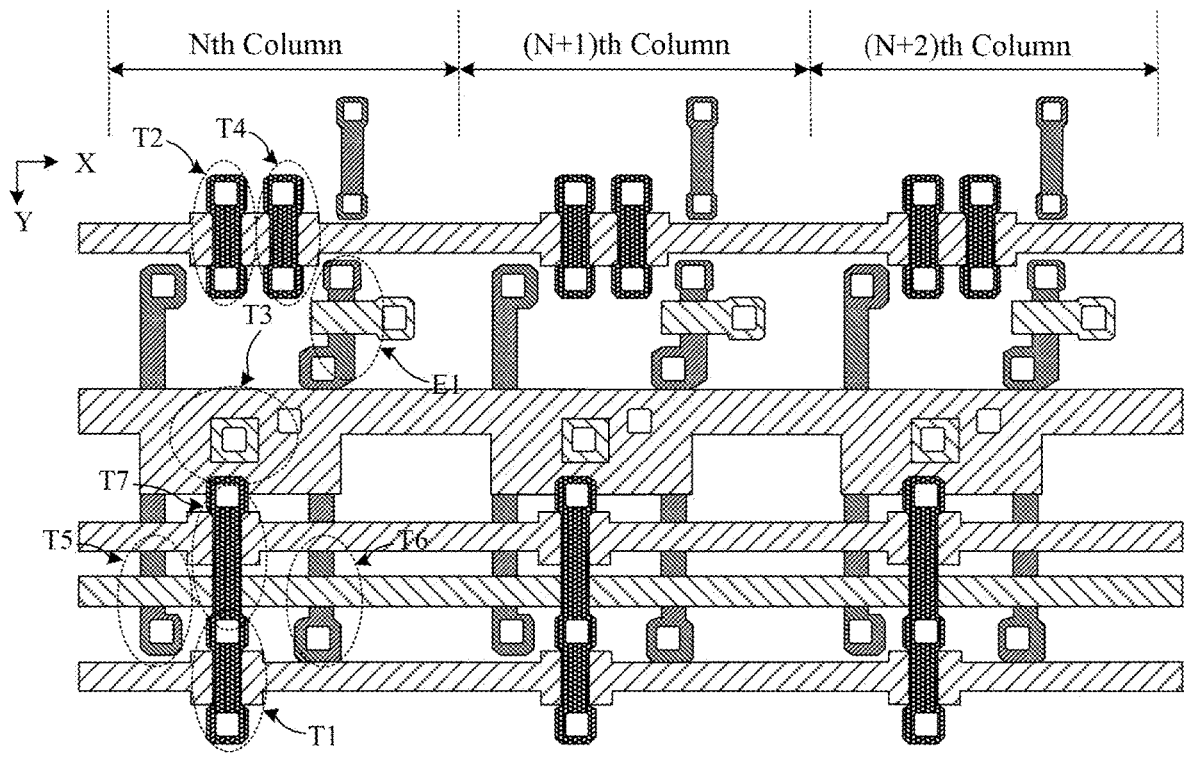
FIG. 20a and FIG. 20b are schematic diagrams obtained after a pattern of a fifth insulating layer is formed according to an embodiment of the present disclosure.
Figure 20B:
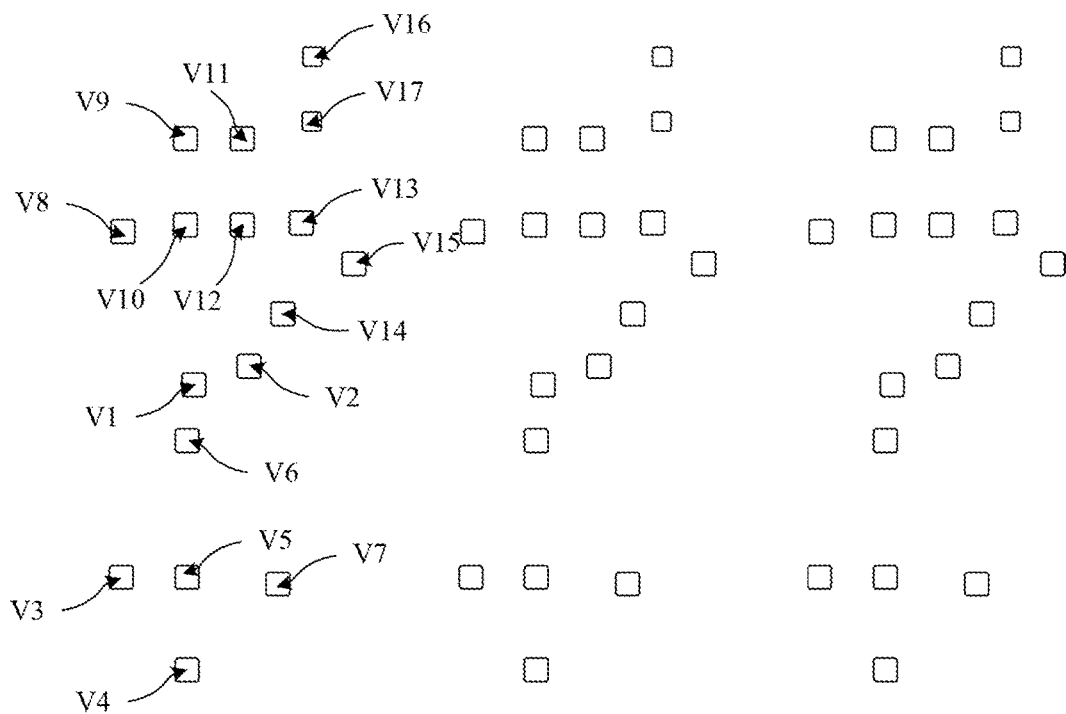

(5) A pattern of a fifth insulating layer is formed. In an exemplary embodiment, forming the pattern of the fifth insulating layer may include depositing a fifth insulating film on the substrate where the aforementioned patterns are formed, patterning the fifth insulating film by a patterning process to form a fifth insulating layer covering a second semiconductor layer, wherein the fifth insulating layer is provided with a plurality of vias, and the plurality of vias of each sub-pixel at least include vias from the first V1 to the seventeenth V17, as shown in FIG. 20a and FIG. 20b, wherein FIG. 20b is a schematic plan view of the plurality of vias in FIG. 20a.

In an exemplary embodiment, the first via V1 is located in the opening 36 of the second electrode plate 34. An orthographic projection of the first via V1 on the base substrate is located within a range of the orthographic projection of the opening 36 on the base substrate. The fifth insulating layer, the fourth insulating layer, and the third insulating layer in the first via V1 are etched off to expose a surface of the first electrode plate 23. The first via V1 is configured such that the second electrode of the seventh transistor T7 to be formed subsequently is connected to the first electrode plate 23 through the via.

In an exemplary embodiment, the second via V2 is located in a region where the second electrode plate 34 is located. An orthographic projection of the second via V2 on the base substrate is within a range of the orthographic projection of the second electrode plate 34 on the base substrate. The fifth insulating layer and the fourth insulating layer in the second via V2 are etched off to expose a surface of the second electrode plate 34. The second via V2 is configured such that the first power supply line to be formed subsequently is connected to the second electrode plate 34 through the via. In an exemplary embodiment, a second via V2 as power supply via may be plural, and the plurality of second vias V2 may be sequentially disposed along the second direction Y, thus increasing the connection reliability between the first power supply line and the second electrode plate 34.

In an exemplary embodiment, an orthographic projection of the third via V3 on the base substrate is located within a range of the orthographic projection of the fifth active layer on the base substrate. The fifth insulation layer, the fourth insulation layer, the third insulation layer, and the second insulation layer in the third via V3 are etched off to expose a surface of a first region of the fifth active layer. The third via V3 is configured such that the first power supply line to be formed subsequently is connected to the fifth active layer through the via.

In an exemplary embodiment, an orthographic projection of the fourth via V4 on the base substrate is located within a range of the orthographic projection of the first active layer on the base substrate. The fifth insulation layer, the fourth insulation layer, the third insulation layer, and the second insulation layer in the fourth via V4 are etched off to expose a surface of a first region of the first active layer. The fourth via V4 is disposed such that the initial signal line formed subsequently is connected to the first active layer through this via.

In an exemplary embodiment, an orthographic projection of the fifth via V5 on the base substrate is located within a range of the orthographic projection of the first active layer on the base substrate. The fifth insulation layer, the fourth insulation layer, the third insulation layer, and the second insulation layer in the fifth via V5 are etched off to expose a surface of a second region of the first active layer (i.e., a first region of the seventh active layer). The fifth via V5 is configured to allow a second electrode of the first transistor T1 (i.e., the first electrode of the seventh transistor T7) subsequently formed to be connected to the first active layer through the via V5.

In an exemplary embodiment, an orthographic projection of the sixth via V6 on the base substrate is located within a range of the orthographic projection of the seventh active layer on the base substrate. The fifth insulation layer, the fourth insulation layer, the third insulation layer, and the second insulation layer in the sixth via V6 are etched off to expose a surface of a second region of the seventh active layer. The sixth via V6 is configured to allow a second electrode of the seventh transistor T7 subsequently formed to be connected to the seventh active layer through the via V6.

In an exemplary embodiment, an orthographic projection of the seventh via V7 on the base substrate is located within a range of the orthographic projection of the sixth active layer on the base substrate. The fifth insulation layer, the fourth insulation layer, the third insulation layer, and the second insulation layer in the seventh via V7 are etched off to expose a surface of a second region of the sixth active layer. The seventh via V7 is configured such that the anode connection electrode formed subsequently is connected to the sixth active layer through the via V7.

In an exemplary embodiment, an orthographic projection of the eighth via V8 on the base substrate is located within a range of the orthographic projection of the third active layer on the base substrate. The fifth insulation layer, the fourth insulation layer, the third insulation layer, and the second insulation layer in the eighth via V8 are etched off to expose a surface of a second region of the third active layer. The eighth via V8 is configured to allow a first electrode of the second transistor T2 subsequently formed to be connected to the third active layer through the via V8.

In an exemplary embodiment, an orthographic projection of the ninth via V9 on the base substrate is located within a range of the orthographic projection of the second active layer on the base substrate. The fifth insulation layer, the fourth insulation layer, the third insulation layer, and the second insulation layer in the ninth via V9 are etched off to expose a surface of a first region of the second active layer. The ninth via V9 is configured to allow a first electrode of the second transistor T2 subsequently formed to be connected to the second active layer through the via V9

In an exemplary embodiment, an orthographic projection of the tenth via V10 on the base substrate is located within a range of the orthographic projection of the second active layer on the base substrate. The fifth insulation layer, the fourth insulation layer, the third insulation layer, and the second insulation layer in the tenth via V10 are etched off to expose a surface of a second region of the second active layer. The tenth via V10 is configured to allow a second electrode of the second transistor T2 subsequently formed to be connected to the second active layer through the via V10.

In an exemplary embodiment, an orthographic projection of the eleventh via V11 on the base substrate is located within a range of the orthographic projection of the fourth active layer on the base substrate. The fifth insulation layer, the fourth insulation layer, the third insulation layer, and the second insulation layer in the eleventh via V11 are etched off to expose a surface of a first region of the fourth active layer. The eleventh via V11 is configured to connect a first electrode of the fourth transistor T4 subsequently formed to the fourth active layer through the via V11.

In an exemplary embodiment, an orthographic projection of the twelfth via V12 on the base substrate is located within a range of the orthographic projection of the fourth active layer on the base substrate. The fifth insulation layer, the fourth insulation layer, the third insulation layer, and the second insulation layer in the twelfth via V12 are etched off to expose a surface of a second region of the fourth active layer. The twelfth via V12 is configured to connect a second electrode of the fourth transistor T4 subsequently formed to the fourth active layer through the via V12.

In an exemplary embodiment, an orthographic projection of the thirteenth via V13 on the base substrate is located within a range of the orthographic projection of the NMOS active layer on the base substrate. The fifth insulation layer, the fourth insulation layer, the third insulation layer, and the second insulation layer in the thirteenth via V13 are etched off to expose a surface of a first region of the NMOS active layer. The thirteenth via V13 is configured to connect a first electrode of the NMOS transistor subsequently formed to the NMOS active layer through the via V13.

In an exemplary embodiment, an orthographic projection of the fourteenth via V14 on the base substrate is located within a range of the orthographic projection of the active layer of NMOS on the base substrate. The fifth insulation layer, the fourth insulation layer, the third insulation layer, and the second insulation layer in the fourteenth via V14 are etched off to expose a surface of a second region of the NMOS active layer. The fourteenth via V14 is configured to allow a second electrode of the NMOS transistor subsequently formed to be connected to the active layer of the NMOS through the via V14.

In an exemplary embodiment, an orthographic projection of the fifteenth via V15 on the base substrate is located within a range of the orthographic projection of a gate electrode 22 of the NMOS on the base substrate. The fifth insulation layer, the fourth insulation layer and the third insulation layer in the fifteenth via V15 are etched off to expose a surface of the gate electrode 22 of the NMOS. The fifteenth via V15 is configured to connect a first electrode of the NMOS transistor subsequently formed to the gate electrode 22 of the NMOS through the via V15.

In an exemplary embodiment, an orthographic projection of the sixteenth via V16 on the base substrate is located within a range of the orthographic projection of a first connection electrode 19 on the base substrate. The fifth insulation layer, the fourth insulation layer, the third insulation layer, and the second insulation layer in the sixteenth via V16 are etched off to expose a surface of the first connection electrode 19. The sixteenth via V16 is disposed such that the data connection electrode formed subsequently is connected to the first connection electrode 19 through this via.

In an exemplary embodiment, an orthographic projection of the seventeenth via V17 on the base substrate is located within a range of the orthographic projection of a first connection electrode 19 on the base substrate. The fifth insulation layer, the fourth insulation layer, the third insulation layer, and the second insulation layer in the seventeenth via V17 are etched off to expose a surface of the first connection electrode 19. The seventeenth via V17 is configured such that a first electrode of the fourth transistor T4 (i.e., a first electrode of the NMOS transistor) that is to be formed subsequently is connected to the first connection electrode 19 through the via V17.

Figure 21A:
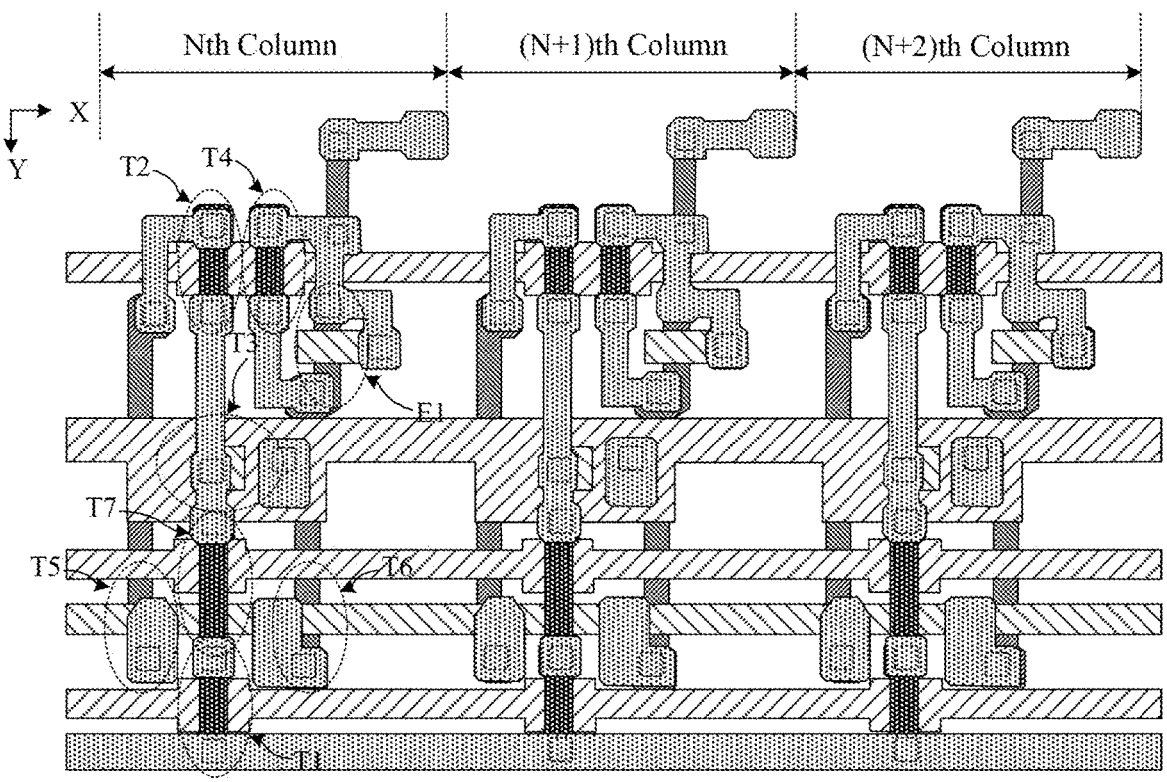
FIG. 21a and FIG. 21b are schematic diagrams obtained after a pattern of a third conductive layer is formed according to an embodiment of the present disclosure.
Figure 21B:
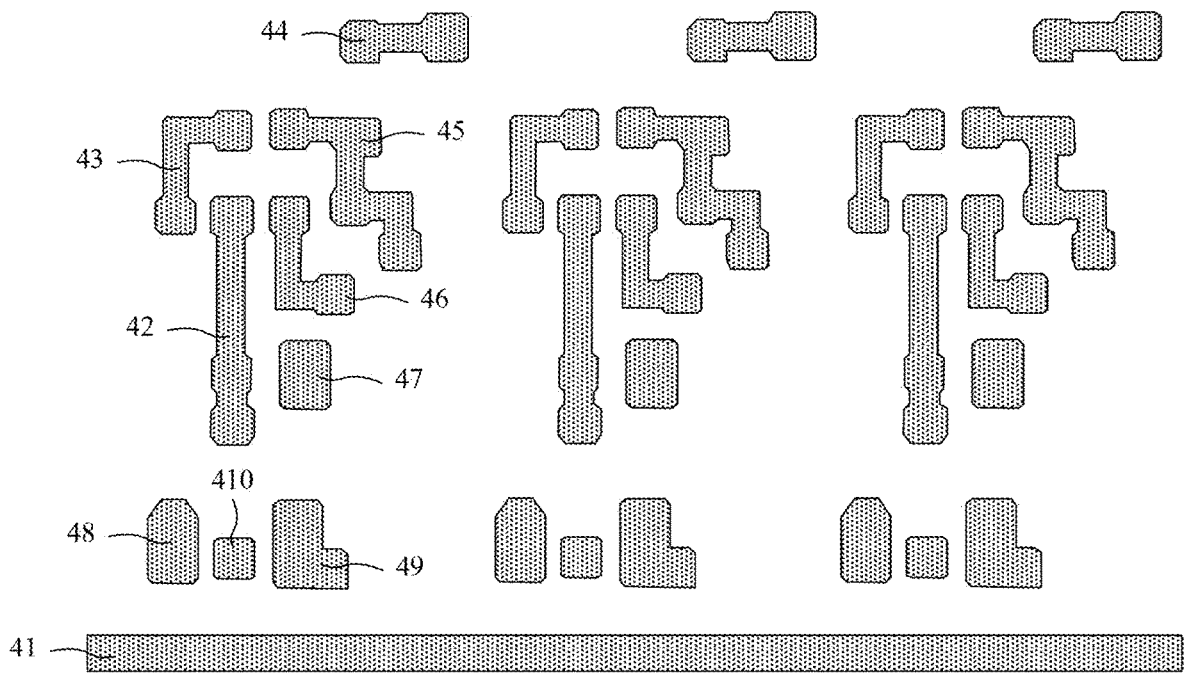

(6) A pattern of a third conductive layer is formed. In an exemplary embodiment, forming a pattern of a third conductive layer may include: depositing a third metal thin film on the base substrate, on which the aforementioned patterns are formed, and patterning the third metal thin film through a patterning process to form a pattern of the third conductive layer disposed on the fifth insulating layer. The pattern of the third conductive layer at least includes: an initial signal line 41, and a second connection electrode 42, a third connection electrode 43, a fourth connection electrode 44, a fifth connection electrode 45, a sixth connection electrode 46, a seventh connection electrode 47, an eighth connection electrode 48, an ninth connection electrode 49 and an tenth connection electrode 410 which are disposed in each sub-pixel, as shown in FIG. 21a and FIG. 21b, wherein FIG. 21b is a schematic plan view of the third conductive layer in FIG. 21a. In an exemplary embodiment, the third conductive layer may be called a first metal source-drain layer (SD1).

In an exemplary embodiment, an initial signal line 41 may extend in a first direction X, and the initial signal line 41 is connected to a first region of the first active layer through a fourth via V4 in each sub-pixel, such that the initial signal line 41 inputs an initial voltage to a first electrode of the first transistor T1.

In an exemplary embodiment, a second connection electrode 42 may be a straight line segment extending in the second direction Y, A first terminal of a side of the second connection electrode 42 close to the initial signal line 41 is connected to a second region of the seventh active layer through a sixth via V6, and a second terminal of a side of the second connection electrode 42 away from the initial signal line 41 is connected to a second region of the second active layer through a tenth via V10. The region between the first terminal and the second terminal of the second connection electrode 42 is connected to the first electrode plate 23 through a first via V1 so that a first electrode plate 23 (a gate electrode of the third transistor T3), a second electrode of the second transistor T2 and a second electrode of the seventh transistor T7 have the same potential (a first node N1). In an exemplary embodiment, the second connection electrode 42 may serve as the second electrode of the second transistor T2 and the second electrode of the seventh transistor T7.

In an exemplary embodiment, the third connection electrode 43 may be a polygonal line segment, one terminal of the third connection electrode 43 is connected to a second region of the third active layer through an eighth via V8, and the other terminal of the third connection electrode 43 is connected to a first region of the second active layer through a ninth via V9, so that a first electrode of the second transistor T2 and a second electrode of the third transistor T2 have the same potential (a third node N3). In an exemplary embodiment, the third connection electrode 43 may serve as a first electrode of the second transistor T2 and a second electrode of the third transistor T2.

In an exemplary embodiment, the fourth connection electrode 44 may be a straight line segment extending along a first direction X and is connected to a first connection electrode 19 through a sixteenth via V16. In an exemplary embodiment, the fourth connection electrode 44 may serve as a data connection electrode, and is configured to be connected to a data signal line formed subsequently.

In an exemplary embodiment, the fifth connection electrode 45 may be a polygonal line segment, a first terminal of the fifth connection electrode 45 is connected to a first region of the fourth active layer through an eleventh via V11, a second terminal of the fifth connection electrode 45 is connected to the first connection electrode 19 through a seventeenth via V17, a third end of the fifth connection electrode 45 is connected to a first region of the active layer of the NMOS through a thirteenth via V13, and a fourth terminal of the fifth connection electrode 45 is connected to the gate electrode 22 of NMOS through the fifteenth via V15, so that a first electrode of the fourth transistor T4, a gate electrode 22 of the NMOS transistor E1 and a first electrode of the NMOS transistor E1 have the same potential, and the data signal line formed subsequently can input a data voltage to the fourth transistor T4 and the NMOS transistor E1 through the fourth connection electrode 44 and the first connection electrode 19. In an exemplary embodiment, the fifth connection electrode 45 may serve as a first electrode of the fourth transistor T4 and a first electrode of the NMOS transistor E1, and the gate electrode and the first electrode of the NMOS transistor E1 are made be in short circuit through the fifth connection electrode 45 to form a one-way conductive structure.

In an exemplary embodiment, the sixth connection electrode 46 may be a polygonal line segment, one terminal of the sixth connection electrode 46 is connected to a second region of the fourth active layer through a twelfth via V12, and the other terminal of the sixth connection electrode 46 is connected to the second region of the NMOS active layer through a fourteenth via V14. Since the second region of the NMOS active layer, the first region of the third active layer and the first region of the sixth active layer are connected to each other as an integrated structure, the sixth connection electrode 46 makes a first electrode of the third transistor T3, a second electrode of the fourth transistor T4, a second electrode of the NMOS transistor E1 and a first electrode of the sixth transistor T6 have the same potential (a second node N2). In an exemplary embodiment, the sixth connection electrode 46 may serve as a first electrode of the third transistor T3, a second electrode of the fourth transistor T4, a second electrode of the NMOS transistor E1 and a first electrode of the sixth transistor T6.

In an exemplary embodiment, the seventh connection electrode 47 may be rectangular and is connected to the second electrode plate 34 through the second via V2. In an exemplary embodiment, the seventh connection electrode 47 may serve as a power supply connection electrode, and is configured to be connected to a first power supply line formed subsequently.

In an exemplary embodiment, the eighth connection electrode 48 may be rectangular, and is connected to a first region of a fifth active layer through a third via V3. In an exemplary embodiment, the eighth connection electrode 48 may serve as a first electrode of the fifth transistor T5, and is configured to be connected to a first power supply line formed subsequently.

In an exemplary embodiment, the ninth connection electrode 49 may be rectangular, and is connected to a second region of the sixth active layer through the seventh via V7. In an exemplary embodiment, the ninth connection electrode 49 may serve as a second electrode (a fourth node N4) of the sixth transistor T6, and is configured to be connected to an anode connection electrode formed subsequently.

In an exemplary embodiment, the tenth connection electrode 410 may be rectangular, and is connected to a second region of the first active layer (i.e., a first region of the seventh active layer) through the fifth via V5, so that a second electrode of the first transistor T1 and a first electrode of the seventh transistor T7 have a same potential (a fifth node N5). In an exemplary embodiment, the tenth connection electrode 410 may serve as a second electrode of the first transistor T1 and a first electrode of the seventh transistor T7.

Figure 22A:
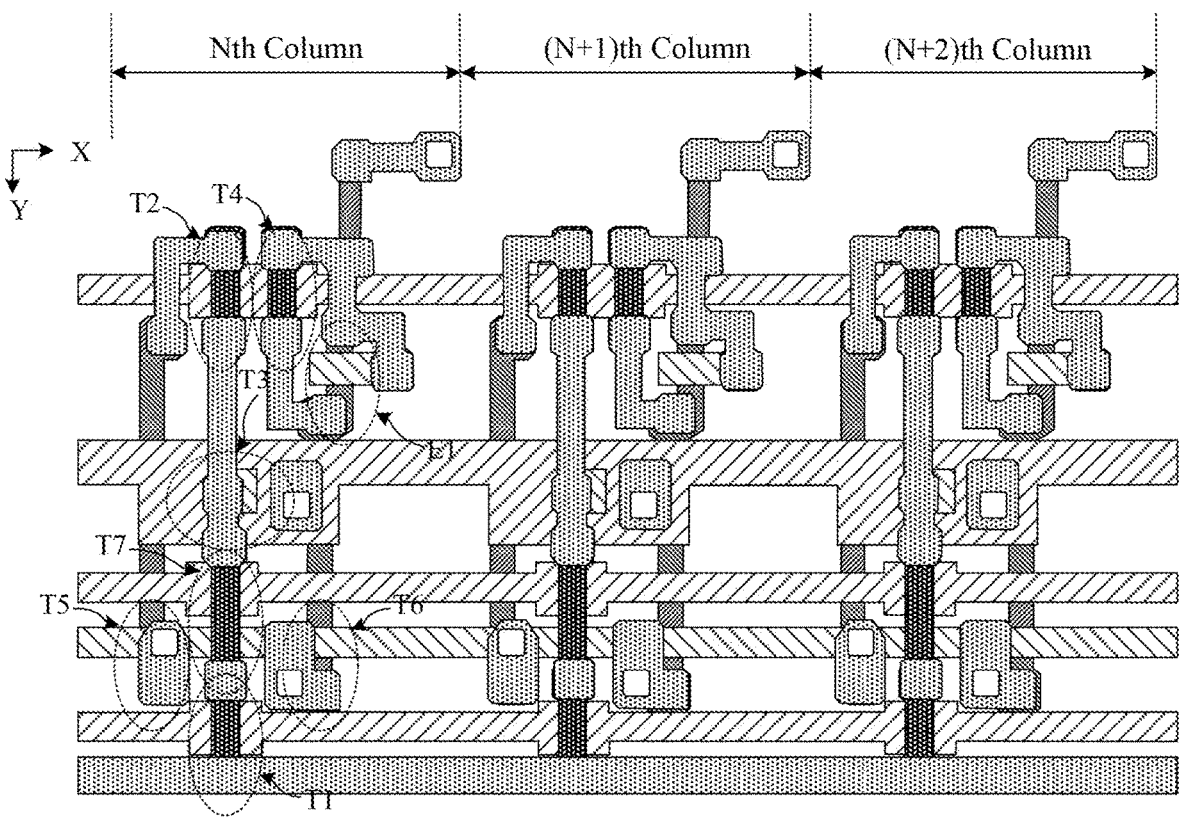
FIG. 22a and FIG. 22b are schematic diagrams obtained after a pattern of a sixth insulating layer is formed according to an embodiment of the present disclosure.
Figure 22B:
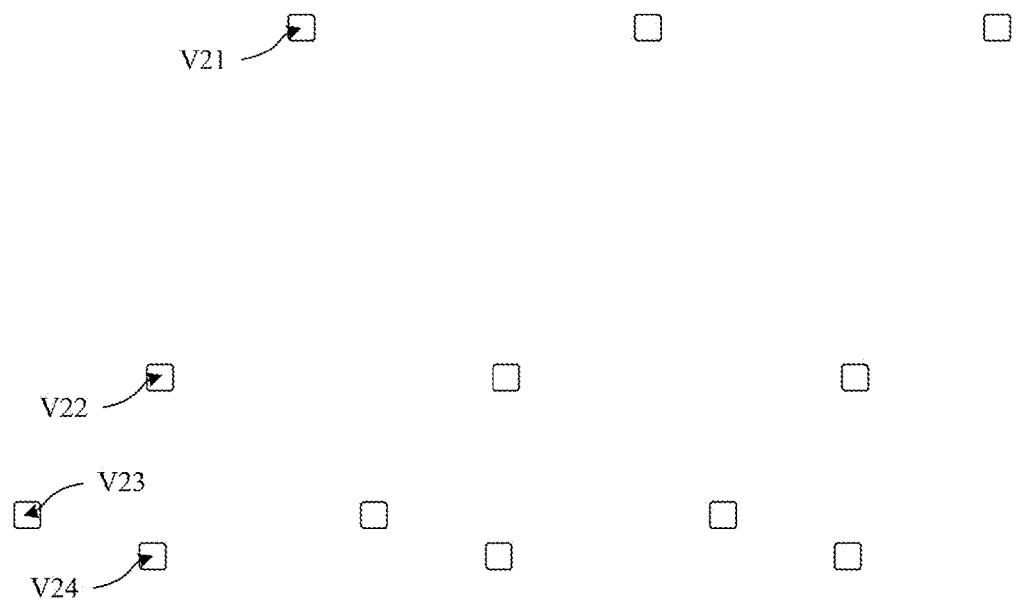

(7) A pattern of a sixth insulating layer is formed. In an exemplary embodiment, forming the pattern of the sixth insulating layer may include depositing a sixth insulating film on the substrate where the aforementioned patterns are formed, patterning the sixth insulating film by a patterning process to form a sixth insulating layer covering a third conductive layer, wherein the sixth insulating layer is provided with a plurality of vias, and the plurality of vias of each sub-pixel at least include vias from the twenty-first V21 to the twenty-fourth V24, as shown in FIG. 22a and FIG. 22b, wherein FIG. 22b is a schematic plan view of the plurality of vias in FIG. 22a.

In an exemplary embodiment, an orthographic projection of the twenty-first via V21 on the base substrate is located within the range of the orthographic projection of a fourth connection electrode 44, the sixth insulating layer in the twenty-first via V21 is etched away to expose a surface of the fourth connection electrode 44, and the twenty-first via V21 is configured such that a data signal line formed subsequently is connected to the fourth connection electrode 44 through the twenty-first via V21.

In an exemplary embodiment, an orthographic projection of the twenty-first via V21 on the base substrate is located within the range of the orthographic projection of a fourth connection electrode 44, the sixth insulating layer in the twenty-first via V21 is etched away to expose a surface of the fourth connection electrode 44, and the twenty-first via V21 is configured such that a data signal line formed subsequently is connected to the fourth connection electrode 44 through the twenty-first via V21.

In an exemplary embodiment, an orthographic projection of the twenty-second via 22 on the base substrate is located within the range of the orthographic projection of a seventh connection electrode 47, the sixth insulating layer in the twenty-second via V22 is etched away to expose a surface of the seventh connection electrode 47, and the twenty-second via V22 is configured such that a first power supply line formed subsequently is connected to the seventh connection electrode 47 through the twenty-first via V22.

In an exemplary embodiment, an orthographic projection of the twenty-third via 23 on the base substrate is located within the range of the orthographic projection of an eighth connection electrode 48, the sixth insulating layer in the twenty-third via V23 is etched away to expose a surface of the eighth connection electrode 48, and the twenty-third via V23 is configured such that a data signal line formed subsequently is connected to the eighth connection electrode 48 through the twenty-third via V23.

In an exemplary embodiment, an orthographic projection of the twenty-fourth via 24 on the base substrate is located within the range of the orthographic projection of a ninth connection electrode 49, the sixth insulating layer in the twenty-fourth via V24 is etched away to expose a surface of the ninth connection electrode 49, and the twenty-fourth via V24 is configured such that an anode connection electrode formed subsequently is connected to the ninth connection electrode 49 through the twenty-fourth via V24.

Figure 23A:
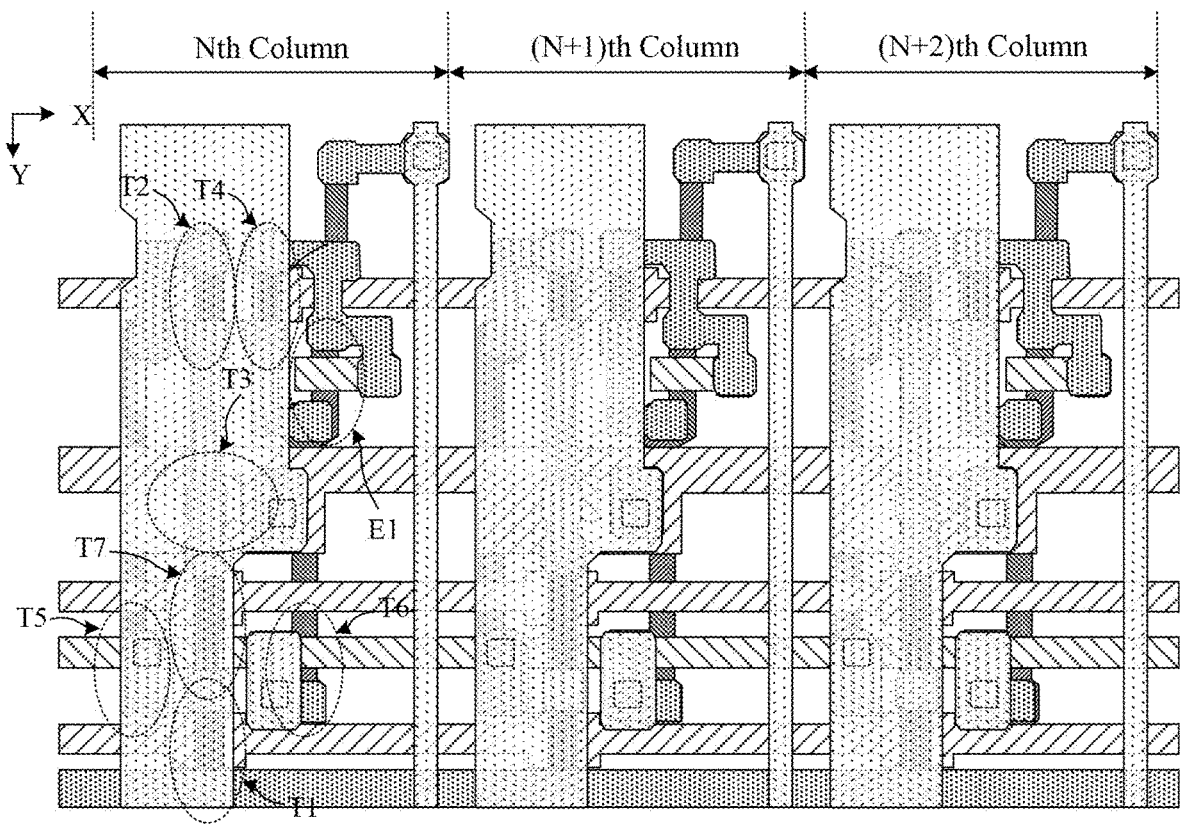
FIG. 23a and FIG. 23b are schematic diagrams obtained after a pattern of a fourth conductive layer is formed according to an embodiment of the present disclosure.
Figure 23B:
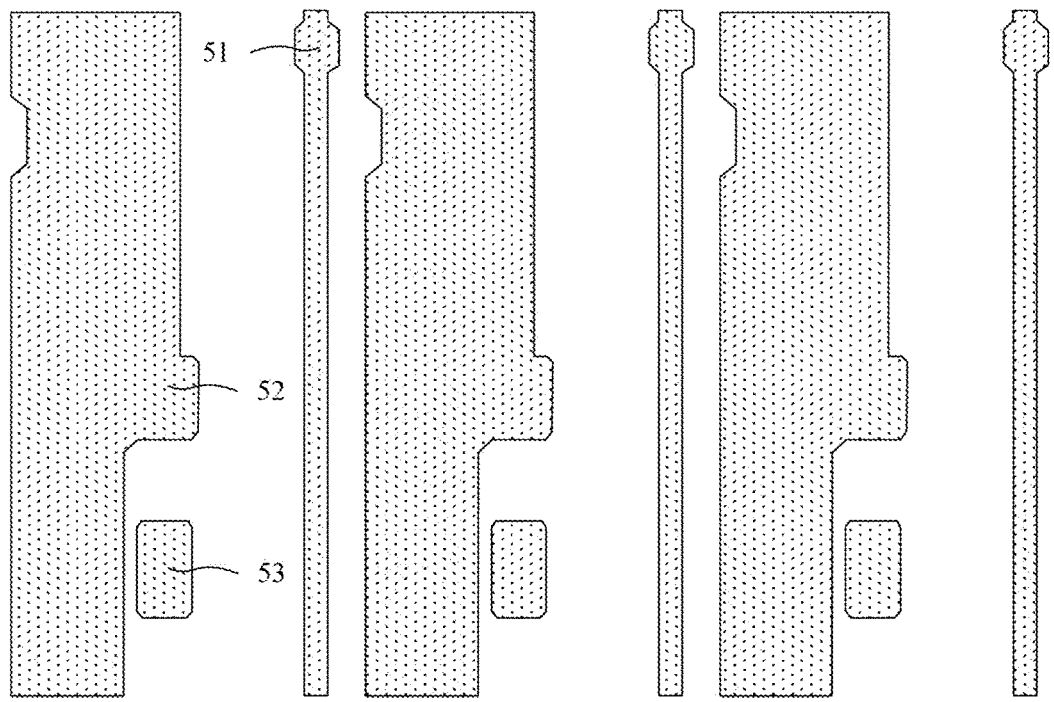

(8) A pattern of a fourth conductive layer is formed. In an exemplary embodiment, forming a pattern of a fourth conductive layer may include: depositing a fourth metal thin film on the base substrate, on which the aforementioned patterns are formed, and patterning the fourth metal thin film through a patterning process to form a fourth conductive layer disposed on the sixth insulating layer. The fourth conductive layer at least includes data signal line 51, a first power supply line 52, and an anode connection electrode 53 which is disposed in each sub-pixel, as shown in FIG. 23*a* and FIG. 23*b*, and FIG. 23*b* is a schematic plan view of the fourth conductive layer in FIG. 23*a*. In an exemplary embodiment, the fourth conductive layer may be called a second metal source-drain layer (SD2).

In an exemplary embodiment, the data signal line 51 may extend in the second direction Y, and the data signal line 51 is connected to the fourth connection electrode 44 through the twenty-first via V21. Since the fourth connection electrode 44 is connected to the first connection electrode 19 through a via, the first connection electrode 19 is connected to the fifth connection electrode 45 through a via, and the fifth connection electrode 45 serves as a first electrode of the fourth transistor T4 and a first electrode of the NMOS transistor E1 simultaneously, the data signal line 51 can be connected to the first electrode of the fourth transistor T4 and the first electrode of the NMOS transistor E1 simultaneously through the fourth connection electrode 44 and the first connection electrode 19, and the data voltage output by the data signal line 51 is provided to the second node N2 through the fourth transistor T4 and the NMOS transistor E1 in the data writing stage.

In an exemplary embodiment, the first power supply line 52 may extend integrally in a second direction Y. The first power supply line 52 is connected to the seventh connection electrode 47 through the twenty-second via V22 on the one hand, and is connected to the eighth connection electrode 48 through the twenty-third via V23 on the other hand. Since the seventh connection electrode 47 is connected to a second electrode plate 34 through a via and the eighth connection electrode 48 is connected to the an electrode of the fifth transistor T5 through a via, a second electrode plate 34 of the storage capacitor and a first electrode of the fifth transistor T5 are made to have the same potential.

In an exemplary embodiment, the anode connection electrode 53 in each sub-pixel may be rectangular. The anode connection electrode 53 is connected to a ninth connection electrode 49 through a twenty-fourth via V24, and is configured to be connected to an anode formed subsequently. Since the ninth connection electrode 49 is connected to the second electrode of the sixth transistor T6 through a via, the anode formed subsequently is made to be connected to the second electrode of the sixth transistor T6, thus achieving that the pixel driving circuit can drive the light emitting device to emit light.

It can be seen from the structure and preparation process of the pixel driving circuit described above, according to a pixel driving circuit provided by the present disclosure, by forming an NMOS transistor having a one-way conductive performance while forming a plurality of transistors, the data voltage output by the data signal line can be provided to the second node through the NMOS transistor in the data writing stage, and the data voltage can be made to be written quickly in the writing stage, which can compensate for the problems of low on-state current and mobility of the fourth transistor T4, avoid insufficient charging of the storage capacitor when the signal is written, and improve the display effect. At the same time, the voltage of the second node N2 can be stabilized in the light emitting stage, avoiding the leakage current of the driving sub-circuit. The preparation process in the present disclosure may be compatible well with an existing preparation process, which is simple in process implementation, easy to implement, high in production efficiency and yield, and low in production cost.

The structure of the aforementioned pixel driving circuit shown in the present disclosure and the preparing process thereof are merely an exemplary description. In an exemplary implementation, the corresponding structures may be altered and the patterning processes may be added or reduced according to actual needs. For example, a second NMOS transistor may be disposed in the compensation sub-circuit and a third NMOS transistor may be disposed in the reset sub-circuit. For another example, a one-way conducive PN junction diode or the like may be disposed in the writing sub-circuit, the compensation sub-circuit, and/or the reset sub-circuit, and the present disclosure is not limited herein.

The present disclosure further provides a preparation method for a display substrate, which is configured to prepare the aforementioned display substrate. In an exemplary implementation, the display substrate includes a plurality of sub-pixels, and the driving method may include: step S1 and step S2.

Step S1 includes forming a driving circuit layer in at least one sub-pixel, the driving circuit layer including a pixel driving circuit.

Step S2 includes forming a light emitting structure layer on the driving circuit layer, wherein the light emitting structure layer includes a light emitting device connected to the pixel driving circuit.

The reset sub-circuit is respectively connected to a second scan signal line, an initial signal line, a first node and a fourth node, and is configured to provide an initial voltage output by the initial signal line to the first node and the fourth node under the control of the second scan signal line.

The writing sub-circuit is respectively connected to a first scan signal line, a data signal line and the second node, and is configured to provide a data voltage output by the data signal line to the second node under the control of the first scan signal line.

The driving sub-circuit is respectively connected with the first node, the second node, and a third node, and is configured to provide a voltage of the second node to the third node under the control of the first node.

The compensation sub-circuit is respectively connected with the first scan signal line, the first node and the third node, and is configured to provide a voltage of the third node to the first node under the control of the first scan signal line to compensate the first node until a voltage of the first node satisfies a threshold condition.

The energy storage sub-circuit is respectively connected with a first power supply line and the first node, and is configured to store a voltage difference between a first power supply voltage output by the first power supply line and the first node.

The light emitting control sub-circuit is respectively connected with a light emitting control line, the first power supply line, the second node, the third node and the fourth node, and is configured to provide a first power supply voltage output by the first power supply line to the second node and a voltage of the third node to the fourth node under the control of the light emitting control line.

At least one of the reset sub-circuit, the compensation sub-circuit, and the writing sub-circuit includes an oxide transistor and a one-way conductive device.

The present disclosure further provides a display device, including the pixel driving circuit in the aforementioned embodiments. The display device may be any product or component with a display function, such as a mobile phone, a tablet computer, a television, a display, a laptop computer, a digital photo frame, or a navigator.

Although the implementations disclosed in the present disclosure are as above, the described contents are only implementation adopted for convenience of understanding the present disclosure and are not intended to limit the present disclosure. Those skilled in the art may make any modification and change to the implementation form and details without departing from the essence and scope of the present disclosure. However, the scope of patent protection of the present disclosure should still be subject to the scope defined by the appended claims.

The invention claimed is:

1. A display substrate, comprising a plurality of sub-pixels, wherein at least one sub-pixel comprises a driving circuit layer and a light emitting structure layer disposed on the driving circuit layer; the driving circuit layer comprises a pixel driving circuit, and the light emitting structure layer comprises a light emitting device connected with the pixel driving circuit; the pixel driving circuit comprises a reset sub-circuit, a writing sub-circuit, a driving sub-circuit, a compensation sub-circuit, an energy storage sub-circuit and a light emitting control sub-circuit;

the reset sub-circuit is respectively connected to a second scan signal line, an initial signal line, a first node and a fourth node, and is configured to provide an initial voltage output by the initial signal line to the first node and the fourth node under the control of the second scan signal line;

the writing sub-circuit is respectively connected to a first scan signal line, a data signal line and the second node, and is configured to provide a data voltage output by the data signal line to the second node under the control of the first scan signal line;

the driving sub-circuit is respectively connected with the first node, the second node, and a third node, and is configured to provide a voltage of the second node to the third node under the control of the first node;

the compensation sub-circuit is respectively connected with the first scan signal line, the first node and the third node, and is configured to provide a voltage of the third node to the first node under the control of the first scan signal line to compensate the first node until a voltage of the first node satisfies a threshold condition;

the energy storage sub-circuit is respectively connected with a first power supply line and the first node, and is configured to store a voltage difference between a first power supply voltage output by the first power supply line and the first node;

the light emitting control sub-circuit is respectively connected with a light emitting control line, the first power supply line, the second node, the third node and the fourth node, and is configured to provide a first power supply voltage output by the first power supply line to the second node and a voltage of the third node to the fourth node under the control of the light emitting control line; and at least one of the reset sub-circuit, the compensation sub-circuit and the writing sub-circuit comprises an oxide transistor and a one-way conductive device.

2. The display substrate according to claim 1, wherein the writing sub-circuit comprises a fourth transistor and a first diode as a one-way conductive device, or the writing sub-circuit comprises a fourth transistor and a first triode as a one-way conductive device; the fourth transistor is an oxide transistor;

a control electrode of the fourth transistor is connected to a first scan signal line, a first electrode of the fourth transistor is connected to the data signal line, and a second electrode of the fourth transistor is connected to a second node; and a positive electrode of the first diode is connected with the data signal line, and a negative electrode of the first diode is connected with the second node; and a control electrode and a first electrode of the first triode are both connected to the data signal line, and a second electrode of the first triode is connected to the second node N2.

3. The display substrate according to claim 2, wherein the driving circuit layer comprises a first semiconductor layer, a first conductive layer, a second semiconductor layer, a second semiconductor layer, a third conductive layer, and a fourth conductive layer that are sequentially disposed on a base substrate, the first semiconductor layer comprises active layers of multiple poly-silicon transistors, the first conductive layer comprises gate electrodes of the multiple poly-silicon transistors and a first electrode plate of a storage capacitor, the second semiconductor layer comprises gate electrodes of a plurality of oxide transistors and a second electrode plate of the storage capacitor, the second semiconductor layer comprises active layers of multiple oxide transistors, the third conductive layer comprises an initial signal line and a plurality of connection electrodes, and the fourth conductive layer comprises a data signal line and a first power supply line.

4. A display device, comprising the display substrate according to claim 2.

5. The display substrate according to claim 1, wherein the writing sub-circuit comprises a PMOS transistor and an NMOS transistor;

a control electrode of the PMOS transistor is connected with the first scan signal line, a first electrode is connected with the data signal line, and a second electrode is connected with the second node; and a control electrode of the NMOS transistor is connected with the first scan signal line, a first electrode is connected with the first power supply line, and a second electrode is connected with the second node.

6. The display substrate according to claim 5, wherein the driving circuit layer comprises a first semiconductor layer, a first conductive layer, a second semiconductor layer, a second semiconductor layer, a third conductive layer, and a fourth conductive layer that are sequentially disposed on a base substrate, the first semiconductor layer comprises active layers of multiple poly-silicon transistors, the first conductive layer comprises gate electrodes of the multiple poly-silicon transistors and a first electrode plate of a storage capacitor, the second semiconductor layer comprises gate electrodes of a plurality of oxide transistors and a second electrode plate of the storage capacitor, the second semiconductor layer comprises active layers of multiple oxide transistors, the third conductive layer comprises an initial signal line and a plurality of connection electrodes, and the fourth conductive layer comprises a data signal line and a first power supply line.

7. A display device, comprising the display substrate according to claim 5.

8. The display substrate according to claim 1, wherein the compensation sub-circuit comprises a second transistor and a second diode as a one-way conductive device, or the compensation sub-circuit comprises a second transistor and a second triode as a one-way conductive device; the second transistor is an oxide transistor;
- a control electrode of the second transistor is connected with the first scan signal line, a first electrode is connected with the third node, and a second electrode is connected with the first node; and
- a positive electrode of the second diode is connected with the third node, and a negative electrode is connected with the first node; and a control electrode and a first electrode of the second triode are both connected with the third node, and a second electrode is connected with the first node.

9. The display substrate according to claim 8, wherein
the driving circuit layer comprises a first semiconductor layer, a first conductive layer, a second semiconductor layer, a second semiconductor layer, a third conductive layer, and a fourth conductive layer that are sequentially disposed on a base substrate,
the first semiconductor layer comprises active layers of multiple poly-silicon transistors,
the first conductive layer comprises gate electrodes of the multiple poly-silicon transistors and a first electrode plate of a storage capacitor,
the second semiconductor layer comprises gate electrodes of a plurality of oxide transistors and a second electrode plate of the storage capacitor,
the second semiconductor layer comprises active layers of multiple oxide transistors,
the third conductive layer comprises an initial signal line and a plurality of connection electrodes, and
the fourth conductive layer comprises a data signal line and a first power supply line.

10. The display substrate according to claim 1, wherein the reset sub-circuit comprises a first transistor, a seventh transistor, and a third diode as a one-way conductive device, or the reset sub-circuit comprises a first transistor, a seventh transistor, and a third triode as a one-way conductive device; the first transistor and the seventh transistor are oxide transistors;
- a control electrode of the first transistor is connected with the second scan signal line, a first electrode is connected with the initial signal line, and the second electrode is connected with a fifth node; a control electrode of the seventh transistor is connected to the second scan signal line, a first electrode is connected to the fifth node, and a second electrode is connected to the first node; and
- a positive electrode of the third diode is connected with the fifth node, and a negative electrode is connected with the first node; and a control electrode and a first electrode of the third triode are both connected to the fifth node, and a second electrode is connected to the first node N1.

11. The display substrate according to claim 1, wherein
the driving circuit layer comprises a first semiconductor layer, a first conductive layer, a second semiconductor layer, a second semiconductor layer, a third conductive layer, and a fourth conductive layer that are sequentially disposed on a base substrate,
the first semiconductor layer comprises active layers of multiple poly-silicon transistors,
the first conductive layer comprises gate electrodes of the multiple poly-silicon transistors and a first electrode plate of a storage capacitor,
the second semiconductor layer comprises gate electrodes of a plurality of oxide transistors and a second electrode plate of the storage capacitor,
the second semiconductor layer comprises active layers of multiple oxide transistors,
the third conductive layer comprises an initial signal line and a plurality of connection electrodes, and
the fourth conductive layer comprises a data signal line and a first power supply line.

12. The display substrate according to claim 11, wherein
the first semiconductor layer comprises an active layer of a third transistor, an active layer of a fifth transistor, an active layer of a sixth transistor, an active layer of an NMOS transistor, and a first connection electrode;
the first conductive layer comprises a gate electrode of a third transistor, a gate electrode of a fifth transistor, a gate electrode of a sixth transistor and a gate electrode of an NMOS transistor as a first electrode plate;
the second semiconductor layer comprises an active layer of a first transistor, an active layer of a second transistor, an active layer of a fourth transistor, and an active layer of a seventh transistor, a second region of the active layer of the first transistor being connected to a first region of the active layer of the seventh transistor; and
the second semiconductor layer comprises a second electrode plate, a gate electrode of a first transistor, a gate electrode of a second transistor, a gate electrode of a fourth transistor, and a gate electrode of a seventh transistor.

13. The display substrate according to claim 12, wherein
the plurality of connection electrodes comprise a second connection electrode and a third connection electrode,
the initial signal line is connected with a first region of the active layer of the first transistor through a via,
the second connection electrode is respectively connected with a second region of an active layer of the seventh transistor, a second region of an active layer of the second transistor and the first electrode plate through a via, and
the third connection electrode is respectively connected to a second region of an active layer of the third transistor and a first region of an active layer of the second transistor through a via.

14. The display substrate according to claim 13, wherein
the plurality of connection electrodes further comprise a fourth connection electrode, a fifth connection electrode and a sixth connection electrode,
the fourth connection electrode is connected with the first connection electrode through a via,
the fifth connection electrode is respectively connected with the first connection electrode, a first region of an active layer of the fourth transistor, a first region of an active layer of the NMOS transistor and a gate electrode of the NMOS transistor through a via, and
the sixth connection electrode is respectively connected to a second region of the active layer of the fourth transistor and a second region of the active layer of the NMOS transistor through a via.

15. The display substrate according to claim 14, wherein a data signal line of the fourth conductive layer is connected to the fourth connection electrode through a via.

16. The display substrate according to claim 12, wherein the plurality of connection electrodes comprise an seventh connection electrode connected to the second electrode plate through a via, and a first power supply line of the fourth conductive layer is connected with the seventh connection electrode through a via.

17. The display substrate according to claim 12, wherein the plurality of connection electrodes comprise an eighth connection electrode connected to a first region of an active layer of the fifth transistor through a via, and a first power supply line of the fourth conductive layer is connected with the eighth connection electrode through a via.

18. The display substrate according to claim 12, wherein the plurality of connection electrodes comprise a ninth connection electrode connected to a second region of an active layer of the sixth transistor through a via, and the fourth conductive layer further comprises an anode connection electrode connected to the eighth connection electrode through a via.

19. A display device, comprising the display substrate according to claim 1.

20. A preparation method for a display substrate, the display substrate comprising a plurality of sub-pixels; the preparation method comprises:
- a driving circuit layer is formed in at least one sub-pixel, and the driving circuit layer comprises a pixel driving circuit;
- a light emitting structure layer is formed on the driving circuit layer, and the light emitting structure layer comprises a light emitting device connected to the pixel driving circuit;
- the pixel driving circuit comprises a reset sub-circuit, a writing sub-circuit, a driving sub-circuit, a compensation sub-circuit, an energy storage sub-circuit and a light emitting control sub-circuit;
- the reset sub-circuit is respectively connected to a second scan signal line, an initial signal line, a first node and a fourth node, and is configured to provide an initial voltage output by the initial signal line to the first node and the fourth node under the control of the second scan signal line;
- the writing sub-circuit is respectively connected to a first scan signal line, a data signal line and the second node, and is configured to provide a data voltage output by the data signal line to the second node under the control of the first scan signal line;
- the driving sub-circuit is respectively connected with the first node, the second node, and a third node, and is configured to provide a voltage of the second node to the third node under the control of the first node;
- the compensation sub-circuit is respectively connected with the first scan signal line, the first node and the third node, and is configured to provide a voltage of the third node to the first node under the control of the first scan signal line to compensate the first node until a voltage of the first node meets a threshold condition;
- the energy storage sub-circuit is respectively connected with a first power supply line and the first node, and is configured to store a voltage difference between a first power supply voltage output by the first power supply line and the first node;
- the light emitting control sub-circuit is respectively connected with a light emitting control line, the first power supply line, the second node, the third node and the fourth node, and is configured to provide a first power supply voltage output by the first power supply line to the second node and a voltage of the third node to the fourth node under the control of the light emitting control line; and
- at least one of the reset sub-circuit, the compensation sub-circuit, and the writing sub-circuit comprises an oxide transistor and a one-way conductive device.

* * * * *

UNITED STATES PATENT AND TRADEMARK OFFICE
CERTIFICATE OF CORRECTION

| | |
|---|---|
| PATENT NO. | : 12,087,215 B2 |
| APPLICATION NO. | : 17/783657 |
| DATED | : September 10, 2024 |
| INVENTOR(S) | : Peng Huang et al. |

It is certified that error appears in the above-identified patent and that said Letters Patent is hereby corrected as shown below:

On the Title Page

Item (86) The 371 (c) Date should be June 09, 2022.

Signed and Sealed this
Nineteenth Day of November, 2024

Katherine Kelly Vidal
*Director of the United States Patent and Trademark Office*